United States Patent
Yamazaki

(10) Patent No.: US 8,030,655 B2
(45) Date of Patent: Oct. 4, 2011

(54) THIN FILM TRANSISTOR, DISPLAY DEVICE HAVING THIN FILM TRANSISTOR

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 202 days.

(21) Appl. No.: 12/326,495

(22) Filed: Dec. 2, 2008

(65) Prior Publication Data

US 2009/0140259 A1 Jun. 4, 2009

(30) Foreign Application Priority Data

Dec. 3, 2007 (JP) ................................ 2007-312879

(51) Int. Cl.
*H01L 29/76* (2006.01)
*H01L 31/036* (2006.01)
*H01L 31/112* (2006.01)

(52) U.S. Cl. .................. 257/67; 257/E21.415; 438/158

(58) Field of Classification Search .................. 257/67, 257/E21.415, E29.294; 438/158
See application file for complete search history.

(56) References Cited

U.S. PATENT DOCUMENTS

| | | |
|---|---|---|
| 4,409,134 A | 10/1983 | Yamazaki |
| 5,358,925 A | 10/1994 | Neville Connell et al. |
| 5,365,081 A | 11/1994 | Yamazaki et al. |
| 5,371,380 A | 12/1994 | Saito et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,293 A | 7/1997 | Hayama et al. |
| 5,648,662 A | 7/1997 | Zhang et al. |
| 5,693,238 A | 12/1997 | Schmitt et al. |
| 5,701,167 A | 12/1997 | Yamazaki |
| 5,766,989 A | 6/1998 | Maegawa et al. |
| 5,811,328 A | 9/1998 | Zhang et al. |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |

(Continued)

FOREIGN PATENT DOCUMENTS

EP 0 473 988 A1 3/1992

(Continued)

OTHER PUBLICATIONS

Hyun Jung Lee et al.; "Leakage current mechanisms in top-gate nanocrystalline silicon thin film transistors"; *Applied Physics Letters*, vol. 92, pp. 083509-1-083509-3; 2008.

(Continued)

*Primary Examiner* — Phuc Dang
(74) *Attorney, Agent, or Firm* — Fish & Richardson P.C.

(57) ABSTRACT

A thin film transistor with excellent electric characteristics, a display device having the thin film transistor, and a method for manufacturing the thin film transistor and the display device in a high yield are provided. In the thin film transistor, a gate electrode, a gate insulating film, crystal grains that mainly contain silicon and are provided for a surface of the gate insulating film, a semiconductor film that mainly contains germanium and covers the crystal grains and the gate insulating film, and a buffer layer in contact with the semiconductor film that mainly contains germanium overlap with one another. Further, the display device has the thin film transistor.

14 Claims, 30 Drawing Sheets

U.S. PATENT DOCUMENTS

| | | | |
|---|---|---|---|
| 6,107,654 A | 8/2000 | Yamazaki | |
| 6,124,155 A | 9/2000 | Zhang et al. | |
| 6,166,399 A | 12/2000 | Zhang et al. | |
| 6,232,242 B1 | 5/2001 | Hata et al. | |
| 6,252,249 B1 | 6/2001 | Yamazaki | |
| 6,296,735 B1 | 10/2001 | Marxer et al. | |
| 6,306,213 B1 | 10/2001 | Yamazaki | |
| 6,307,220 B1 | 10/2001 | Yamazaki | |
| 6,335,213 B1 | 1/2002 | Zhang et al. | |
| 6,388,270 B1 | 5/2002 | Yamazaki et al. | |
| 6,444,390 B1 | 9/2002 | Yamazaki et al. | |
| 6,533,534 B2 | 3/2003 | Schmitt et al. | |
| 6,545,319 B2 | 4/2003 | Deane et al. | |
| 6,673,255 B2 | 1/2004 | Marxer et al. | |
| 6,683,012 B2 | 1/2004 | Sasaki et al. | |
| 6,690,068 B2 | 2/2004 | Yamazaki et al. | |
| 6,703,265 B2 | 3/2004 | Asami et al. | |
| 6,756,258 B2 | 6/2004 | Zhang et al. | |
| 6,759,677 B1 | 7/2004 | Yamazaki et al. | |
| 6,797,548 B2 | 9/2004 | Zhang et al. | |
| 6,847,064 B2 | 1/2005 | Zhang et al. | |
| 6,893,922 B2* | 5/2005 | Joo et al. | 438/261 |
| 6,939,755 B1 | 9/2005 | Ohtani et al. | |
| 6,956,236 B1 | 10/2005 | Sasaki et al. | |
| 7,015,507 B2 | 3/2006 | Yonehara et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,220,610 B2 | 5/2007 | Kim | |
| 7,459,338 B2 | 12/2008 | Nakayama et al. | |
| 7,808,000 B2* | 10/2010 | Yamazaki et al. | 257/66 |
| 2002/0043660 A1 | 4/2002 | Yamazaki et al. | |
| 2004/0201023 A1 | 10/2004 | Yamazaki et al. | |
| 2005/0012097 A1 | 1/2005 | Yamazaki | |
| 2005/0017243 A1 | 1/2005 | Zhang et al. | |
| 2006/0086935 A1 | 4/2006 | Suzawa et al. | |
| 2007/0018165 A1 | 1/2007 | Yamazaki | |
| 2008/0044962 A1 | 2/2008 | Zhang et al. | |
| 2008/0164473 A1 | 7/2008 | Tai et al. | |
| 2009/0001375 A1 | 1/2009 | Yamazaki et al. | |
| 2009/0002591 A1 | 1/2009 | Yamazaki et al. | |
| 2009/0142909 A1* | 6/2009 | Jinbo et al. | 438/482 |
| 2009/0166631 A1 | 7/2009 | Yamazaki | |

FOREIGN PATENT DOCUMENTS

| | | |
|---|---|---|
| JP | 60-098680 | 6/1985 |
| JP | 61-087371 | 5/1986 |
| JP | 04-242724 | 8/1992 |
| JP | 06-045354 | 2/1994 |
| JP | 06-077483 | 3/1994 |
| JP | 06-346245 | 12/1994 |
| JP | 07-045833 | 2/1995 |
| JP | 08-195492 | 7/1996 |
| JP | 11-121761 | 4/1999 |
| JP | 2002-246605 | 8/2002 |
| JP | 2005-049832 | 2/2005 |
| JP | 2005-167051 | 6/2005 |
| JP | 2005-203638 | 7/2005 |
| JP | 2007-005508 | 1/2007 |
| JP | 2007-035964 | 2/2007 |

OTHER PUBLICATIONS

Mohammad R. Esmaeili-Rad et al.; "Absence of defect state creation in nanocrystalline silicon thin film transistors deduced from constant current stress measurements"; *Applied Physics Letters*, vol. 91; pp. 113511-1-113511-3; 2007.

Czang-Ho Lee et al.; "Stability of nc-Si:H TFTs With Silicon Nitride Gate Dielectric"; *IEEE Transactions on Electron Devices*, vol. 54, No. 1; pp. 45-51; Jan. 1, 2007.

Andrei Sazonov et al.; "Low-Temperature Materials and Thin Film Transistors for Flexible Electronics"; *Proceedings of the IEEE*, vol. 93, No. 8; pp. 1420-1428; Aug. 2005.

Mohammad R. Esmaeili-Rad et al.; "Stability of nanocrystalline silicon bottom-gate thin film transistors with silicon nitride gate dielectric"; *Journal of Applied Physics*, vol. 102; pp. 064512-1-064512-7; 2007.

Czang-Ho Lee et al.; "Top-Gate TFTs Using 13.56 MHz PECVD Microcrystalline Silicon"; *IEEE Electron Device Letters*, vol. 26, No. 9; pp. 637-639; Sep. 5, 2005.

Czang-Ho Lee et al.; "Postdeposition thermal annealing and material stability of 75° C. hydrogenated nanocrystalline silicon plasma-enhanced chemical vapor deposition films"; Journal of Applied Physics, vol. 98; pp. 034305-1-034305-7; Aug. 4, 2005.

Czang-Ho Lee et al.; "High-mobility nanocrystalline silicon thin-film transistors fabricated by plasma-enhanced chemical vapor deposition"; *Applied Physics Letters*, vol. 86; pp. 222106-1-222106-3; May 24, 2005.

Czang-Ho Lee et al.; "High Mobility N-Channel and P-Channel Nanocrystalline Silicon Thin-Film Transistors"; *IEDM 05: Technical Digest of International Electron Devices Meeting*; pp. 937-940; 2005.

Czang-Ho Lee et al.; "Directly deposited nanocrystalline silicon thin-film transistors with ultra high mobilities"; *Applied Physics Letters*, vol. 89; pp. 252101-1-252101-3; Dec. 18, 2006.

C.-H Lee et al.; "How to Achieve High Mobility Thin Film Transistors by Direct Deposition of Silicon Using 13.56 MHz RF PECVD?"; *IEDM*; pp. 295-298; 2006.

Mohammad R. Esmaeili-Rad et al., "High Stability, Low Leakage Nanocrystalline Silicon Bottom Gate Thin Film Transistors for AMOLED Displays"; *IEEE-IEDM*; pp. 303-306; 2006.

Toshiaki Arai et al.; "41.2: Micro Silicon Technology for Active Matrix OLED Display"; *SID 07 Digest: SID International Symposium Digest of Technical Papers*, vol. XXXVIII, pp. 1370-1373; 2007.

\* cited by examiner 50  51  52a 52b 42

43

44

45

56  54  55 light transmittance light transmittance 61　50　　52a 52b 52c

THIN FILM TRANSISTOR, DISPLAY DEVICE HAVING THIN FILM TRANSISTOR

BACKGROUND OF THE INVENTION

1. Field of the Invention

The present invention relates to a thin film transistor, a display device having the thin film transistor at least in a pixel portion, and methods for manufacturing the same.

2. Description of the Related Art

In recent years, technology for forming thin film transistors (TFTs) using a thin semiconductor film (with a thickness of from several tens of nanometers to several hundreds of nanometers, approximately) formed over a substrate having an insulating surface has been attracting attention. Thin film transistors are applied to a wide range of electronic devices such as ICs or electrooptic devices, and prompt development of thin film transistors that are to be used as switching elements in image display devices, in particular, is being pushed.

As a switching element in an image display device, a thin film transistor including an amorphous semiconductor film, a thin film transistor including a polycrystalline semiconductor film that includes crystal grains with a diameter of 100 nm or more, or the like is used. As a method for forming a polycrystalline semiconductor film, a technique is known in which a pulsed excimer laser beam is processed into a linear shape with an optical system, and an amorphous semiconductor film is scanned and irradiated with the linear beam, thereby being crystallized.

As a switching element in an image display device, further, a thin film transistor including a microcrystalline silicon film or a microcrystalline silicon film including germanium is used (see Reference 1: Japanese Published Patent Application No. H4-242724; and Reference 2: Japanese Published Patent Application No. 2005-49832).

SUMMARY OF THE INVENTION

A thin film transistor in which a polycrystalline semiconductor film is used for a channel formation region has advantages that mobility is two or more orders of magnitude higher than that of a thin film transistor in which an amorphous semiconductor film is used for a channel formation region, and a pixel portion and a peripheral driver circuit of a semiconductor display device can be formed over the same substrate. However, the thin film transistor in which a polycrystalline semiconductor film is used for a channel formation region requires a more complicated process than the thin film transistor in which an amorphous semiconductor film is used for a channel formation region because of crystallization of the semiconductor film. Thus, there are problems such as a reduction in yield and an increase in cost.

A thin film transistor in which a microcrystalline germanium film is used for a channel formation region has a problem of high off current. Further, a thin germanium film has a problem in that it has low adhesiveness on an insulating film and a manufacturing yield of thin film transistors having the thin germanium film is low.

In view of the above problems, it is an object of the present invention to provide a thin film transistor with excellent electric characteristics, a display device having the thin film transistor, and methods for manufacturing the thin film transistor and the display device in a high yield.

An aspect of the present invention is a thin film transistor in which a gate electrode, a gate insulating film, crystal grains that mainly contain silicon and are formed over a surface of the gate insulating film, a semiconductor film that mainly contains germanium and covers the gate insulating film and the crystal grains, and a buffer layer that is in contact with the semiconductor film that mainly contains germanium are stacked. Another aspect of the present invention is a display device having the thin film transistor.

The semiconductor film that mainly contains germanium is formed over the gate insulating film with the crystal grains that mainly contain silicon interposed therebetween; thus, the area in which the semiconductor film that mainly contains germanium is in contact with a surface of the gate insulating film is reduced and the area in which the semiconductor film that mainly contains germanium is in contact with the crystal grains that mainly contain silicon is increased, thereby increasing adhesiveness at the interface.

As the buffer layer, an amorphous silicon film is given. Further, an amorphous silicon film including at least one of nitrogen, hydrogen, and halogen is also given. By forming the buffer layer over a surface of the semiconductor film that mainly contains germanium, it is possible to reduce off current of the thin film transistor with the above structure. Further, if the semiconductor film that mainly contains germanium includes a crystal grain, oxidation of the crystal grain can be reduced. Furthermore, since the buffer layer serves as a high-resistance region, defects in the semiconductor film that mainly contains germanium can be reduced.

The buffer layer can be formed by a plasma CVD method, a sputtering method, or the like. Further, the buffer layer can be formed by forming an amorphous silicon film and then treating the amorphous silicon film with nitrogen plasma, hydrogen plasma, or halogen plasma to nitride, hydrogenate, or halogenate the surface of the amorphous silicon film.

Further, a semiconductor film that mainly contains silicon is formed over the gate insulating film, and is irradiated with plasma to be etched partly, whereby crystal grains having high crystallinity are formed at a high density. Subsequently, a semiconductor film that mainly contains germanium and has high crystallinity is formed over the gate insulating film and the crystal grains by a plasma CVD method using hydrogen and a deposition gas including germanium as a source gas.

As the semiconductor film that mainly contains silicon and is formed over the gate insulating film, an amorphous silicon film, an amorphous silicon germanium ($Si_xGe_{1-x}$, $0.5<x<1$) film, a microcrystalline silicon germanium ($Si_xGe_{1-x}$, $0.5<x<1$) film, or a microcrystalline silicon film is formed by a sputtering method, a CVD method, or the like.

With regard to the plasma for irradiating the semiconductor film that mainly contains silicon, at least one of hydrogen, fluorine, and a fluoride is introduced to a reaction chamber of a plasma CVD apparatus, and high-frequency power is applied, thereby producing plasma. The plasma includes at least hydrogen plasma or fluorine plasma, and an amorphous component of the semiconductor film that mainly contains silicon is etched. In particular, when the semiconductor film that mainly contains germanium is a microcrystalline silicon film or a microcrystalline silicon germanium ($Si_xGe_{1-x}$, $0.5<x<1$) film, crystal grains are small; accordingly, by etching an amorphous component which fill spaces between the crystal grains, crystal grains having high crystallinity can remain at a high density. When the semiconductor film that mainly contains silicon and is formed over the gate insulating film is an amorphous silicon film or an amorphous silicon germanium ($Si_xGe_{1-x}$, $0.5<x<1$) film, an amorphous component is etched and is also crystallized partly, so that fine crystal grains can be formed at a high density. Thus, since an amorphous component at the interface with the gate insulating film is etched with plasma, crystal grains having high crystallinity can be formed over the gate insulating film.

As the semiconductor film that mainly contains germanium and is formed over the crystal grains that mainly contain silicon and over the gate insulating film, an amorphous germanium film, an amorphous silicon germanium ($Si_yGe_{1-y}$, 0<y<0.5) film, a microcrystalline germanium film, or a microcrystalline silicon germanium ($Si_yGe_{1-y}$, 0<y<0.5) film is formed by a plasma CVD method using a deposition gas including at least germanium as a source gas.

When the semiconductor film that mainly contains germanium is a microcrystalline germanium film or a microcrystalline silicon germanium ($Si_yGe_{1-y}$, 0<y<0.5) film, crystals grow from the crystal grains that mainly contain silicon. Since the crystals grow in a direction of the normal to the surface of the gate insulating film, a microcrystalline germanium film having columnar crystal grains that are connected to one another can be formed. Further, since the crystals grow from the crystal grains on the gate insulating film, a microcrystalline germanium film or a microcrystalline silicon germanium ($Si_yGe_{1-y}$, 0<y<0.5) film having high crystallinity at the interface with the gate insulating film and also inside the film can be formed. Furthermore, by using such a microcrystalline germanium film or a microcrystalline silicon germanium ($Si_yGel_{1-y}$, 0<y<0.5) film for a channel formation region of the thin film transistor, the thin film transistor can have high mobility and high on current.

Before forming the semiconductor film that mainly contains silicon over the gate insulating film, at least one of fluorine, a fluoride gas, and hydrogen may be introduced to the reaction chamber of the plasma CVD apparatus, and high-frequency power may be applied to produce plasma, whereby the gate insulating film may be etched partly. Through the etching, the gate insulating film can have an uneven surface. By forming the semiconductor film that mainly contains silicon over the gate insulating film having the uneven surface and exposing the semiconductor film that mainly contains silicon to plasma, the density of the crystal grains can be increased easily, and a microcrystalline germanium film or a microcrystalline silicon germanium ($Si_yGe_{1-y}$, 0<y<0.5) film having columnar crystal grains that are closely connected to one another can be formed.

In addition, a donor impurity element may be added to the crystal grains that mainly contain silicon or to the semiconductor film that mainly contains germanium. By adding the donor impurity element to the crystal grains that mainly contain silicon or to the semiconductor film that mainly contains germanium, crystallinity and conductivity of the crystal grains that mainly contain silicon or of the semiconductor film that mainly contains germanium is increased, and crystallinity at the interface with the gate insulating film can be increased. Therefore, by using the semiconductor film that mainly contains germanium and includes the donor impurity element for the channel formation region of the thin film transistor, the thin film transistor can have high mobility and high on current.

In order to add the donor impurity element to the crystal grains that mainly contain silicon or to the semiconductor film that mainly contains germanium, the donor impurity element may be added to the gate insulating film, the semiconductor film that mainly contains silicon, the crystal grains that mainly contain silicon, or the semiconductor film that mainly contains germanium. In a case where the donor impurity element is added to the gate insulating film, a gas including the donor impurity element is supplied into a reaction chamber, whereby the donor impurity element is adsorbed onto the inner wall of the reaction chamber and a base member for the gate insulating film before forming the gate insulating film. Alternatively, a gas including the donor impurity element may be introduced in addition to a source gas of the gate insulating film.

In a case where the donor impurity element is added to the semiconductor film that mainly contains silicon, a gas including the donor impurity element may be supplied into a reaction chamber, whereby the donor impurity element may be adsorbed onto the inner wall of the reaction chamber and the gate insulating film before forming the semiconductor film that mainly contains silicon. Alternatively, a gas including the donor impurity element may be introduced in addition to a source gas of the semiconductor film that mainly contains silicon and is formed over the gate insulating film. Further alternatively, when the semiconductor film that mainly contains silicon is etched, plasma may be generated using a gas including the donor impurity element in addition to at least one of fluorine, a fluoride gas, and hydrogen, whereby an amorphous component in the semiconductor film that mainly contains silicon and is formed over the gate insulating film may be etched with hydrogen radicals or fluorine radicals, and the donor impurity element may be added to the semiconductor film that mainly contains silicon and is etched.

In a case where the donor impurity element is added to the semiconductor film that mainly contains germanium, a gas including the donor impurity element may be introduced, whereby the donor impurity element may be adsorbed onto the inner wall of a reaction chamber, the gate insulating film, and the crystal grains that mainly contain silicon before forming the semiconductor film that mainly contains germanium. Alternatively, a gas including the donor impurity element may be introduced in addition to a source gas of the semiconductor film that mainly contains germanium.

Thin film transistors (TFTs) are manufactured using the semiconductor film that mainly contains germanium of the present invention, and a display device is manufactured using the thin film transistors for a pixel portion and further for a driver circuit. Since the thin film transistor in which the semiconductor film that mainly contains germanium of the present invention is used for a channel formation region has higher mobility than a thin film transistor in which an amorphous silicon film or a microcrystalline silicon film is used for a channel formation region, a part of the driver circuit or the entire driver circuit can be formed over the same substrate as that of the pixel portion, so that a system-on-panel can be formed.

Display devices include light-emitting devices and liquid crystal display devices in their category. A light-emitting device includes a light-emitting element and a liquid crystal display device includes a liquid crystal element. A light-emitting element includes, in its category, an element whose luminance is controlled with current or voltage; specifically, an organic electroluminescent (EL) element and an inorganic EL element.

In addition, the display devices include a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes all the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

According to the present invention, by using a semiconductor film that mainly contains germanium for a channel formation region, a thin film transistor with high mobility and high on current can be manufactured. In addition, by providing a buffer layer between the semiconductor film that mainly contains germanium and serves as a channel formation region, and source and drain regions, a thin film transistor with low off current can be manufactured. In other words, a thin film transistor with excellent electric characteristics can be manufactured. Further, a display device having the thin film transistor can be manufactured.

DETAILED DESCRIPTION OF THE INVENTION

Figure 1:
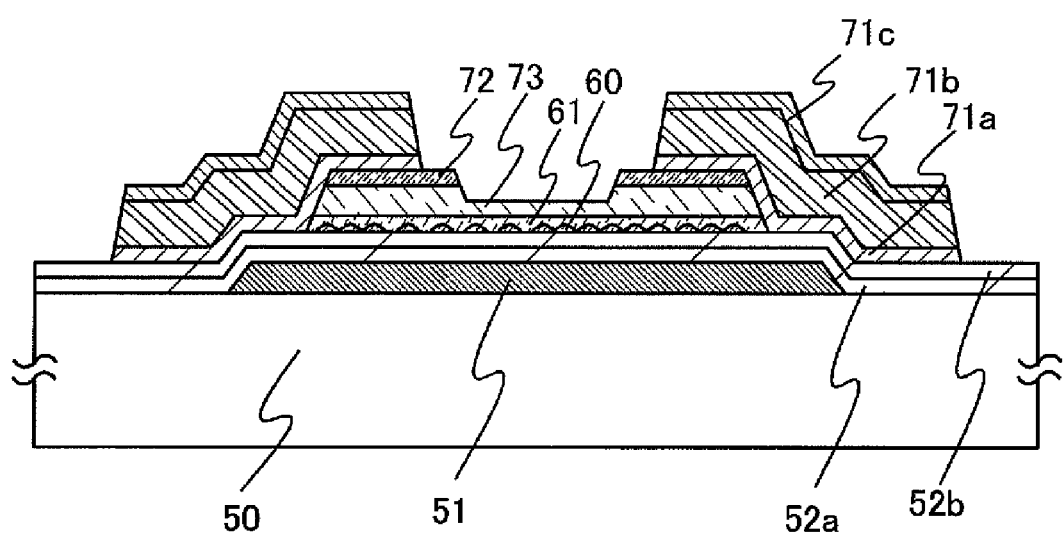
FIG. 1 is a cross-sectional view illustrating a thin film transistor of an embodiment mode of the present invention.

Hereinafter, embodiment modes of the present invention are described with reference to the drawings. Note that the present invention is not limited to the description given below, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, reference numerals which designate the same parts are used in common in different drawings.

Embodiment Mode 1

In a thin film transistor illustrated in FIG. 1, a gate electrode 51 is formed over a substrate 50; gate insulating films 52a and 52b are formed over the gate electrode 51; crystal grains 60 that mainly contain silicon are formed over the gate insulating films 52a and 52b; a semiconductor film 61 that mainly contains germanium is formed over the crystal grains 60 that mainly contain silicon and over the gate insulating film 52b; a buffer layer 73 is formed over the semiconductor film 61 that mainly contains germanium; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added. Carriers travel through the semiconductor film 61 that mainly contains germanium because the semiconductor film 61 that mainly contains germanium has higher mobility than the crystal grains 60 that mainly contain silicon. Therefore, the semiconductor film 61 that mainly contains germanium and is formed over the gate insulating film 52b serves as a channel formation region of the thin film transistor Further, the buffer layer 73 serves as a high-resistance region.

For the substrate 50, an alkali-free glass substrate manufactured by a fusion method or a float method, such as barium borosilicate glass, aluminoborosilicate glass, or aluminosilicate glass; a ceramic substrate; a plastic substrate which has high heat resistance enough to withstand a process temperature of this manufacturing process; or the like can be used. Further, a metal (e.g., stainless steel alloy) substrate having a surface provided with an insulating film may be used.

The gate electrode 51 is formed of a metal material. As a metal material, aluminum, chromium, titanium, tantalum, molybdenum, copper, or the like is used. The gate electrode 51 is preferably formed of aluminum or stacked layers of aluminum and a barrier metal. As a barrier metal, a metal with a high melting point, such as titanium, molybdenum, or chromium, is used. It is preferable to provide a barrier metal in order to prevent hillocks and oxidation of aluminum.

The gate electrode 51 is formed with a thickness of from 50 nm to 300 nm inclusive. The thickness of from 50 nm to 100 nm inclusive of the gate electrode 51 can prevent a disconnection of the semiconductor film that mainly contains germanium and the wirings, which are formed later. Further, the thickness of from 150 nm to 300 nm inclusive of the gate electrode 51 can lower the resistance of the gate electrode 51, and can increase the size of the substrate.

Since the semiconductor film that mainly contains germanium and the wirings are formed over the gate electrode 51, it is preferable to process the gate electrode 51 to have a tapered end portion so that the semiconductor film that mainly contains germanium and the wirings thereover are not disconnected. Further, although not illustrated, a wiring or a capacitor wiring which is connected to the gate electrode can also be formed at the same time when the gate electrode is formed.

The gate insulating films 52a and 52b can each be formed using a silicon oxide film, a silicon nitride film, a silicon oxynitride film, or a silicon nitride oxide film with a thickness of from 50 nm to 150 nm. This embodiment mode presents an example in which a silicon nitride film or a silicon nitride oxide film is formed as the gate insulating film 52a, and a silicon oxide film or a silicon oxynitride film is formed as the gate insulating film 52b to form a stacked-layer structure. Instead of the two-layer structure, the gate insulating film can be formed using a single layer of a silicon oxide film, a silicon nitride film, a silicon oxynitride film, or a silicon nitride oxide film.

By forming the gate insulating film 52a using a silicon nitride film or a silicon nitride oxide film, adhesiveness between the substrate 50 and the gate insulating film 52a is increased, and further, diffusion of impurities from the substrate 50 into the semiconductor film that mainly contains germanium can be prevented when a glass substrate is used for the substrate 50. Furthermore, oxidation of the gate electrode 51 can be prevented. That is to say, film peeling can be prevented, and electric characteristics of the thin film transistor which is completed later can be improved. Further, the gate insulating films 52a and 52b each having a thickness of greater than or equal to 50 nm are preferable because the gate insulating films 52a and 52b having the above thickness can alleviate reduction in coverage which is caused by unevenness due to the gate electrode 51.

Note that a silicon oxynitride film means a film that includes more oxygen than nitrogen, and includes oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film means a film that includes more nitrogen than oxygen, and includes oxygen, nitrogen, silicon, and hydrogen at concentrations ranging from 15 to 30 at. %, 20 to 35 at. %, 25 to 35 at. %, and 15 to 25 at. %, respectively.

The crystal grains 60 that mainly contain silicon can be formed using silicon, silicon germanium ($Si_xGe_{1-x}$, $0.5<x<1$) that contains more silicon than germanium, or the like. By making the crystal grains 60 that mainly contain silicon have a size of from 1 nm to 30 nm and a density of less than $1 \times 10^{13}/cm^3$, preferably less than $1 \times 10^{10}/cm^3$, separated crystal grains can be formed; thus, adhesiveness can be improved between the semiconductor film that mainly contains germanium and is formed later, and the gate insulating film 52b.

The semiconductor film 61 that mainly contains germanium can be formed using a germanium film or a silicon germanium ($Si_yGe_{1-y}$, $0<y<0.5$) film that contains more germanium than silicon. Further, the semiconductor film 61 that mainly contains germanium can be formed using an amorphous germanium film, an amorphous silicon germanium ($Si_yGe_{1-y}$, $0<y<0.5$) film, a microcrystalline germanium film, or a microcrystalline silicon germanium ($Si_yGe_{1-y}$, $0<y<0.5$) film (hereinafter, the microcrystalline germanium film or the microcrystalline silicon germanium film is referred to as a microcrystalline semiconductor film). A microcrystalline semiconductor film is a film including a semiconductor having an intermediate structure between amorphous and crystalline (including single crystalline and polycrystalline) structures. This microcrystalline semiconductor film is in a third state, in which the semiconductor is stable in free energy, and is a crystalline semiconductor having short-range order and lattice distortion; columnar or needle-like crystals with a diameter of from 0.5 nm to 100 nm, preferably from 1 nm to 20 nm, have grown in a direction of the normal to a surface of a substrate. Further, an amorphous semiconductor is present between a plurality of microcrystalline semiconductors.

The band gap of single crystal germanium is about 0.7 eV, and that of amorphous germanium is about 1.2 eV. Therefore, the band gap of a microcrystalline germanium film is higher than 0.7 eV and lower than 1.2 eV. On the other hand, the band gap of single crystal silicon is 1.1 eV, and that of amorphous silicon is about 1.7 eV. Further, the band gap of a microcrystalline silicon film is higher than 1.1 eV and lower than 1.7 eV. Since single crystal germanium has lower resistivity and higher mobility than single crystal silicon, carriers travel preferentially through the semiconductor film 61 that mainly contains germanium compared with the crystal grains 60 that mainly contains silicon; thus, the thin film transistor of this embodiment mode has higher mobility or higher on current than a thin film transistor in which a microcrystalline silicon film or an amorphous silicon film is used for a channel formation region.

The semiconductor film 61 that mainly contains germanium is formed with a thickness of from 1 nm to 200 nm inclusive, preferably from 1 nm to 80 nm inclusive, more preferably from 5 nm to 30 nm inclusive. When at least the semiconductor film 61 that mainly contains germanium is formed with a thickness of from 1 nm to 50 nm inclusive, the thin film transistor can be a complete depletion type.

Further, it is preferable that a concentration of oxygen and a concentration of nitrogen in the semiconductor film that mainly contains germanium each be less than $3\times10^{19}$ atoms/cm$^3$, more preferably less than $3\times10^{18}$ atoms/cm$^3$; and that a concentration of carbon be lower than or equal to $3\times10^{18}$ atoms/cm$^3$. Low concentrations of oxygen, nitrogen, and carbon in the semiconductor film that mainly contains germanium can suppress generation of defects in the semiconductor film that mainly contains germanium. Furthermore, oxygen or nitrogen in the semiconductor film that mainly contains germanium hinders crystallization. Therefore, when the semiconductor film that mainly contains germanium includes oxygen and nitrogen at relatively low concentrations, the crystallinity of the semiconductor film that mainly contains germanium can be enhanced.

By adding an acceptor impurity element to the semiconductor film that mainly contains germanium of this embodiment mode at the same time as or after formation of the semiconductor film that mainly contains germanium, the threshold value can be controlled. A typical example of the acceptor impurity element is boron, and an impurity gas such as $B_2H_6$ or $BF_3$ is preferably mixed into a deposition gas including germanium, at from 1 ppm to 1000 ppm, preferably from 1 ppm to 100 ppm. Further, a concentration of boron is preferably set to be from $1\times10^{14}$ atoms/cm$^3$ to $6\times10^{16}$ atoms/cm$^3$, for example.

An amorphous silicon film, an amorphous silicon film including halogen such as fluorine, chlorine, bromine, or iodide, or an amorphous silicon film including nitrogen is used as the buffer layer 73. The buffer layer 73 has a thickness of from 50 nm to 200 nm.

The buffer layer 73, which is formed of an amorphous silicon film, has a larger energy gap, a higher resistivity, and lower mobility than the semiconductor film 61 that mainly contains germanium. In the thin film transistor that is completed later, therefore, the buffer layer 73 serves as a high-resistance region, and thus can reduce leakage current that is caused between the pair of semiconductor films 72 to which the impurity element imparting one conductivity type is added and which serve as source and drain regions, and the semiconductor film 61 that mainly contains germanium. Further, off current can be reduced.

By forming an amorphous silicon film or an amorphous silicon film including hydrogen, nitrogen, or halogen as the buffer layer 73 over the surface of the semiconductor film 61 that mainly contains germanium, if the semiconductor film 61 that mainly contains germanium is a microcrystalline germanium film, natural oxidation of surfaces of crystal grains included in the microcrystalline germanium film can be prevented. In particular, in a region where amorphous germanium is in contact with microcrystalline germanium, a crack tends to be caused due to local stress. When this crack is exposed to oxygen, microcrystalline germanium is oxidized. However, by forming the buffer layer 73 over the surface of the semiconductor film 61 that mainly contains germanium, oxidation of microcrystalline germanium can be prevented.

If an n-channel thin film transistor is formed, the pair of semiconductor films 72 to which the impurity element imparting one conductivity type is added may be doped with phosphorus, which is a typical impurity element; for example, an impurity gas such as $PH_3$ may be added to a deposition gas including silicon. If a p-channel thin film transistor is formed, the pair of semiconductor films 72 to which the impurity element imparting one conductivity type is added may be doped with boron, which is a typical impurity element; for example, an impurity gas such as $B_2H_6$ may be added to a deposition gas including silicon. The pair of semiconductor films 72 to which the impurity element imparting one conductivity type is added include phosphorus or boron at a concentration of from $1\times10^{19}$ atoms/cm$^3$ to $1\times10^{21}$ atoms/cm$^3$, thereby having ohmic contact with the conductive film; thus, the pair of semiconductor films 72 to which the impurity element imparting one conductivity type is added serve as the source and drain regions. The pair of semiconductor films 72 to which the impurity element imparting one conductivity type is added can be formed using a microcrystalline silicon film or an amorphous silicon film. The pair of semiconductor films 72 to which the impurity element imparting one conductivity type is added are formed with a thickness of from 5 nm to 50 nm inclusive. Reduction in the thickness of the semiconductor film to which the impurity element imparting one conductivity type is added can improve the throughput.

It is preferable to form the wirings 71a to 71c with a single layer or stacked layers using aluminum; copper; or an aluminum alloy to which an element for preventing migration, improving heat resistance property, or preventing hillocks, such as copper, silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or nitride of such an element; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure. This embodiment mode presents the conductive film having a three-layer structure of the wirings 71a to 71c; a stacked-layer structure in which the wirings 71a and 71c are formed using molybdenum films and the conductive film 71b is formed using an aluminum film, or a stacked-layer structure in which the wirings 71a and 71c are formed using titanium films and the wiring 71b is formed using an aluminum film is formed.

As described in this embodiment mode, the thin film transistor in which the semiconductor film that mainly contains germanium is used for the channel formation region can have higher mobility and higher on current than a thin film transistor in which a microcrystalline silicon film or an amorphous silicon film is used for a channel formation region. Further, the buffer layer that is formed using an amorphous silicon film having high resistivity between the semiconductor film that mainly contains germanium and serves as the channel formation region and the source and drain regions serves as a high-resistance region, and can reduce off current of the thin film transistor. Furthermore, peeling of the semiconductor film that mainly contains germanium can be reduced because the semiconductor film that mainly contains germanium is formed over the gate insulating film with the crystal grains that mainly contain silicon sandwiched therebetween. Thus, thin film transistors with high on/off ratio, high mobility, and excellent electric characteristics can be manufactured in a high yield.

Embodiment Mode 2

Figure 2:
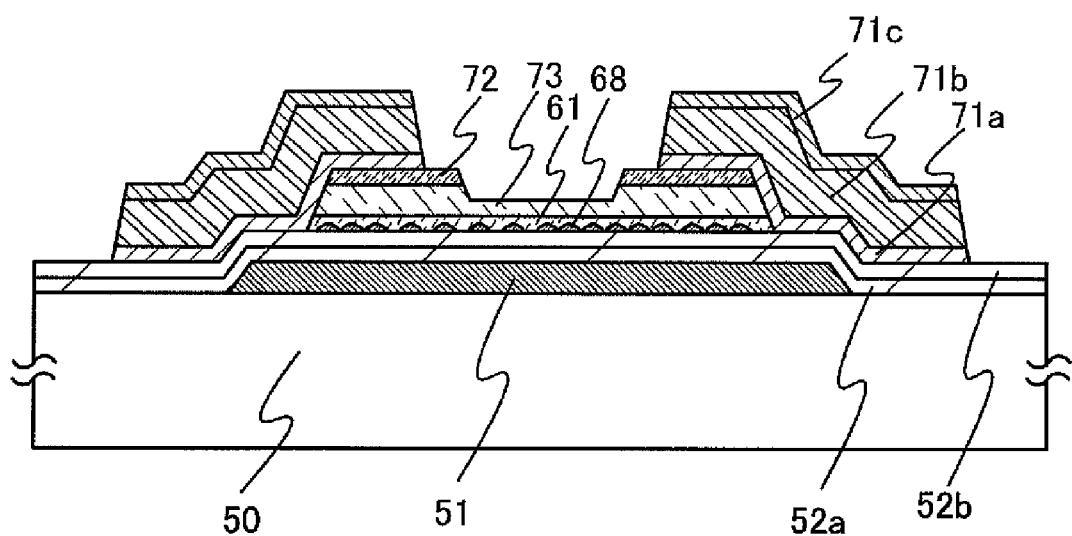
FIG. 2 is a cross-sectional view illustrating a thin film transistor of an embodiment mode of the present invention.

This embodiment mode presents a thin film transistor which includes a semiconductor film that mainly contains germanium, has higher mobility, and can improve a yield compared to that in Embodiment Mode 1, with reference to FIG. 2.

In the thin film transistor illustrated in FIG. 2, a gate electrode 51 is formed over a substrate 50; gate insulating films 52a and 52b are formed over the gate electrode 51; crystal grains 68 that mainly contain silicon and include a donor impurity element are formed over the gate insulating films 52a and 52b; a semiconductor film 61 that mainly contains germanium is formed over the crystal grains 68 that mainly contain silicon and include the donor impurity element, and over the gate insulating film 52b; a buffer layer 73 is formed over the semiconductor film 61 that mainly contains germanium; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added. Carriers travel through the semiconductor film 61 that mainly contains germanium because the semiconductor film 61 that mainly contains germanium has higher mobility than the crystal grains 68 that mainly contain silicon and include the donor impurity element. Therefore, the semiconductor film 61 that mainly contains germanium and is formed over the gate insulating film 52b serves as a channel formation region of the thin film transistor. Further, the buffer layer 73 serves as a high-resistance region.

The crystal grains 68 that mainly contain silicon and include the donor impurity element can be formed using a silicon film including a donor impurity element, a silicon germanium ($Si_xGe_{1-x}$, 0.5<x<1) film that contains more silicon than germanium and includes a donor impurity element, or the like. By making the crystal grains 68 that mainly contain silicon and include the donor impurity element have a size of from 1 nm to 30 nm and a density of less than $1\times10^{13}/cm^3$, preferably less than $1\times10^{10}/cm^3$, separated crystal grains can be formed; thus, adhesiveness can be improved between the semiconductor film that mainly contains germanium and is formed later, and the gate insulating film 52b.

The crystal grains 68 that mainly contain silicon and include the donor impurity element include the donor impurity element at a concentration of from $6\times10^{15}$ atoms/$cm^3$ to $3\times10^{18}$ atoms/$cm^3$ inclusive, preferably from $3\times10^{16}$ atoms/$cm^3$ to $3\times10^{17}$ atoms/$cm^3$ inclusive, which is measured by secondary ion mass spectrometry (SIMS). The donor impurity element is phosphorus, arsenic, antimony, or the like.

By making the concentration of the donor impurity element in the crystal grains 68 that mainly contain silicon and include the donor impurity element in the above range, crystallinity of the crystal grains 68 at an interface with the gate insulating film 52b and inside the crystal grains 68 can be enhanced. Thus, the semiconductor film 61 that mainly contains germanium and is formed utilizing the crystal grains 68 has higher crystallinity. Consequently, the semiconductor film 61 that mainly contains germanium can be formed to be a microcrystalline semiconductor film. Thus, the thin film transistor which has the semiconductor film that mainly contains germanium in a channel formation region can have high mobility and high on current.

In this embodiment mode, only the crystal grains 68 that mainly contain silicon include the donor impurity element, but the gate insulating film 52a, the gate insulating film 52b, or the semiconductor film 61 that mainly contains germanium may include the donor impurity element. When the gate insulating film 52a or 52b includes the donor impurity element, the donor impurity element is deposited on the surface of the gate insulating film. If the donor impurity element is deposited on the surface of the gate insulating film 52b, crystallinity can be increased in starting formation of the crystal grains 68 that mainly contain silicon. If the gate insulating film on the gate electrode 51 side includes the donor impurity element, the impurity element can be diffused into the crystal grains 68 that mainly contain silicon and the semiconductor film 61 that mainly contains germanium side at a low concentration.

With the above structure, adhesiveness can be increased between the gate insulating film 52b and the semiconductor film 61 that mainly contains germanium; crystallinity of the semiconductor film 61 that mainly contains germanium and an interface thereof can be increased; and resistivity of the semiconductor film 61 that mainly contains germanium can be reduced. Thus, a thin film transistor with high mobility and high on current can be manufactured.

Embodiment Mode 3

Figure 3:
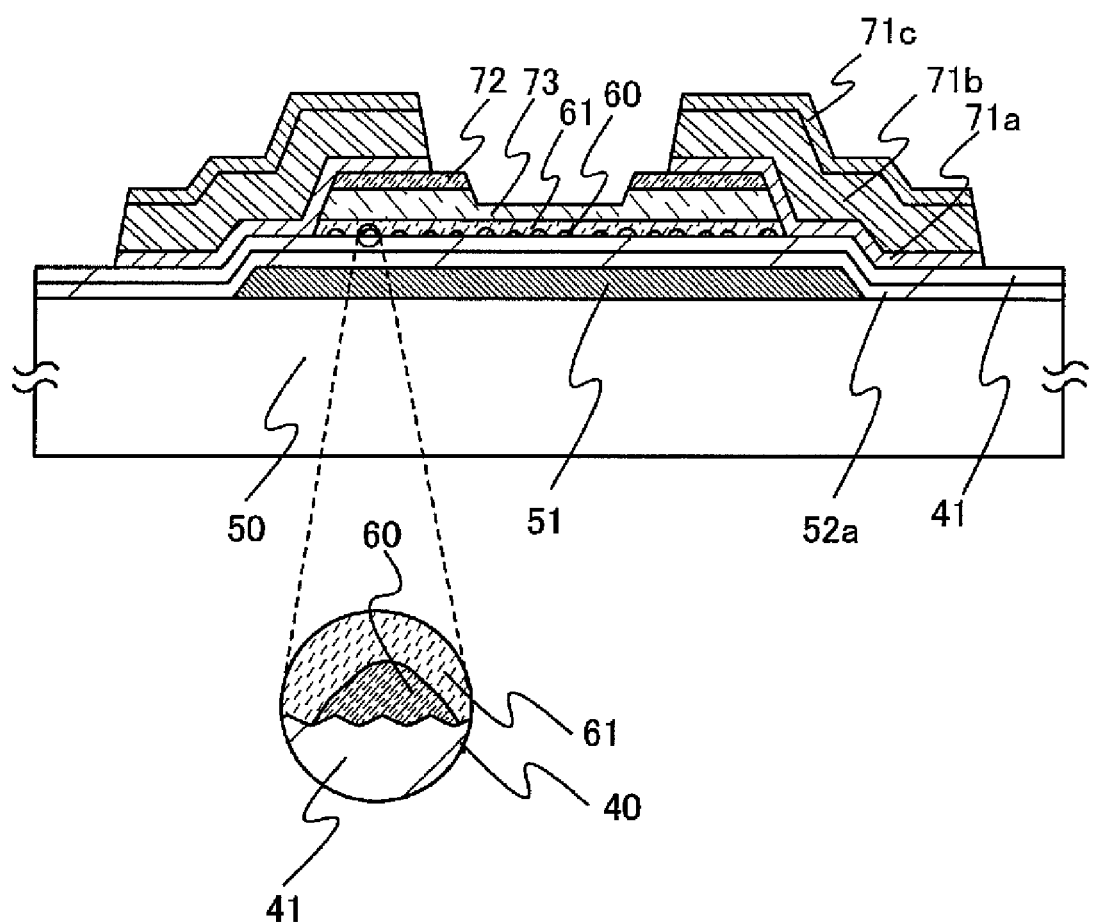
FIG. 3 is a cross-sectional view illustrating a thin film transistor of an embodiment mode of the present invention.

This embodiment mode presents a thin film transistor which includes a semiconductor film that mainly contains germanium, has higher mobility, and can improve a yield compared to that in Embodiment Mode 1, with reference to FIG. 3.

In the thin film transistor illustrated in FIG. 3, a gate electrode 51 is formed over a substrate 50; a gate insulating film 52a is formed over the gate electrode 51; a gate insulating film 41 having an uneven surface is formed over the gate insulating film 52a; crystal grains 60 that mainly contain silicon are formed over the gate insulating film 41; a semiconductor film 61 that mainly contains germanium is formed over the crystal grains 60 that mainly contain silicon and over the gate insulating film 41; a buffer layer 73 is formed over the semiconductor film 61 that mainly contains germanium; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added. Carriers travel through the semiconductor film 61 that mainly contains germanium because the semiconductor film 61 that mainly contains germanium has higher mobility than the crystal grains 60 that mainly contain silicon. Therefore, the semiconductor film 61 that mainly contains germanium and is formed over the gate insulating film 41 serves as a channel formation region of the thin film transistor. Further, the buffer layer 73 serves as a high-resistance region.

As illustrated in an enlarged view 40, projections and depressions are formed on the uneven surface of the gate insulating film 41. Each of the projections and depressions may have a wavelike shape with a gentle curve to form the uneven shape. Alternatively, the projections may have a sharp needle-like shape and the depressions may have a gently curved shape. The height difference between the top of the projection and the bottom of the depression is from several nanometers to several tens of nanometers. Since the surface of the gate insulating film 41 is uneven, adhesiveness between the gate insulating film 41 and the semiconductor film 61 that mainly contains germanium is further enhanced as compared to that in Embodiment Modes 1 and 2. Therefore, peeling at the interface between the gate insulating film 41 and the semiconductor film 61 that mainly contains germanium can be reduced in a manufacturing process of the thin film transistor, and the yield can be increased. In addition, by using the semiconductor film 61 that mainly contains germanium for a channel formation region, a thin film transistor with high mobility and high on current can be manufactured.

This embodiment mode can be applied to Embodiment Modes 1 and 2.

Embodiment Mode 4

Figure 4:
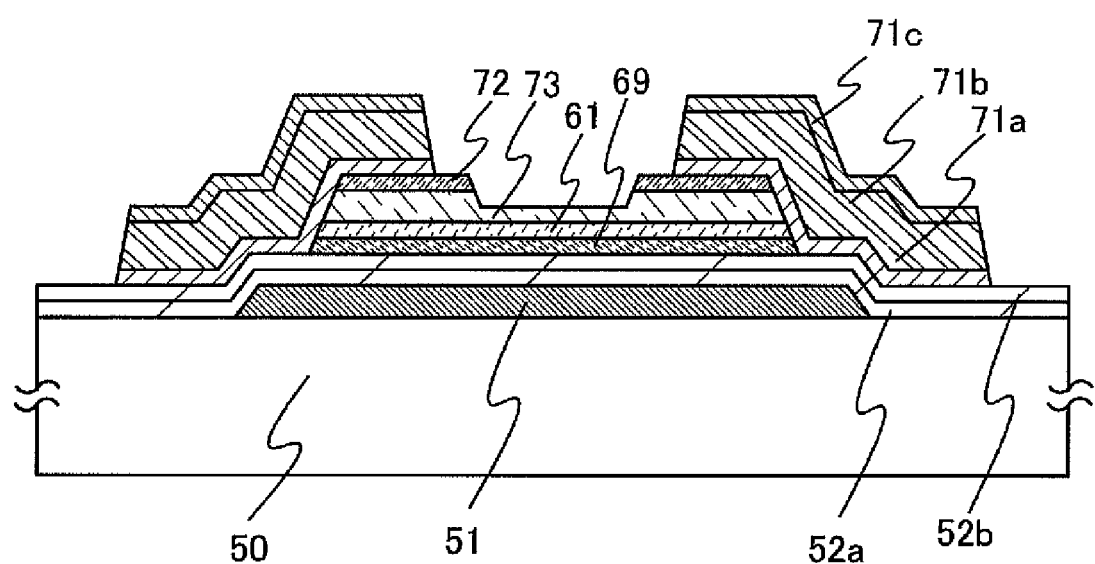
FIG. 4 is a cross-sectional view illustrating a thin film transistor of an embodiment mode of the present invention.

This embodiment mode presents a thin film transistor which includes a semiconductor film that mainly contains germanium, has higher mobility, and can improve a yield compared to that in Embodiment Mode 1, with reference to FIG. 4.

In the thin film transistor illustrated in FIG. 4, a gate electrode 51 is formed over a substrate 50; gate insulating films 52a and 52b are formed over the gate electrode 51; a microcrystalline semiconductor film 69 that mainly contains silicon is formed over the gate insulating film 52b; a semiconductor film 61 that mainly contains germanium is formed over the microcrystalline semiconductor film 69 that mainly contains silicon; a buffer layer 73 is formed over the semiconductor film 61 that mainly contains germanium; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added. Carriers travel through the semiconductor film 61 that mainly contains germanium because the semiconductor film 61 that mainly contains germanium has higher mobility than the microcrystalline semiconductor film 69 that mainly contains silicon. Therefore, the semiconductor film 61 that mainly contains germanium serves as a channel formation region of the thin film transistor. Further, the buffer layer 73 serves as a high-resistance region.

Although the microcrystalline semiconductor film 69 that mainly contains silicon has an amorphous component in a large part of an interface with the gate insulating film 52b, microcrystals are formed at an interface with the semiconductor film that mainly contains germanium; therefore, a surface of the microcrystalline semiconductor film 69 has high crystallinity. When the semiconductor film 61 that mainly contains germanium is formed thereover, crystal growth proceeds with crystals at the surface of the microcrystalline semiconductor film 69 that mainly contains silicon serving as crystal nuclei, so that the semiconductor film 61 that mainly contains germanium and has high crystallinity (a typical example is a microcrystalline semiconductor film that mainly contains germanium) is formed. Carriers travel preferentially through the semiconductor film 61 that mainly contains germanium as compared to the microcrystalline semiconductor film 69 that mainly contains silicon because the former has lower resistivity than the latter. Therefore, the thin film transistor presented in this embodiment mode has high mobility and high on current.

Further, since the semiconductor film 61 that mainly contains germanium is in contact with the microcrystalline semiconductor film 69 that mainly contains silicon, adhesiveness therebetween improves. Thus, a yield of thin film transistors can be enhanced. Moreover, a donor impurity element may be added to the microcrystalline semiconductor film that mainly contains silicon; as a result, crystallinity at the interface with the gate insulating film and inside the microcrystalline semiconductor film can be improved.

Embodiment Mode 5

Hereinafter, this embodiment mode describes a process of manufacturing a thin film transistor presented in Embodiment Mode 1.

It is preferable that all the thin film transistors formed over one substrate have the same polarity so that the number of manufacturing steps is reduced. In description of this embodiment mode, an n-channel thin film transistor is used.

Figure 5A:
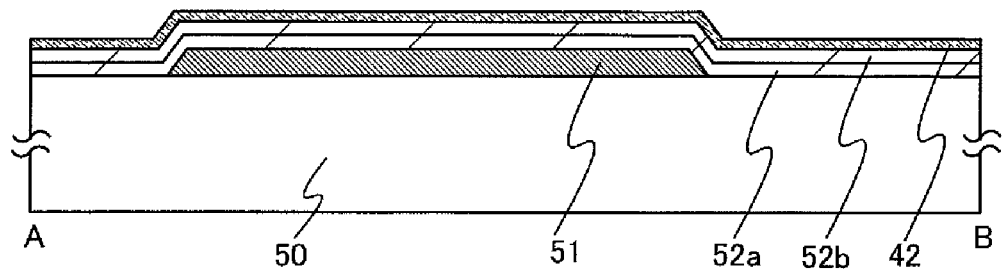
FIGS. 5A to 5E are cross-sectional views illustrating a method for manufacturing a thin film transistor of an embodiment mode of the present invention.

As illustrated in FIG. 5A, a gate electrode 51 is formed over a substrate 50, and gate insulating films 52a and 52b are formed over the gate electrode 51.

The gate electrode 51 is formed by a sputtering method, a CVD method, a plating method, a printing method, a droplet discharge method, or the like using any of the metals described in Embodiment Mode 1. In this embodiment mode, a molybdenum film is formed as a conductive film over the substrate 50 by a sputtering method and is etched with the use of a resist mask that is formed using a first photomask, whereby the gate electrode 51 is formed.

Each of the gate insulating films 52a and 52b can be formed by a CVD method, a sputtering method, or the like using a silicon oxide film, a silicon nitride film, a silicon oxynitride film, or a silicon nitride oxide film. This embodiment mode presents an example in which a silicon nitride film or a silicon nitride oxide film is formed as the gate insulating film 52a, and a silicon oxide film or a silicon oxynitride film is formed thereover as the gate insulating film 52b.

Next, a semiconductor film 42 that mainly contains silicon is formed over the gate insulating film 52b.

As the semiconductor film 42 that mainly contains silicon, an amorphous silicon film, an amorphous silicon germanium ($Si_xGe_{1-x}$, $0.5<x<1$) film, a microcrystalline silicon film, or a microcrystalline silicon germanium ($Si_xGe_{1-x}$, $0.5<x<1$) film is formed. As a microcrystalline silicon film or a microcrystalline silicon germanium ($Si_xGe_{1-x}$, $0.5<x<1$) film, a microcrystalline silicon film or a microcrystalline silicon germanium ($Si_xGe_{1-x}$, $0.5<x<1$) film which has crystal grains with a diameter of 0.5 nm to 100 nm inclusive, preferably from 1 nm to 20 nm inclusive, can be used. The microcrystalline silicon film or the microcrystalline silicon germanium ($Si_xGe_{1-x}$, $0.5<x<1$) film may include an amorphous component. The semiconductor film 42 that mainly contains silicon has a thickness of from 1 nm to 100 nm, preferably from 2 nm to 20 nm, more preferably from 5 nm to 10 nm.

The semiconductor film 42 that mainly contains silicon can be formed by a sputtering method or a CVD method. If the semiconductor film 42 that mainly contains silicon is formed by a sputtering method, a silicon target or a silicon germanium target is sputtered with hydrogen or a rare gas, so that an amorphous silicon film or an amorphous silicon germanium ($Si_xGe_{1-x}$, $0.5<x<1$) film is formed over the gate insulating film 52b as the semiconductor film 42 that mainly contains silicon.

If the semiconductor film 42 that mainly contains silicon is formed by a CVD method, hydrogen is introduced into a reaction chamber of a plasma CVD apparatus in addition to a deposition gas including silicon and a high-frequency power is applied to produce plasma, so that an amorphous silicon film or a microcrystalline silicon film is formed over the gate insulating film 52b as the semiconductor film 42 that mainly contains silicon. Further, with the use of a deposition gas including germanium in addition to hydrogen and the deposition gas including silicon, an amorphous silicon germanium ($Si_xGe_{1-x}$, $0.5<x<1$) film or a microcrystalline silicon germanium ($Si_xGe_{1-x}$, $0.5<x<1$) film is formed.

In a mode in which an amorphous silicon film is formed as the semiconductor film 42 that mainly contains silicon, in a reaction chamber, an amorphous silicon film can be formed with glow discharge plasma using a deposition gas including silicon. Further, with a deposition gas including silicon diluted with one or more rare gas elements selected from helium, argon, krypton, and neon, an amorphous silicon film can be formed with glow discharge plasma. Furthermore, with the use of glow discharge plasma using hydrogen at a flow rate which is 1 to 10 times, preferably 1 to 5 times as high as that of a deposition gas including silicon, an amorphous silicon film can be formed. Still furthermore, with the use of a deposition gas including germanium in addition to the deposition gas including silicon, an amorphous silicon germanium ($Si_xGe_{1-x}$, $0.5<x<1$) film can be formed.

Further, in a mode in which a microcrystalline silicon film is formed as the semiconductor film 42 that mainly contains silicon, in a reaction chamber, a deposition gas including silicon, which is silane in this example, and hydrogen and/or a rare gas are mixed, and a microcrystalline silicon film is formed with glow discharge plasma. The deposition gas including silicon is diluted with the hydrogen and/or the rare gas to be 10 to 2000 times thinner. Therefore, a large amount of hydrogen and/or rare gas is needed. The substrate heating temperature is from 100° C. to 300° C., preferably from 120° C. to 220° C. It is preferable that the film be formed at temperatures of from 120° C. to 220° C. so that a growing surface of the microcrystalline silicon film may be inactivated with hydrogen to promote growth of microcrystalline silicon. Furthermore, with the use of a deposition gas including germanium in addition to the deposition gas including silicon, a microcrystalline silicon germanium ($Si_xGe_{1-x}$, $0.5<x<1$) film can be formed.

In the process for forming the semiconductor film 42 that mainly contains silicon, glow discharge plasma is produced by applying high-frequency power of from 1 MHz to 30 MHz (typically, 13.56 MHz or 27.12 MHz), or high-frequency power in the VHF band of greater than 30 MHz and less than or equal to 300 MHz approximately (typically, 60 MHz). Alternatively, microwave power of 1 GHz, 2.54 GHz, or the like may be used.

Figure 5B:
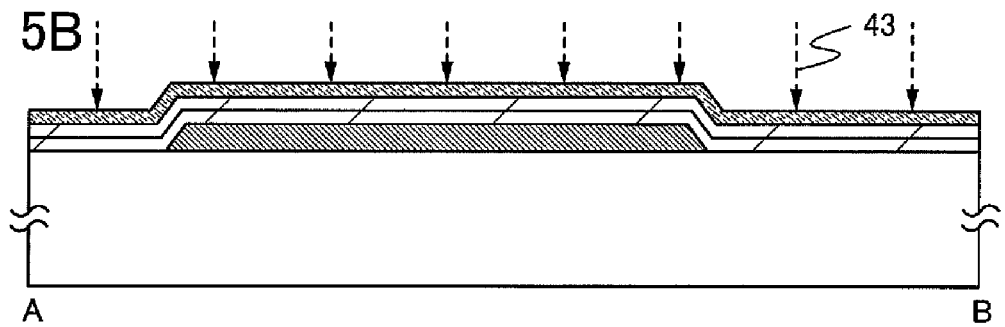
Figure 5C:
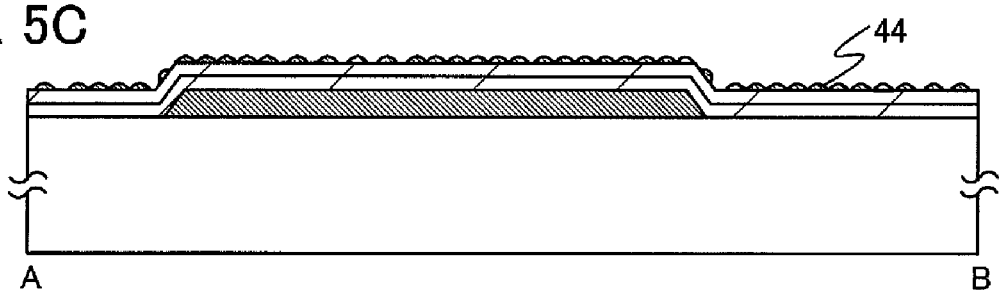

Next, as illustrated in FIG. 5B, the semiconductor film 42 that mainly contains silicon is exposed to plasma 43 to form crystal grains 44 as illustrated in FIG. 5C. In order to produce the plasma 43, one or more of hydrogen, fluorine, and a fluoride may be introduced into the reaction chamber of the plasma CVD apparatus and high-frequency power may be applied.

By introducing at least one of fluorine, a fluoride gas, and hydrogen and applying high-frequency power, hydrogen plasma or fluorine plasma is produced. As the hydrogen plasma, hydrogen is introduced into the reaction chamber and plasma is produced. As the fluorine plasma, fluorine or a fluoride is introduced into the reaction chamber and plasma is produced. Examples of a fluoride are HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like. Further, rare gas plasma may be produced by introducing a rare gas into the reaction chamber in addition to fluorine, a fluoride gas, or hydrogen.

With hydrogen plasma, fluorine plasma, or the like, hydrogen radicals or fluorine radicals are produced in the plasma. The hydrogen radicals react with an amorphous component in the semiconductor film 42 that mainly contains silicon to crystallize a part of the semiconductor film 42, and also etches the amorphous component. Further, fluorine radicals etch an amorphous component in the semiconductor film 42 that mainly contains silicon. Thus, if the semiconductor film 42 that mainly contains silicon is a microcrystalline semiconductor film, crystal grains included in the film are small; by etching away the amorphous component among the crystal grains, the crystal grains with high crystallinity can remain with a high density. Further, if the semiconductor film 42 that mainly contains silicon and is formed over the gate insulating film 52b is an amorphous semiconductor film, an amorphous component is etched away and a part of the film is crystallized, so that minute crystal grains can be formed. Thus, since the amorphous component at the interface with the gate insulating film can be etched away with the plasma, the crystal grains with high crystallinity can be formed over the gate insulating film.

In order to produce the plasma 43, it is preferable to use high-frequency power in the HF band (from 3 MHz to 30 MHz; typically 13.56 MHz or 27.12 MHz) or in the VHF band of greater than 30 MHz and less than of equal to 300 MHz approximately (typically, 60 MHz). In particular, high-frequency power of 13.56 MHz is suitable for mass production, with which plasma uniformity can be enhanced and the semiconductor film that mainly contains silicon can be exposed to the plasma with high uniformity even over a large-area substrate of any of the sixth to tenth generations. Further, microwave power of 1 GHz, 2.54 GHz, or the like may be used.

As a mode, here, in the reaction chamber of the plasma CVD apparatus, hydrogen and/or a rare gas is introduced and hydrogen plasma is produced with glow discharge plasma, whereby the semiconductor film 42 that mainly contains silicon is exposed to the hydrogen plasma to etch the amorphous semiconductor component in the semiconductor film 42 that mainly contains silicon, thereby forming the crystal grains 44.

Next, crystals are grown using the crystal grains 44 as crystal nuclei to form a semiconductor film 45 that mainly contains germanium.

If the semiconductor film 45 that mainly contains germanium is formed by a CVD method, hydrogen is introduced into the reaction chamber of the plasma CVD apparatus in addition to a deposition gas including germanium, and high-frequency power is applied to produce plasma, so that an amorphous germanium film or a microcrystalline germanium film is formed as the semiconductor film 45 that mainly contains germanium. Further, with the use of a deposition gas including silicon in addition to hydrogen and a deposition gas including germanium, an amorphous silicon germanium ($Si_yGe_{1-y}$, $0<y<0.5$) film or a microcrystalline silicon germanium ($Si_yGe_{1-y}$, $0<y<0.5$) film is formed.

In a mode in which an amorphous germanium film is formed as the semiconductor film 45 that mainly contains germanium, in the reaction chamber, an amorphous germanium film can be formed with glow discharge plasma using a deposition gas including germanium. Further, with a deposition gas including germanium diluted with one or more rare gas elements selected from helium, argon, krypton, and neon, an amorphous germanium film can be formed with glow discharge plasma. Furthermore, with the use of glow discharge plasma using hydrogen at a flow rate which is 1 to 10 times, preferably 1 to 5 times as high as that of a deposition gas including germanium, an amorphous germanium film can be formed. Still furthermore, with the use of a deposition gas including silicon in addition to hydrogen and a deposition gas including germanium, an amorphous silicon germanium ($Si_yGe_{1-y}$, $0<y<0.5$) film can be formed as the semiconductor film 45 that mainly contains germanium.

Further, in a mode in which a microcrystalline germanium film is formed as the semiconductor film 45 that mainly contains germanium, in the reaction chamber, a deposition gas including germanium, which is germane in this example, and hydrogen and/or a rare gas are mixed, and a microcrystalline germanium film is formed with glow discharge plasma. The deposition gas including germanium is diluted with the hydrogen and/or the rare gas to be 10 to 2000 times thinner. Therefore, a large amount of hydrogen and/or rare gas is needed. The substrate heating temperature is from 100° C. to 400° C., preferably from 250° C. to 350° C. Furthermore, with the use of a deposition gas including silicon in addition to hydrogen and a deposition gas including germanium, a microcrystalline silicon germanium ($Si_yGe_{1-y}$, $0<y<0.5$) film can be formed as the semiconductor film 45 that mainly contains germanium.

In the process for forming the semiconductor film 45 that mainly contains germanium, glow discharge plasma is produced by applying high-frequency power of from 1 MHz to 30 MHz (typically, 13.56 MHz or 27.12 MHz), or high-frequency power in the VHF band of greater than 30 MHz and less than or equal to 300 MHz approximately (typically, 60 MHz). Alternatively, microwave power of 1 GHz, 2.54 GHz, or the like may be used.

In this example, in the reaction chamber of the plasma CVD apparatus, a deposition gas including germanium, which is germane in this example, and hydrogen and/or a rare gas are mixed, and a microcrystalline germanium film is formed with glow discharge plasma. The substrate heating temperature is from 100° C. to 400° C., preferably from 250° C. to 350° C. The microcrystalline germanium film can be formed to have columnar crystal grains because crystals grow from the crystal grains on the gate insulating film 52b in a direction of the normal to the surface of the gate insulating film 52b. Further, the microcrystalline germanium film has high crystallinity at an interface with the gate insulating film 52b and also inside the film. Furthermore, adhesiveness can be increased between the gate insulating film 52b and the semiconductor film 45 that mainly contains germanium because the crystal grains that mainly contain silicon are present between the gate insulating film 52b and the semiconductor film 45 that mainly contains germanium.

Further, in order to form a microcrystalline germanium film as the semiconductor film 45 that mainly contains germanium, if fluorine or a fluoride gas is used in addition to a deposition gas including germanium, an amorphous component in a region where crystals grow is etched with fluorine radicals when the crystals grow from the crystal grains; thus, the crystals grow with high crystallinity. That is, a microcrystalline germanium film having high crystallinity can be formed. Examples of fluoride are HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like.

Through the above process, the microcrystalline germanium film having high crystallinity at the interface with the gate insulating film 52b can be formed.

Figure 5D:
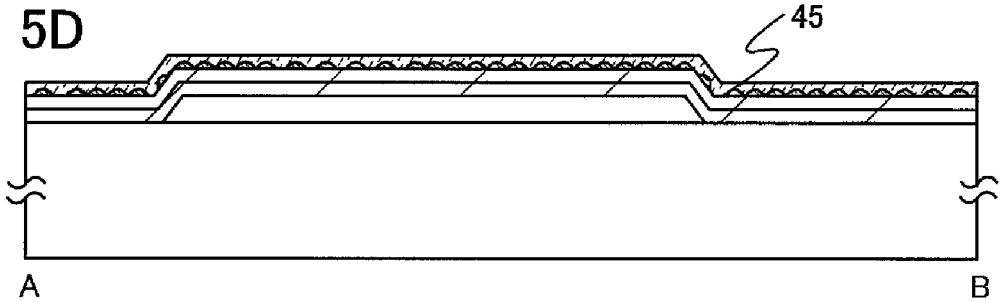
Figure 5E:
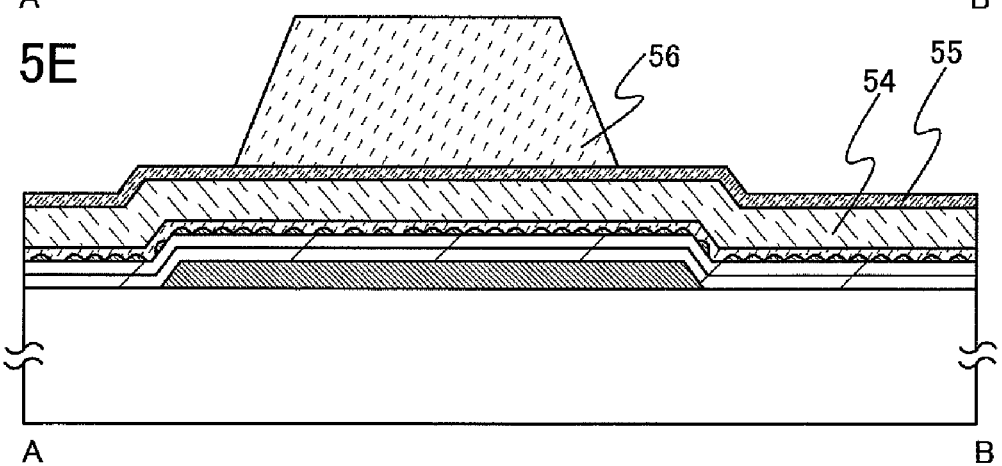

Next, a buffer layer 54 and a semiconductor film 55 to which an impurity element imparting one conductivity type is added are formed over the semiconductor film 45 that mainly contains germanium, as illustrated in FIG. 5E. Then, a resist mask 56 is formed over the semiconductor film 55 to which the impurity element imparting one conductivity type is added.

As the buffer layer 54, an amorphous silicon film can be formed by a plasma CVD method using a deposition gas including silicon. Further, with a deposition gas including silicon diluted with one or more kinds of rare gas elements selected from helium, argon, krypton, and neon, an amorphous silicon film can be formed. Furthermore, an amorphous silicon film including hydrogen can be formed using hydrogen with a flow rate of 1 to 10 times, preferably 1 to 5 times as high as that of a deposition gas including silicon. In addition, halogen such as fluorine or chlorine may be added to the above amorphous silicon film.

Still furthermore, as the buffer layer 54, an amorphous silicon film can be formed by sputtering a semiconductor target such as silicon or germanium with hydrogen or a rare gas.

In some cases, the buffer layer 54 is partly etched in a later step of forming source and drain regions; thus, it is preferable to form the buffer layer 54 with such a thickness that a part of the buffer layer 54 remains at that time. Typically, it is preferable to form the buffer layer 54 with a thickness of from 50 nm to 200 nm inclusive. In a display device including a thin film transistor to which a high voltage (e.g., about 15 V) is applied, typically, in a liquid crystal display device, if the buffer layer 54 is formed thickly, withstand voltage is increased, so that deterioration of the thin film transistor can be prevented even if a high voltage is applied to the thin film transistor.

In a case where the semiconductor film 45 that mainly contains germanium is a microcrystalline semiconductor film, by forming an amorphous silicon film or an amorphous silicon film including hydrogen, nitrogen, or halogen over the surface of the semiconductor film 45 that mainly contains germanium, natural oxidation of surfaces of crystal grains included in the semiconductor film 45 that mainly contains germanium can be prevented. In particular, in a region where amorphous germanium is in contact with microcrystalline germanium, a crack tends to be caused due to local stress. When this crack is exposed to oxygen, the crystal grains are oxidized to form germanium oxide. However, by forming the buffer layer 54 over the surface of the semiconductor film 45 that mainly contains germanium, oxidation of microcrystal grains included in the semiconductor film that mainly contains germanium can be prevented.

Since the buffer layer 54 is formed using an amorphous silicon film or an amorphous silicon film including hydrogen or halogen, the buffer layer 54 has a larger energy gap, higher resistivity, and lower mobility than the semiconductor film 45 that mainly contains germanium. Therefore, in a thin film transistor that is completed later, the buffer layer formed between the source and drain regions and the semiconductor film 45 that mainly contains germanium serves as a high-resistance region, and the semiconductor film 45 that mainly contains germanium serves as a channel formation region. Accordingly, off current of the thin film transistor can be reduced. In addition, when the thin film transistor is used as a switching element of a display device, the display device can have an improved contrast.

It is preferable that the buffer layer 54 be formed at temperatures of from 300° C. to 400° C. by a plasma CVD method after forming the semiconductor film 45 that mainly contains germanium. By this film formation treatment, hydrogen is supplied to the semiconductor film 45 that mainly contains germanium, and the same effect as hydrogenating the semiconductor film 45 that mainly contains germanium can be produced. In other words, by depositing the buffer layer 54 over the semiconductor film 45 that mainly contains germanium, hydrogen is diffused into the semiconductor film 45 that mainly contains germanium, whereby dangling bonds can be terminated.

If an n-channel thin film transistor is formed, the semiconductor film 55 to which the impurity element imparting one conductivity type is added may be doped with phosphorus, which is a typical impurity element; for example, an impurity gas such as $PH_3$ may be added to a deposition gas including silicon. If a p-channel thin film transistor is formed, the semiconductor film 55 to which the impurity element imparting one conductivity type is added may be doped with boron, which is a typical impurity element; for example, an impurity gas such as $B_2H_6$ may be added to a deposition gas including silicon. The semiconductor film 55 to which the impurity element imparting one conductivity type is added includes phosphorus or boron at a concentration of from $1 \times 10^{19}$ atoms/$cm^3$ to $1 \times 10^{21}$ atoms/$cm^3$, thereby having ohmic contact with wirings 71a to 71c; thus, the semiconductor film 55 to which the impurity element imparting one conductivity type is added serves as the source and drain regions. The semiconductor film 55 to which the impurity element imparting one conductivity type is added can be formed using a microcrystalline silicon film or an amorphous silicon film. The semiconductor film 55 to which the impurity element imparting one conductivity type is added are formed with a thickness of from 5 nm to 50 nm inclusive. Reduction in the thickness of the semiconductor film to which the impurity element imparting one conductivity type is added can improve the throughput.

The resist mask 56 is formed by a photolithography technique. In this example, using a second photomask, the resist mask 56 is formed by exposing a resist that is applied on the semiconductor film 55 to which the impurity element imparting one conductivity type is added to light and developing the resist.

Figure 6A:
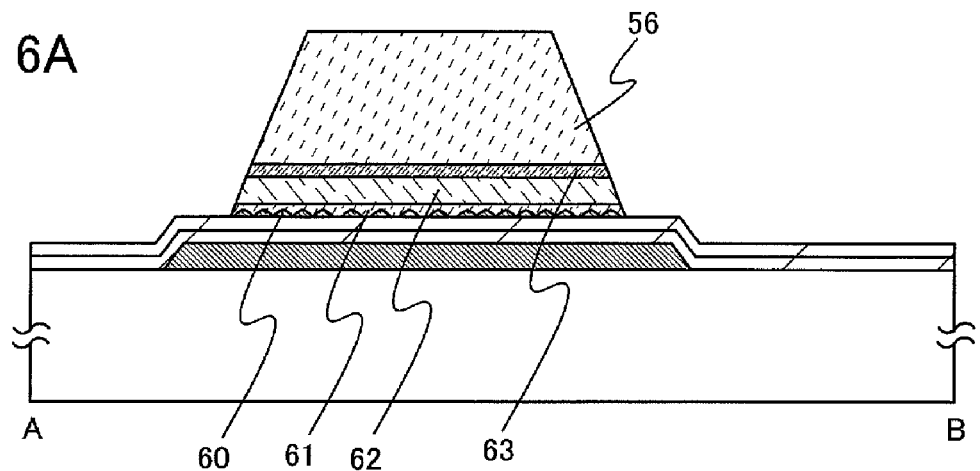
FIGS. 6A to 6C are cross-sectional views illustrating a method for manufacturing a thin film transistor of an embodiment mode of the present invention.
Figure 8A:
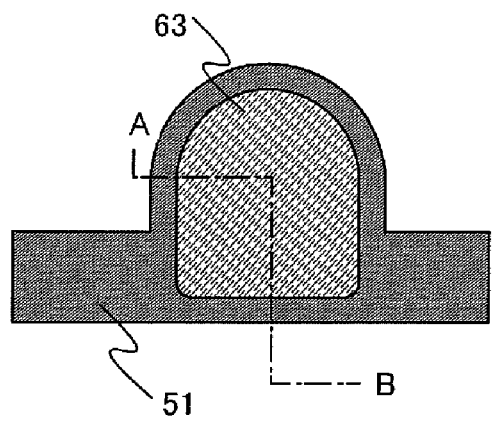
FIGS. 8A to 8C are plan views illustrating a method for manufacturing a thin film transistor of an embodiment mode of the present invention.

Next, the crystal grains 44 that mainly contain silicon, the semiconductor film 45 that mainly contains germanium, the buffer layer 54, and the semiconductor film 55 to which the impurity element imparting one conductivity is added are etched using the resist mask 56, to form crystal grains 60 that mainly contain silicon, a semiconductor film 61 that mainly contains germanium, a buffer layer 62, and a semiconductor film 63 to which the impurity element imparting one conductivity type is added, as illustrated in FIG. 6A. After that, the resist mask 56 is removed. FIG. 6A is a cross-sectional view taken along a line A-B in FIG. 8A (although the resist mask 56 is not illustrated in FIG. 8A).

The semiconductor film 61 that mainly contains germanium and the buffer layer 62 have inclined end side faces, whereby the distance of a leak path is long; thus, occurrence probability of generation of leakage current can be reduced between the semiconductor film 61 that mainly contains germanium and the source and drain regions that are formed over the buffer layer 62. In addition, occurrence probability of generation of leakage current can be reduced between the wirings and the semiconductor film 61 that mainly contains germanium. The inclination angle of the end side faces of the semiconductor film 61 that mainly contains germanium and the buffer layer 62 is from 30° to 90°, preferably from 45° to 80°. With such an angle, disconnection of the wirings due to a step shape can be prevented.

Figure 6B:
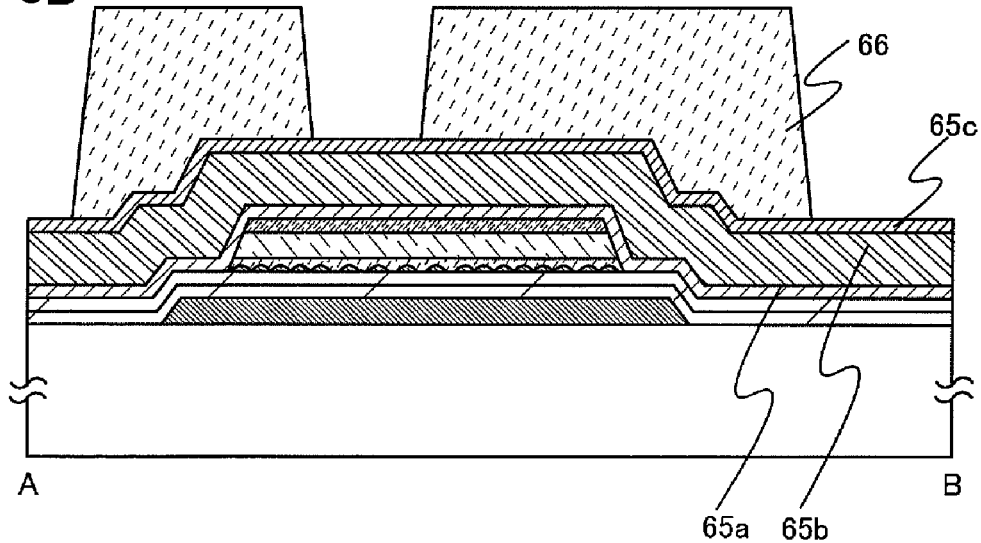

Next, as illustrated in FIG. 6B, conductive films 65a to 65c are formed over the semiconductor film 63 to which the impurity element imparting one conductivity type is added and the gate insulating film 52b, and a resist mask 66 is formed over the conductive films 65a to 65c. The conductive films 65a to 65 are formed by a sputtering method, a CVD method, a printing method, a droplet discharge method, an evaporation method, or the like using any of the materials of the wirings 71a to 71c described in Embodiment Mode 1 as appropriate. This embodiment mode presents the conductive film having a three-layer structure of the conductive films 65a to 65c; a stacked-layer structure in which the conductive films 65a and 65c are formed using molybdenum films and the conductive film 65b is formed using an aluminum film, or a stacked-layer structure in which the conductive films 65a and 65c are formed using titanium films and the conductive film 65b is formed using an aluminum film is formed. The conductive films 65a to 65c are formed by a sputtering method or a vacuum evaporation method.

The resist mask 66 can be formed in a similar manner to the resist mask 56.

Figure 6C:
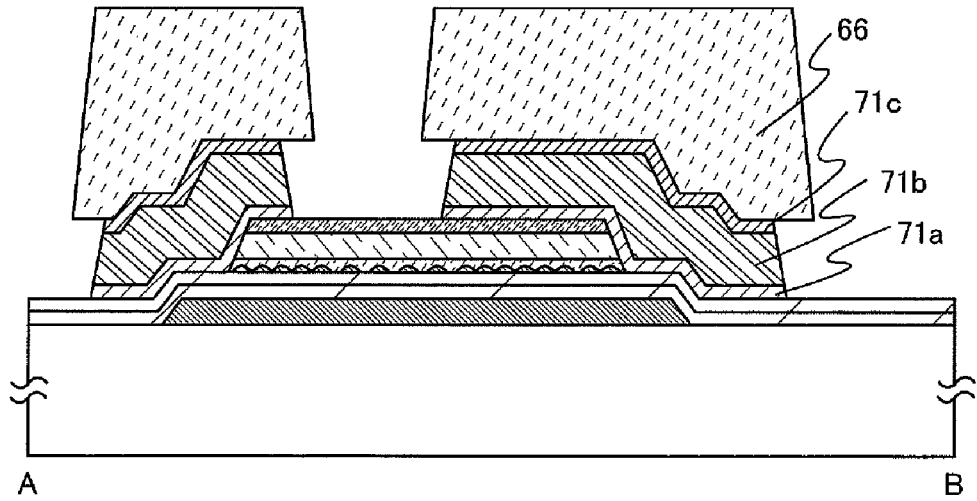

Next, as illustrated in FIG. 6C, the conductive films 65a to 65c are partly etched to form pairs of the wirings 71a to 71c (serving as source and drain electrodes). If the conductive films 65a to 65c are wet-etched using the resist mask 66 that is formed by a photolithography process using a third photomask, the conductive films 65a to 65c are isotropically etched. Consequently, the wirings 71a to 71c having smaller areas than the resist mask 66 can be formed.

Figure 7A:
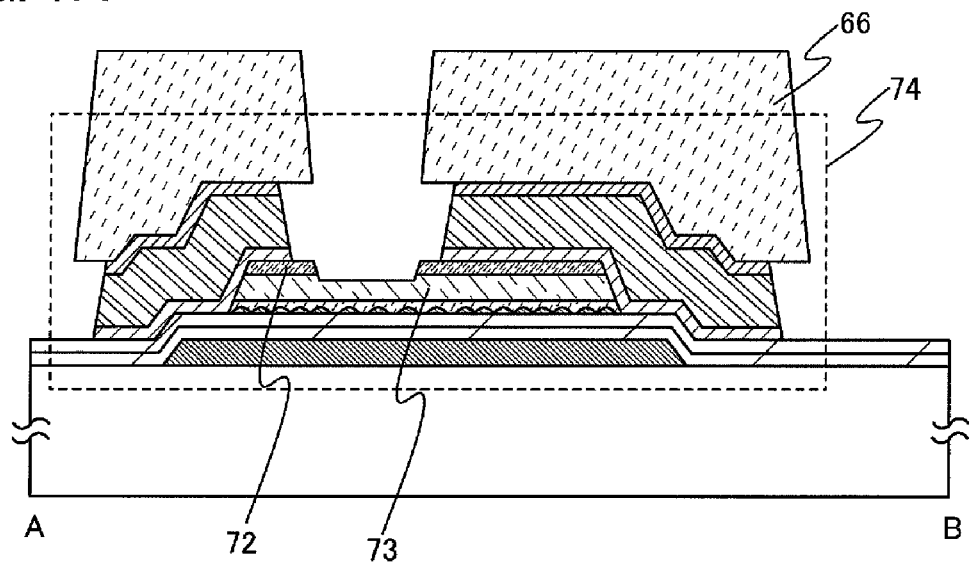
FIGS. 7A to 7C are cross-sectional views illustrating a method for manufacturing a thin film transistor of an embodiment mode of the present invention.

Subsequently, the semiconductor film 63 to which the impurity element imparting one conductivity type is added is etched to be separated using the resist mask 66. As a result, a pair of semiconductor films 72 to which the impurity element imparting one conductivity type is added and which serve as the source and drain regions can be formed, as illustrated in FIG. 7A. In this etching process, the buffer layer 62 is also etched partly. The buffer layer which is etched partly and has a recessed portion is referred to as a buffer layer 73. The source and drain regions and the recessed portion of the buffer layer can be formed in the same step. The recessed portion of the buffer layer is formed with a depth which is ½ to ⅓ of the largest thickness of the buffer layer, so that the source and drain regions can be separated from each other with a longer distance therebetween; thus, leakage current between the source and drain regions can be reduced. After that, the resist mask 66 is removed.

Next, dry etching may be performed under such a condition that the exposed buffer layer is not damaged and an etching rate with respect to the buffer layer is low. Through this dry etching step, an etching residue on the buffer layer between the source region and the drain region, a residue of the resist mask, and a contamination source in an apparatus used for removal of the resist mask can be removed, whereby the source region and the drain region can be insulated surely. As a result, leakage current of the thin film transistor can be reduced, so that a thin film transistor with small off current and high withstand voltage can be manufactured. A chlorine gas can be used for an etching gas, for example.

Figure 8B:
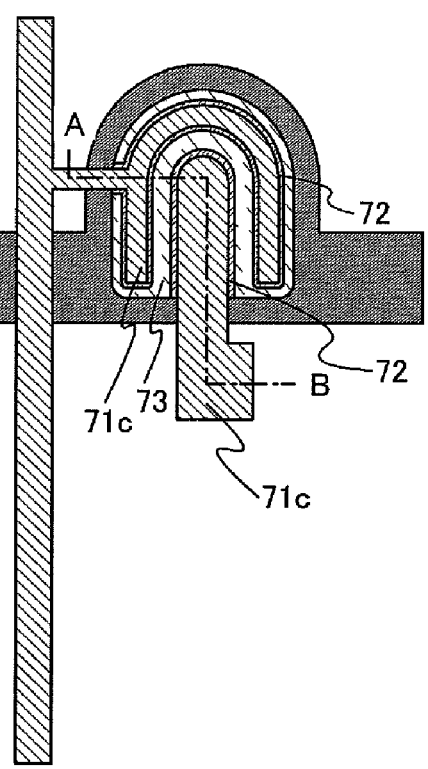

FIG. 7A is a cross-sectional view taken along a line A-B in FIG. 8B (although the resist mask 66 is not illustrated in FIG. 8B). As illustrated in FIG. 8B, end portions of the pair of semiconductor films 72 to which the impurity element imparting one conductivity type is added and which serve as the source and drain regions are located outside those of the wirings 71c. Further, an end portion of the buffer layer 73 is located outside those of the wirings 71c and those of the pair of semiconductor films 72 to which the impurity element imparting one conductivity type is added and which serve as the source and drain regions. Furthermore, one of the wirings surrounds the other (specifically, the former is in a U-shape or a C-shape). Thus, an area of a region where carriers travel can be increased, and the amount of electric current can be increased, and an area of the thin film transistor can be reduced. Still furthermore, the semiconductor film that mainly contains germanium and the wirings overlap with one another over the gate electrode; thus, influence by unevenness of the gate electrode is small and reduction in coverage and generation of a leakage current can be suppressed.

Through the above process, a channel-etched thin film transistor 74 can be formed.

Figure 7B:
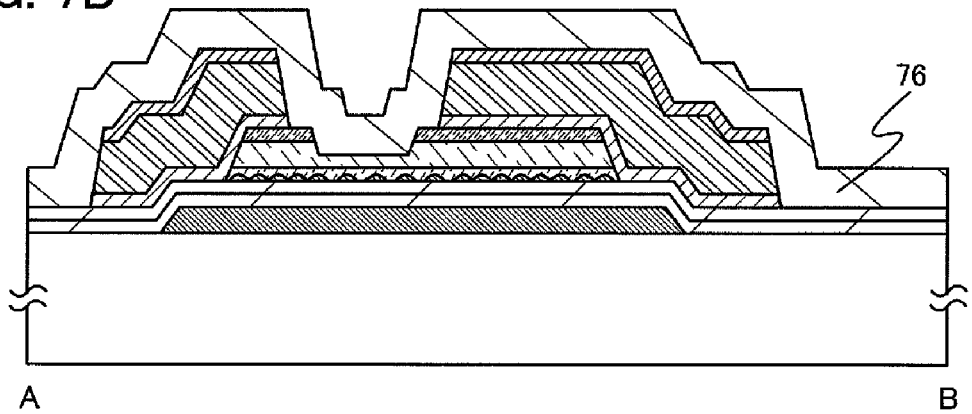

Next, as illustrated in FIG. 7B, a protective insulating film 76 is formed over the wirings 71a to 71c, the pair of semiconductor films 72 to which the impurity element imparting one conductivity type is added and which serve as the source and drain regions, the buffer layer 73, and the gate insulating film 52b. The protective insulating film 76 can be formed in a similar manner to the gate insulating films 52a and 52b. The protective insulating film 76 prevents entrance of a contamination impurity such as an organic matter, a metal, or moisture in the atmosphere; thus, it is preferable that the protective insulating film 76 be a dense film. Further, by forming a silicon nitride film as the protective insulating film 76, the oxygen concentration in the buffer layer 73 can be set to be less than or equal to $5 \times 10^{19}$ atoms/cm$^3$, preferably less than or equal to $1 \times 10^{19}$ atoms/cm$^3$, which prevents the buffer layer 73 from being oxidized.

Figure 7C:
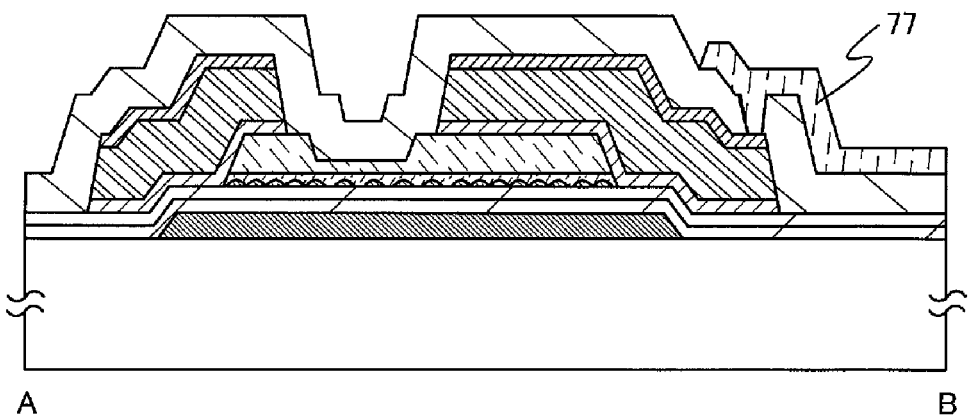
Figure 8C:
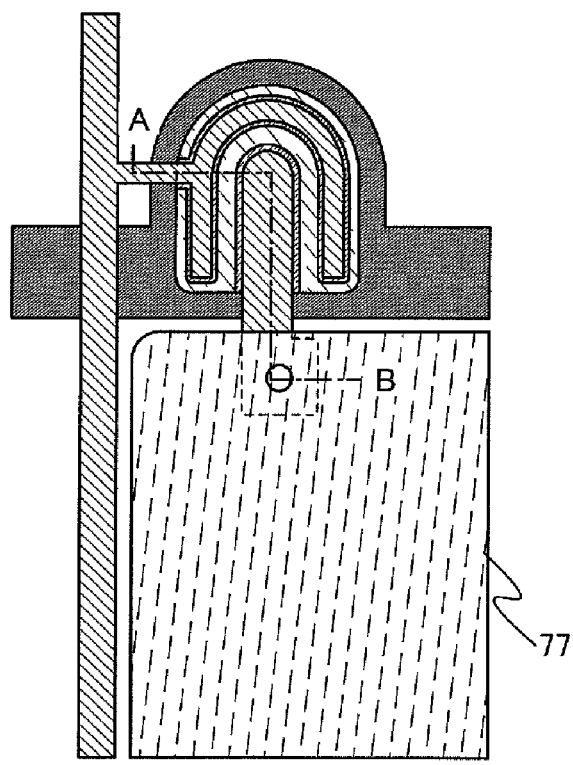

Next, as illustrated in FIG. 7C, a contact hole is formed in the protective insulating film 76 by partly etching the protective insulating film 76 using a resist mask formed using a fourth photomask. Then, a pixel electrode 77 that is in contact with the wiring 71c in the contact hole is formed. FIG. 7C is a cross-sectional view taken along a line A-B in FIG. 8C. The wirings 71a to 71c which are connected to the pixel electrode 77 of a display element serve as a drain electrode, and the wirings 71a to 71c which face the wirings serving as the drain electrode serve as a source electrode (a source wiring), whereby on current of the thin film transistor can be increased and deterioration due to repeated operations can be reduced. In addition, parasitic capacitance is less apt to be generated between the gate electrode 51 and the wirings 71a to 71c serving as the drain electrode, and electric charge can easily be accumulated in the pixel electrode 77. Therefore, when the thin film transistor is used for a liquid crystal display device, a liquid crystal element can be operated at high speed.

The pixel electrode 77 can be formed using a light-transmitting conductive material such as indium oxide including tungsten oxide, indium zinc oxide including tungsten oxide, indium oxide including titanium oxide, indium tin oxide including titanium oxide, indium tin oxide (also referred to as ITO), indium zinc oxide, or indium tin oxide to which silicon oxide is added.

Further, the pixel electrode 77 can be formed using a conductive composition including a conductive high molecule (also referred to as a conductive polymer). It is preferable that a pixel electrode formed using a conductive composition have sheet resistance of less than or equal to 10000 Ω/□, and light transmittance of greater than or equal to 70% at a wavelength of 550 nm. Further, it is preferable that a conductive high molecule included in a conductive composition have resistivity of less than or equal to 0.1 Ω·cm.

As a conductive high molecule, a "π electron conjugated conductive high molecule" can be used. For example, polyaniline or a derivative thereof, polypyrrole or a derivative thereof, polythiophene or a derivative thereof, or a copolymer of two or more kinds of these materials can be given.

In this example, to form the pixel electrode 77, an ITO film is formed by a sputtering method, and then a resist is applied on the ITO film. Subsequently, the resist is exposed to light and developed using a fifth photomask, thereby forming a resist mask. Then, the ITO film is etched using the resist mask to form the pixel electrode 77.

In the above manner, an element substrate which can be used for a thin film transistor and a display device can be formed.

Moreover, in the process of forming the semiconductor film that mainly contains silicon or the semiconductor film that mainly contains germanium, helium may be added to a reaction gas in addition to hydrogen and the deposition gas including silicon or germanium. Helium has an ionization energy of 24.5 eV, which is the highest among all the gases, and a metastable state thereof lies in a level of 20 eV approximately, which is a little lower than the above ionization energy; thus, to be ionized, helium requires as low as about 4 eV, which is the difference between the ionization energy and the metastable energy, while keeping electric discharge. Therefore, helium starts to discharge electricity at the lowest voltage among all the gases. Because of the above property, helium can stably retain plasma. Further, since uniform plasma can be formed with helium, a plasma density can be uniform even when the semiconductor film that mainly contains silicon and the semiconductor film that mainly contains germanium are deposited over a large substrate.

The thin film transistor in which the semiconductor film that mainly contains germanium is used for the channel formation region has higher mobility and higher on current than a thin film transistor in which an amorphous silicon film or a microcrystalline silicon film is used for a channel formation region. Thus, with the use of the thin film transistor in which the channel formation region is formed using the semiconductor film that mainly contains germanium for switching of a display element, the area of the channel formation region, that is, the area of the thin film transistor can be reduced. Accordingly, the area of the thin film transistor in each pixel is reduced, whereby the aperture ratio of the pixel can be increased. Consequently, the display device can have high definition.

Since the channel formation region of the thin film transistor manufactured in this embodiment mode is formed using the semiconductor film that mainly contains germanium, resistivity thereof is lower than that of a channel formation region formed using an amorphous silicon film. Therefore, the thin film transistor in which the semiconductor film that mainly contains germanium is used for the channel formation region has current-voltage characteristics represented by a curve with a steep slope in a rising portion, has excellent response as a switching element, and can be operated at high speed. Further, by forming the channel formation region of the thin film transistor with the semiconductor film that mainly contains germanium, variation in threshold voltage of the thin film transistor is suppressed; field effect mobility is improved; and subthreshold swing (S value) is lowered. Thus, the thin film transistor can achieve high performance. Accordingly, a driving frequency of a display device can be increased, whereby the panel size can be increased and high density of pixels can be achieved.

Further, in the thin film transistor manufactured in this embodiment mode, an amorphous silicon film with high resistivity is formed as the buffer layer between the semiconductor film that mainly contains germanium and serves as the channel formation region and the semiconductor films to which the impurity element imparting one conductivity type is added and which serve as the source and drain regions. Off current flows through the buffer region; however, the buffer layer, which is a high-resistance region, can suppress off current, and can prevent the semiconductor film that mainly contains germanium from being oxidized. Accordingly, off current can be suppressed, and increase in on current which is due to reduction in defects in the channel formation region can be realized. Furthermore, deterioration with time can be decreased.

Next, as an example of a plasma CVD apparatus which is applied to the film formation process of the present invention, an example of a structure which is suitable for deposition of the gate insulating film, the semiconductor film that mainly contains silicon, and the semiconductor film that mainly contains germanium is described.

Figure 9:
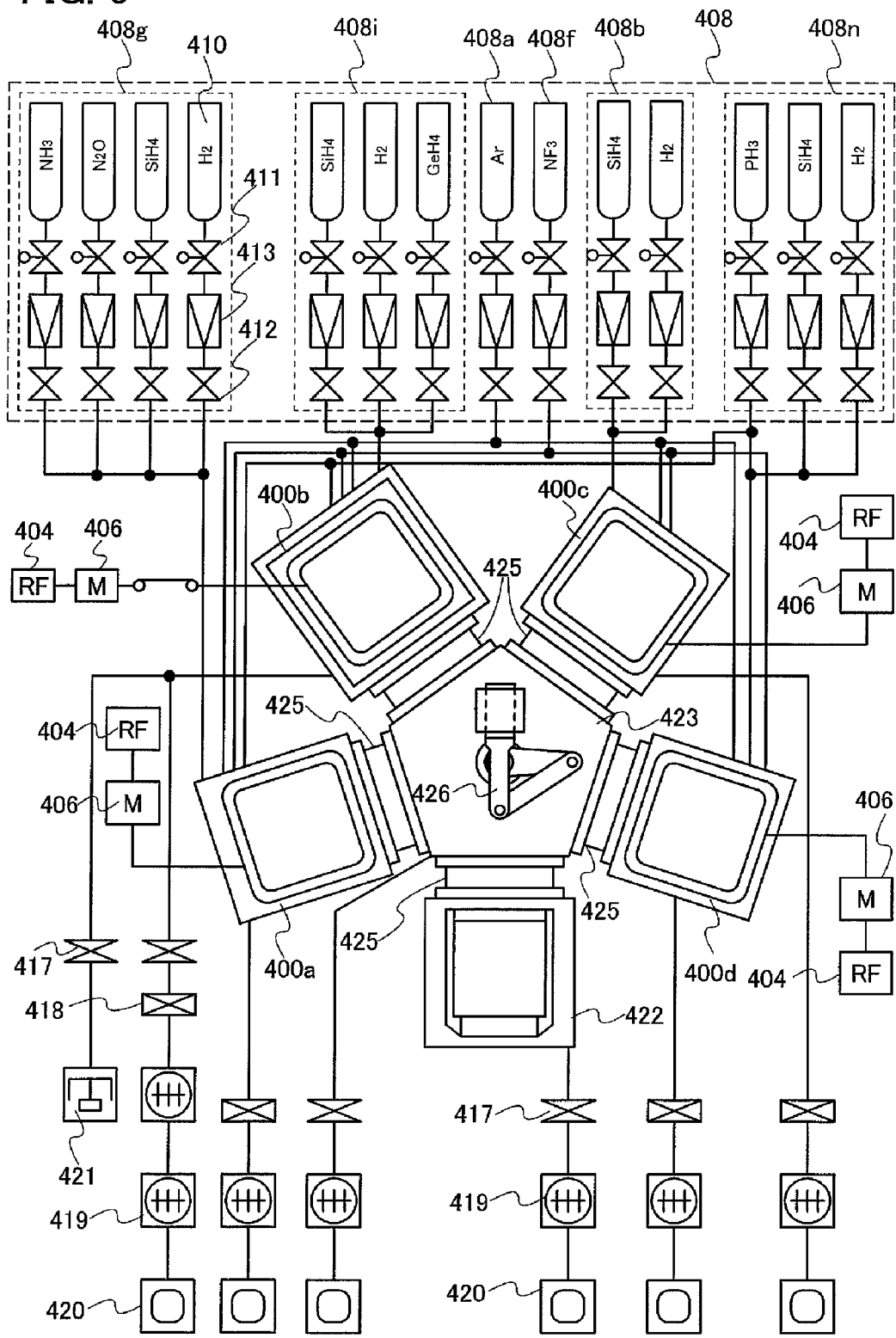
FIG. 9 is a drawing illustrating a structure of a plasma CVD apparatus applicable to the present invention.

FIG. 9 illustrates an example of a multi-chamber plasma CVD apparatus having a plurality of reaction chambers. The apparatus is provided with a common chamber 423, a load/unload chamber 422, a first reaction chamber 400a, a second reaction chamber 400b, a third reaction chamber 400c, and a fourth reaction chamber 400d. This apparatus is a single-wafer processing type in which a substrate set in a cassette in the load/unload chamber 422 is transferred to/from each reaction chamber by a transfer unit 426 provided for the common chamber 423. A gate valve 425 is provided between the common chamber 423 and each chamber such that treatments performed in different reaction chambers do not interfere one another Each reaction chamber is used for a different purpose, depending on the kind of a thin film to be formed. For example, an insulating film such as the gate insulating film is formed in the first reaction chamber 400a; the semiconductor film that mainly contains silicon and constitutes the crystal grains later, and the semiconductor film that mainly contains germanium and serves as the channel formation region of the thin film transistor are formed in the second reaction chamber 400b; the buffer layer that serves as a high-resistance region of the thin film transistor is formed in the third reaction chamber 400c; and the semiconductor film to which the impurity element imparting one conductivity type is added and which forms a source and a drain is formed in the fourth reaction chamber 400d. It is needless to say that the number of the reaction chambers is not limited to four, and can be increased or decreased as needed. One film may be formed in one reaction chamber, or a plurality of films may be formed in one reaction chamber.

A turbo-molecular pump 419 and a dry pump 420 are connected to each reaction chamber as an exhaust unit. The exhaust unit is not limited to a combination of these vacuum pumps and can employ other vacuum pumps as long as they can evacuate the reaction chamber to a degree of vacuum of approximately $10^{-5}$ to $10^{-1}$ Pa. A butterfly valve 417, which can interrupt vacuum evacuation, is provided between the exhaust unit and each reaction chamber, and a conductance valve 418 can control pumping speed to adjust the pressure in each reaction chamber.

The second reaction chamber 400b in which the semiconductor film that mainly contains germanium is formed may be connected to a cryopump 421 which performs vacuum evacuation to an ultrahigh vacuum. By use of the cryopump 421, the reaction chamber can be evacuated to an ultrahigh vacuum of a pressure of lower than $10^{-5}$ Pa. In this embodiment mode, the inside of the reaction chamber is set to be an ultrahigh vacuum with a pressure of lower than $10^{-5}$ Pa, which is effective in reducing oxygen and nitrogen concentrations in the semiconductor film that mainly contains germanium. Consequently, the oxygen concentration and the nitrogen concentration in the semiconductor film that mainly contains germanium can each be set to be less than or equal to $1 \times 10^{16}$ atoms/cm$^3$. With the reduced oxygen and nitrogen concentrations in the semiconductor film that mainly contains germanium, defects in the film can be reduced, whereby crystallinity can be improved and thus carrier mobility can be improved.

A gas supply unit 408 includes a cylinder 410 filled with a gas used for the process, such as rare gas or a semiconductor source gas typified by germane, stop valves 411 and 412, a mass flow controller 413, and the like. A gas supply unit 408g is connected to the first reaction chamber 400a and supplies gases for forming the gate insulating film. A gas supply unit 408i is connected to the second reaction chamber 400b and supplies gases for forming the semiconductor film that mainly contains silicon and the semiconductor film that mainly contains germanium. A gas supply unit 408b is connected to the third reaction chamber 400c and supplies gases for forming the buffer layer. A gas supply unit 408n is connected to the fourth reaction chamber 400d and supplies gases for forming the n-type semiconductor film, for example. In addition, phosphine, which is one of the gases including a donor impurity element, may be supplied to the first reaction chamber 400a and the second reaction chamber 400b. A gas supply unit 408a supplies argon, and a gas supply unit 408f supplies an etching gas used for cleaning the inside of the reaction chambers. The gas supply units 408a and 408f are provided in common for each reaction chamber.

A high-frequency power supply unit for producing plasma is connected to each reaction chamber. The high-frequency power supply unit includes a high-frequency power source 404 and a matching box 406.

Each reaction chamber can be used for a different purpose, depending on the kind of a thin film to be formed. Since each thin film has an optimum temperature for being formed, each thin film is formed in a different reaction chamber, whereby film formation temperatures can be easily controlled. Further, the same kind of films can be formed repeatedly, so that an influence of residual impurities due to a film which has been formed can be eliminated. In particular, if the semiconductor film that mainly contains germanium includes a donor impurity element, entrance of the donor impurity element into the buffer layer can be prevented. Consequently, the concentration of the impurity element in the buffer layer can be reduced, and thus off current of the thin film transistor can be reduced.

The semiconductor film that mainly contains silicon, the semiconductor film that mainly contains germanium, the buffer layer, and the semiconductor film to which the impurity element imparting one conductivity type is added may be formed successively in one reaction chamber. Specifically, a substrate provided with the gate insulating film is placed in a reaction chamber, and the semiconductor film that mainly contains silicon, the semiconductor film that mainly contains germanium, the buffer layer, and the semiconductor film to which the impurity element imparting one conductivity type is added are formed therein successively. It is preferable that the inside of the reaction chamber is cleaned with fluorine radicals after the substrate is taken out of the reaction chamber.

This embodiment mode describes an inverted-staggered thin film transistor as a thin film transistor, but the present invention is not limited thereto and can be applied to a staggered thin film transistor, a top gate thin film transistor, and the like. Specifically, crystal grains that mainly contain silicon and a semiconductor film that mainly contains germanium are formed over an insulating film serving as a base film, and a gate insulating film and a gate electrode are formed over the semiconductor film that mainly contains germanium, so that a thin film transistor having the semiconductor film that mainly contains germanium and has improved crystallinity at the interface with the insulating film serving as the base film can be manufactured.

In accordance with this embodiment mode, an inverted-staggered thin film transistor with excellent electric characteristics and an element substrate provided with the inverted-staggered thin film transistor can be manufactured.

Embodiment Mode 6

Hereinafter, this embodiment mode describes a method for manufacturing the thin film transistor presented in Embodiment Mode 2.

Figure 10A:
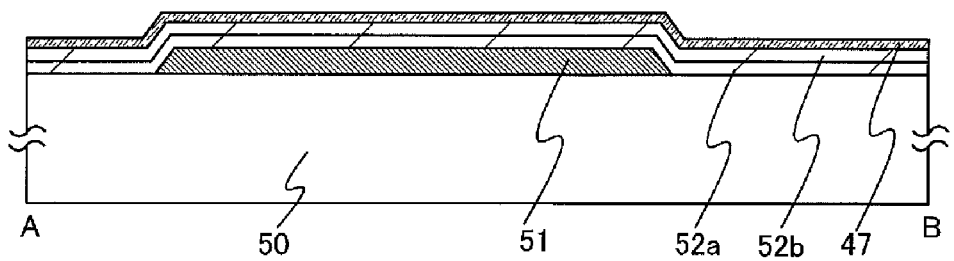
FIGS. 10A to 10E are cross-sectional views illustrating a method for manufacturing a thin film transistor of an embodiment mode of the present invention.

In a similar manner to Embodiment Mode 5, a gate electrode 51 is formed over a substrate 50, and gate insulating films 52a and 52b are formed over the gate electrode 51 as illustrated in FIG. 10A. Subsequently, a semiconductor film 47 that mainly contains silicon is formed over the gate insulating film 52b.

In this example, as the semiconductor film 47 that mainly contains silicon, a silicon film including a donor impurity element is formed by a plasma CVD method or a sputtering method. As the donor impurity element, phosphorus, arsenic, or antimony is used. Further, as the semiconductor film 47 that mainly contains silicon, an amorphous silicon film, an amorphous silicon germanium ($Si_xGe_{1-x}$, $0.5<x<1$) film, a microcrystalline silicon film, or a microcrystalline silicon germanium ($Si_xGe_{1-x}$, $0.5<x<1$) film is formed.

The semiconductor film 47 that mainly contains silicon and includes the donor impurity element may be formed using a gas including the donor impurity element in addition to the source gas for the semiconductor film 42 that mainly contains silicon, which is presented in Embodiment Mode 5. For example, an amorphous silicon film or a microcrystalline silicon film that includes phosphorus can be formed by a plasma CVD method using phosphine in addition to silane and hydrogen.

It is preferable that the concentration of the donor impurity element be from $6\times10^{15}$ atoms/cm$^3$ to $3\times10^{18}$ atoms/cm$^3$ inclusive, more preferably from $1\times10^{16}$ atoms/cm to $3\times10^{18}$ atoms/cm$^3$ inclusive, still more preferably from $3\times10^{16}$ atoms/cm$^3$ to $3\times10^{17}$ atoms/cm$^3$ inclusive. The concentration of the donor impurity element is set to be in the above range, whereby the interface between the gate insulating film 52b and the semiconductor film 47 that mainly contains silicon and includes the donor impurity element can have improved crystallinity.

Alternatively, before forming the semiconductor film 47 that mainly contains silicon, a gas including the donor impurity element may be supplied into a reaction chamber of a film formation apparatus, and the donor impurity element may be adsorbed onto the surface of the gate insulating film 52b and the inner wall of the reaction chamber. After that, the semiconductor film 47 that mainly contains silicon is deposited, so that the semiconductor film 47 that mainly contains silicon and includes the donor impurity element can be formed because the semiconductor film that mainly contains silicon is deposited while taking in the donor impurity element.

Figure 10B:
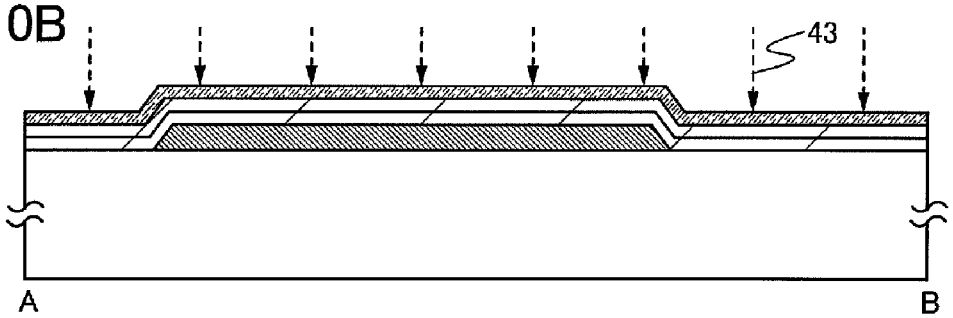
Figure 10C:
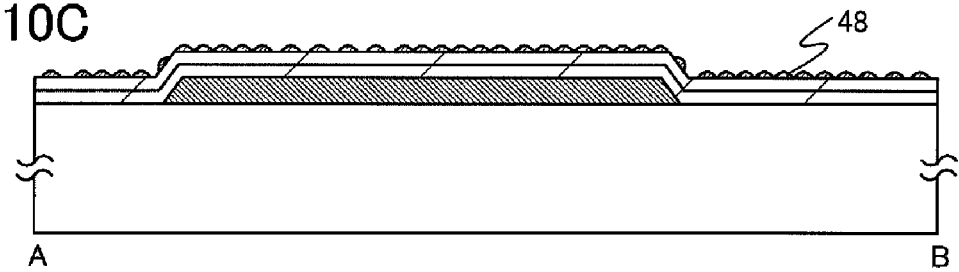

Next, crystal grains with high crystallinity are formed using the semiconductor film 47 that mainly contains silicon. Here, as illustrated in FIG. 10B, the semiconductor film 47 that mainly contains silicon and includes the donor impurity element is irradiated with plasma 43. As a result, as illustrated in FIG. 10C, crystal grains 48 that mainly contain silicon and include the donor impurity element are formed over the gate insulating film 52b. As the plasma 43, the plasma 43 described in Embodiment Mode 5 can be used as appropriate.

Further, instead of the semiconductor film 47 that mainly contains silicon and includes the donor impurity element, the semiconductor film 42 that mainly contains silicon and is described in Embodiment Mode 5 may be formed, and in order to produce the plasma 43, a gas including the donor impurity element may be introduced to the reaction chamber in addition to hydrogen, fluorine, or a fluoride. An amorphous component of the semiconductor film 47 that mainly contains silicon is etched with hydrogen, fluorine, or a fluoride, and the donor impurity element are added to the semiconductor film that mainly contains silicon and remains, whereby the crystal grains 48 that mainly contains silicon and includes the donor impurity element can be formed.

Figure 10D:
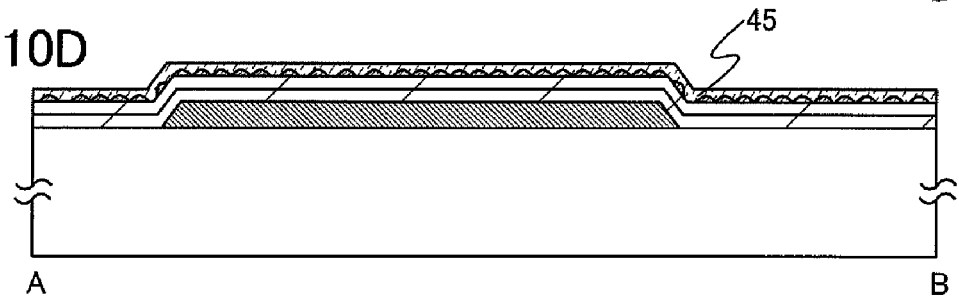

Next, hydrogen and a deposition gas including germanium are introduced into the reaction chamber, and high-frequency power is applied to grow crystals using the crystal grains 48 as crystal nuclei, so that a semiconductor film 45 that mainly contains germanium is formed, as illustrated in FIG. 10D. Further, with the use of a deposition gas including silicon in addition to hydrogen and a deposition gas including germanium, an amorphous silicon germanium ($Si_yGe_{1-y}$, $0<y<0.5$) film or a microcrystalline silicon germanium ($Si_yGe_{1-y}$, $0<y<0.5$) film is formed.

Furthermore, a fluoride gas may be used in addition to a deposition gas including germanium to form the semiconductor film 45 that mainly contains germanium.

By growing the crystals using the crystal grains 48 as crystal nuclei, a microcrystalline semiconductor film with high crystallinity can be formed as the semiconductor film 45 that mainly contains germanium. In this example, germane and hydrogen and/or a rare gas are mixed, and the microcrystalline germanium film is formed with glow discharge plasma.

Before forming the semiconductor film 45 that mainly contains germanium, it is preferable to form an amorphous germanium film or a microcrystalline germanium film on the inner wall of the reaction chamber of the film formation apparatus. Further, it is preferable to clean the inner wall of the reaction chamber with fluorine plasma or the like and then to form an amorphous germanium film or a microcrystalline germanium film on the inner wall of the reaction chamber. By such treatment, in forming the semiconductor film 45 that mainly contains germanium, entrance of a material of the inner wall of the reaction chamber or fluorine used for the cleaning into the semiconductor film 45 that mainly contains germanium can be reduced.

Further, as the semiconductor film 45 that mainly contains germanium, a semiconductor film that mainly contains germanium and includes a donor impurity element may be formed. The semiconductor film that mainly contains germanium and includes the donor impurity element may be formed using a gas including the donor impurity element in addition to a source gas for the semiconductor film that mainly contains germanium. For example, a microcrystalline germanium film including phosphorus can be formed by a plasma CVD method using germane, hydrogen, and phosphine.

Alternatively, before forming the semiconductor film 45 that mainly contains germanium, a gas including the donor impurity element may be supplied into the reaction chamber of the film formation apparatus, and the donor impurity element may be adsorbed onto the surfaces of the gate insulating film 52b and of the crystal grains 48, and the inner wall of the reaction chamber. After that, the semiconductor film 45 that mainly contains germanium is deposited, so that the semiconductor film that mainly contains germanium and includes the donor impurity element can be formed because the semiconductor film that mainly contains germanium is deposited while taking in the donor impurity element.

Alternatively, the donor impurity element may be added to the amorphous germanium film or the microcrystalline germanium film formed on the inner wall of the reaction chamber. It is preferable that the concentration of the donor impurity element be from $6\times10^{15}$ atoms/cm$^3$ to $3\times10^{18}$ atoms/cm$^3$ inclusive, more preferably from $1\times10^{16}$ atoms/cm$^3$ to $3\times10^{18}$ atoms/cm$^3$ inclusive, still more preferably from $3\times10^{16}$ atoms/cm$^3$ to $3\times10^{17}$ atoms/cm$^3$ inclusive. By such treatment, in vacuum-evacuating the reaction chamber, the donor impurity element attached to the inner wall of the reaction chamber is released in the reaction chamber The released donor impurity element enters the semiconductor film 45 that mainly contains germanium; thus, the semiconductor film 45 that mainly contains germanium and includes the donor impurity element can be formed.

The semiconductor film that mainly contains germanium and includes the donor impurity element has low resistivity; thus, the thin film transistor having this semiconductor film can have higher on current and higher mobility.

Instead of forming the semiconductor film 47 that mainly contains silicon and includes the donor impurity element, a semiconductor film that mainly contains silicon and does not include a donor impurity element may be formed, and an insulating film including a donor impurity element may be formed as the gate insulating film 52b. For example, a silicon oxide film, a silicon nitride film, a silicon oxynitride film, a silicon nitride oxide film, or the like including a donor impurity element (e.g., phosphorus, arsenic, or antimony) can be used. In a case of employing a stacked-layer structure for the gate insulating film 52b, the donor impurity element may be added to a layer in contact with the semiconductor film 47 that mainly contains silicon or a layer in contact with the gate insulating film 52a.

In a method for forming the insulating film including the donor impurity element as the gate insulating film 52b, the insulating film may be formed using a gas including the donor impurity element in addition to a source gas for the insulating film. For example, a silicon nitride film including phosphorus can be formed by a plasma CVD method using silane, ammonia, and phosphine. Further, a silicon oxynitride film including phosphorus can be formed by a plasma CVD method using silane, dinitrogen monoxide, ammonia, and phosphine.

Before forming the gate insulating film 52b, a gas including the donor impurity element may be supplied into the reaction chamber of the film formation apparatus, and the donor impurity element may be adsorbed onto the surface of the gate insulating film 52a and the inner wall of the reaction chamber. After that, the gate insulating film 52b is formed. After forming the gate insulating film 52b while it is taking in the donor impurity element, the semiconductor film 47 that mainly contains silicon is deposited, so that the semiconductor film 47 that mainly contains silicon and includes the donor impurity element can be formed.

Further, the donor impurity element may be added to two or more of the gate insulating film 52b, the semiconductor film 47 that mainly contains silicon, the crystal grains 48, and the semiconductor film 45 that mainly contains germanium.

Through the above process, the microcrystalline germanium film having high crystallinity at the interface with the gate insulating film and also inside the film can be formed.

Figure 10E:
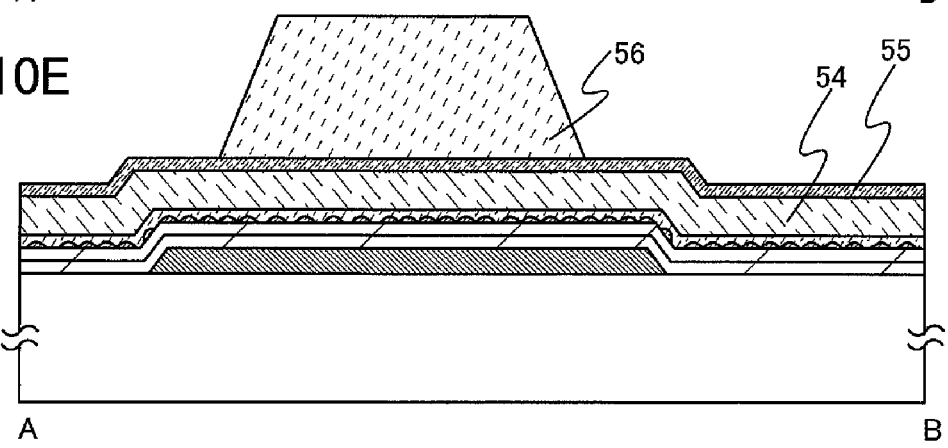

Next, as illustrated in FIG. 10E, a buffer layer 54 and a semiconductor film 55 to which an impurity element imparting one conductivity type is added are formed in order over the semiconductor film 45 that mainly contains germanium. Then, a resist mask 56 is formed over the semiconductor film 55 to which the impurity element imparting one conductivity type is added.

After that, through a similar process to Embodiment Mode 5, a thin film transistor as described in Embodiment Mode 2 can be manufactured.

This embodiment mode describes an inverted-staggered thin film transistor as a thin film transistor, but the present invention is not limited thereto and can be applied to a staggered thin film transistor, a top gate thin film transistor, and the like. Specifically, crystal grains that mainly contain silicon and a semiconductor film that mainly contains germanium are formed over an insulating film serving as a base film, and a gate insulating film and a gate electrode are formed over the semiconductor film that mainly contains germanium, so that a thin film transistor having the semiconductor film that mainly contains germanium and has improved crystallinity at the interface with the insulating film serving as the base film can be manufactured.

Embodiment Mode 7

Hereinafter, this embodiment mode describes a method for manufacturing the thin film transistor presented in Embodiment Mode 3.

Figure 11A:
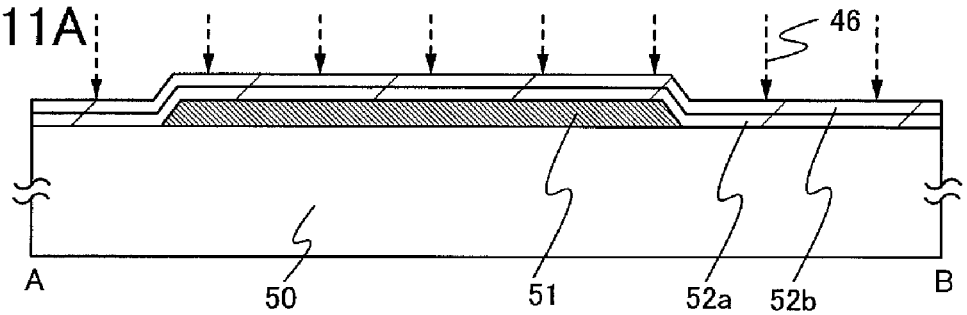
FIGS. 11A to 11E are cross-sectional views illustrating a method for manufacturing a thin film transistor of an embodiment mode of the present invention.
Figure 11B:
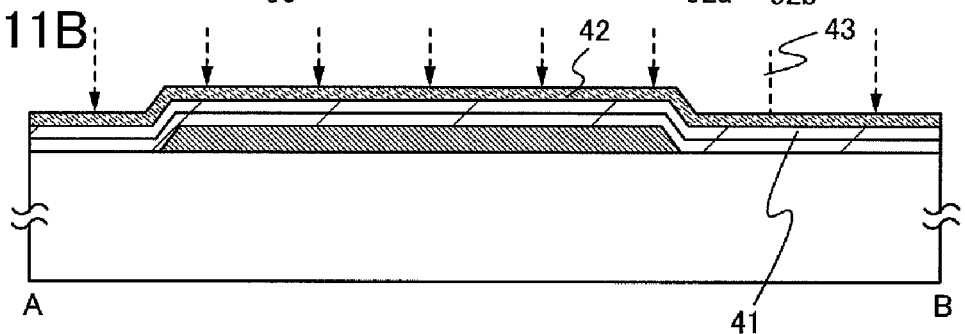

As illustrated in FIG. 11A, in a similar manner to Embodiment Mode 5, a gate electrode 51 is formed over a substrate 50, and gate insulating films 52a and 52b are formed over the gate electrode 51.

Next, a surface of the gate insulating film 52b is exposed to plasma 46, whereby a gate insulating film 41 having an uneven surface with projections and depressions is formed as illustrated in the enlarged view 40 of FIG. 3. Each of the projections and depressions may have a wavelike shape with a gentle curve to form the uneven shape. Alternatively, the projections may have a sharp needle-like shape and the depressions may have a gently curved shape. It is preferable that intervals between the projections and depressions be short, which enables crystal grains to be formed at a high density later.

The gate insulating film 52b is exposed to the plasma 46 that makes the surface of the gate insulating film 52b uneven. Such plasma 46 is produced by introducing at least one of fluorine, a fluoride gas, and hydrogen into a reaction chamber and applying high-frequency power. By being exposed to the plasma 46, the surface of the gate insulating film 52b is etched, whereby the uneven gate insulating film 41 is formed.

Next, a semiconductor film 42 that mainly contains silicon is formed over the gate insulating film 41. Since the surface of the gate insulating film 41 is uneven, the semiconductor film 42 that mainly contains silicon also has an uneven surface where the height difference between the top of the projection and the bottom of the depression is several nanometers to several tens of nanometers, although not illustrated. Then, in a similar manner to Embodiment Mode 5, crystal grains with high crystallinity are formed at a high density. Similarly, plasma 43 is produced by introducing at least one of fluorine, a fluoride gas, and hydrogen into a reaction chamber of a plasma CVD apparatus and applying high-frequency power to expose the semiconductor film 42 that mainly contains silicon to the plasma 43, whereby a part of the semiconductor film 42 that mainly contains silicon, typically, an amorphous component thereof is etched. In this embodiment mode, since the surface of the semiconductor film 42 that mainly contains silicon is uneven, crystal grains can be formed more easily owing to stress concentration on the semiconductor film 42 that mainly contains silicon. Further, since bonds of Si in the semiconductor film 42 that mainly contains silicon are formed at a (110) plane and at another plane as well, the bonding strength increases, whereby adhesiveness between the gate insulating film and the crystal grains, and further between the gate insulating film and the semiconductor film that mainly contains germanium is improved.

Figure 11C:
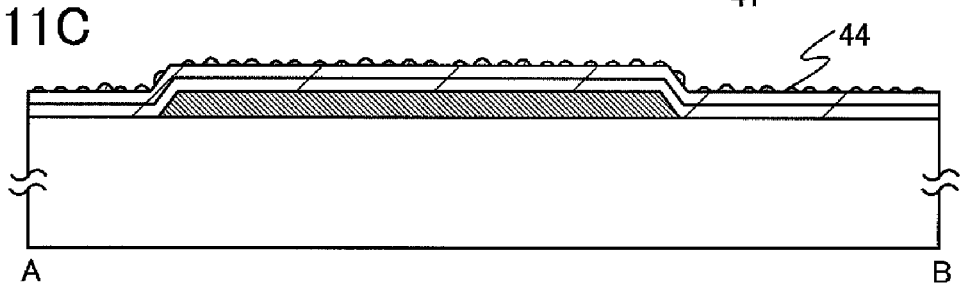

As a result, crystal grains 44 with high crystallinity can be formed as illustrated in FIG 11C.

Figure 11D:
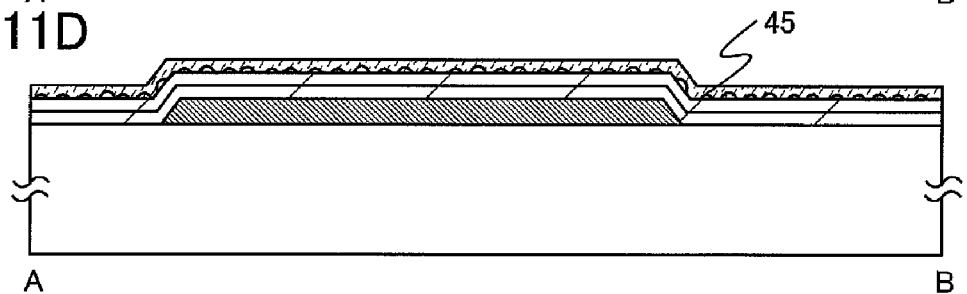
Figure 11E:
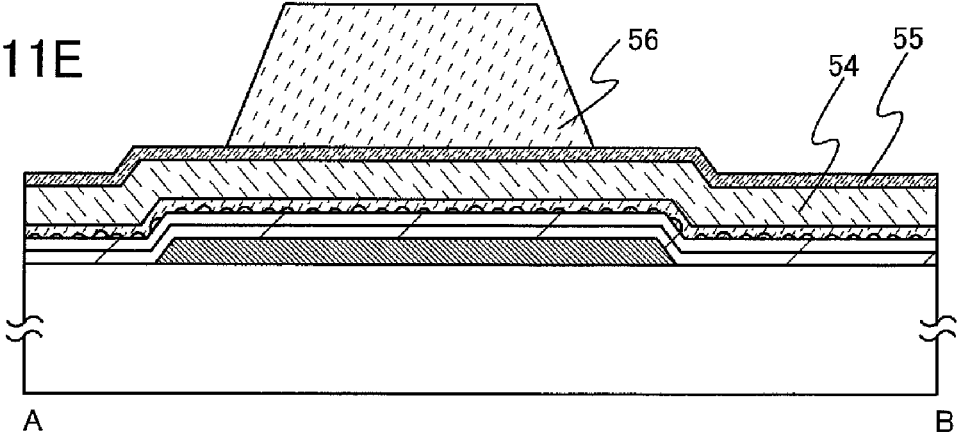

Next, hydrogen and a deposition gas including germanium are introduced into the reaction chamber, and high-frequency power is applied to form a semiconductor film 45 that mainly contains germanium, as illustrated in FIG. 11D. By growing crystals using the crystal grains 44 as crystal nuclei, a microcrystalline semiconductor film with high crystallinity can be formed as the semiconductor film 45 that mainly contains germanium. In this example, germane and hydrogen and/or a rare gas are mixed, and a microcrystalline germanium film is formed with glow discharge plasma.

Through the above process, the microcrystalline germanium film having high crystallinity at the interface with the gate insulating film and also inside the film can be formed.

Next, as illustrated in FIG. 1E, a buffer layer 54 and a semiconductor film 55 to which an impurity element imparting one conductivity type is added are formed in order over the semiconductor film 45 that mainly contains germanium.

Then, a resist mask 56 is formed over the semiconductor film 55 to which the impurity element imparting one conductivity type is added.

After that, through a similar process to Embodiment Mode 5, a thin film transistor as described in Embodiment Mode 3 can be manufactured.

This embodiment mode describes an inverted-staggered thin film transistor as a thin film transistor, but the present invention is not limited thereto and can be applied to a staggered thin film transistor, a top gate thin film transistor, and the like. Specifically, crystal grains that mainly contain silicon and a semiconductor film that mainly contains germanium are formed over an insulating film serving as a base film, and a gate insulating film and a gate electrode are formed over the semiconductor film that mainly contains germanium, so that a thin film transistor having the semiconductor film that mainly contains germanium and has improved crystallinity at the interface with the insulating film serving as the base film can be manufactured.

Embodiment Mode 8

Hereinafter, this embodiment mode describes a method for manufacturing the thin film transistor presented in Embodiment Mode 4.

Figure 12A:
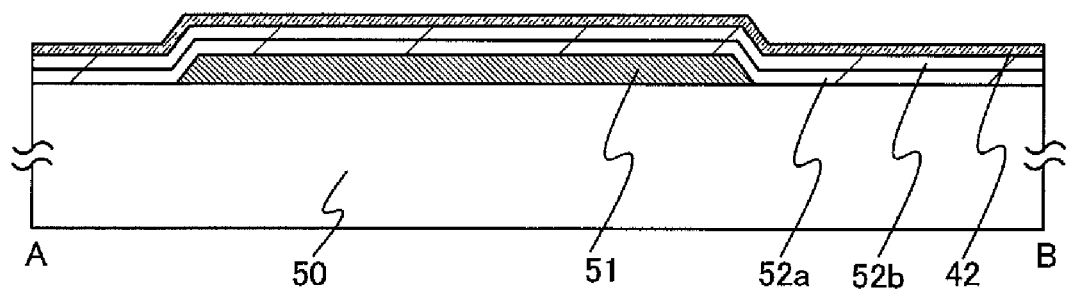
FIGS. 12A to 12C are cross-sectional views illustrating a method for manufacturing a thin film transistor of an embodiment mode of the present invention.

In a similar manner to Embodiment Mode 5, a gate electrode 51 is formed over a substrate 50, and gate insulating films 52a and 52b are formed over the gate electrode 51, as illustrated in FIG. 12A.

Subsequently, a microcrystalline semiconductor film 42 that mainly contains silicon is formed over the gate insulating film 52b. As the microcrystalline semiconductor film 42 that mainly contains silicon, a microcrystalline silicon film or a microcrystalline silicon germanium ($Si_xGe_{1-x}$, $0.5<x<1$) film is formed. When a microcrystalline silicon film or a microcrystalline silicon germanium film ($Si_xGe_{1-x}$, $0.5<x<1$) is formed as the microcrystalline semiconductor film 42 that mainly contains silicon, microcrystals are formed at a surface thereof although the microcrystalline semiconductor film 42 that mainly contains silicon has an amorphous component in a large part of an interface with the gate insulating film 52b; therefore, the surface of the microcrystalline semiconductor film 42 has high crystallinity.

Figure 12B:
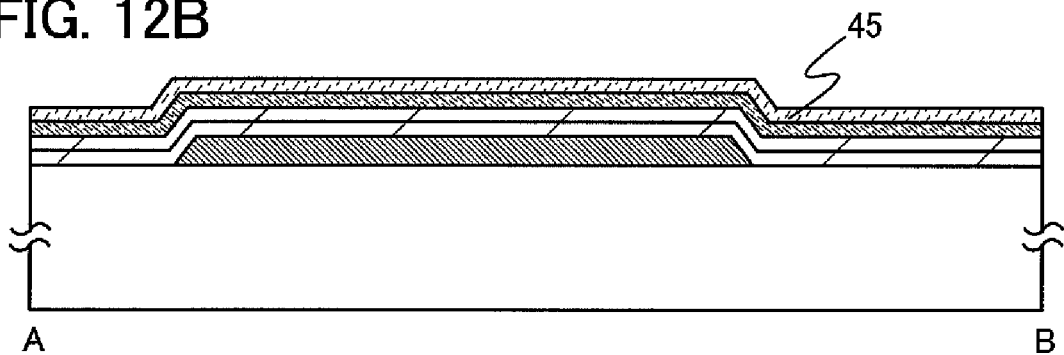

Next, hydrogen and a deposition gas including germanium are introduced into a reaction chamber, and high-frequency power is applied to form a semiconductor film 45 that mainly contains germanium, as illustrated in FIG. 12B. When the microcrystalline semiconductor film 42 that mainly contains silicon is formed, crystals grow utilizing the crystallinity of the surface of the microcrystalline semiconductor film 42 that mainly contains silicon, thereby forming the semiconductor film that mainly contains germanium; thus, the semiconductor film 45 that mainly contains germanium and has high crystallinity (a typical example is a microcrystalline semiconductor film that mainly contains germanium) is formed. In this example, germane and hydrogen and/or a rare gas are mixed, and a microcrystalline germanium film is formed with glow discharge plasma.

Through the above process, the microcrystalline germanium film having high crystallinity at the interface with the microcrystalline semiconductor film 42 that mainly contains silicon and also inside the film can be formed.

Figure 12C:
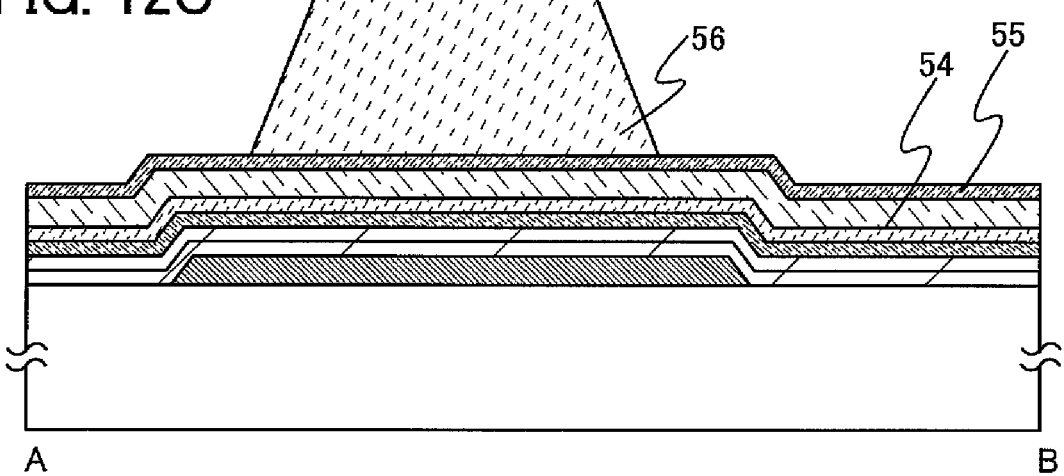

Next, as illustrated in FIG. 12C, a buffer layer 54 and a semiconductor film 55 to which an impurity element imparting one conductivity type is added are formed in order over the semiconductor film 45 that mainly contains germanium.

Then, a resist mask 56 is formed over the semiconductor film 55 to which the impurity element imparting one conductivity type is added.

After that, through a similar process to Embodiment Mode 5, a thin film transistor as described in Embodiment Mode 4 can be manufactured.

Embodiment Mode 9

Next, a method for manufacturing a thin film transistor which is different from those in the preceding embodiment modes is described with reference to FIGS. 13A and 13B, FIGS. 14A to 14D, FIGS. 15A to 15C, FIGS. 16A and 16B, FIGS. 17A and 17B, FIGS. 18A to 18C, and FIGS. 19A to 19C. This embodiment mode describes a process for manufacturing a thin film transistor in which the number of photomasks can be reduced compared to the preceding embodiment modes.

Figure 13A:
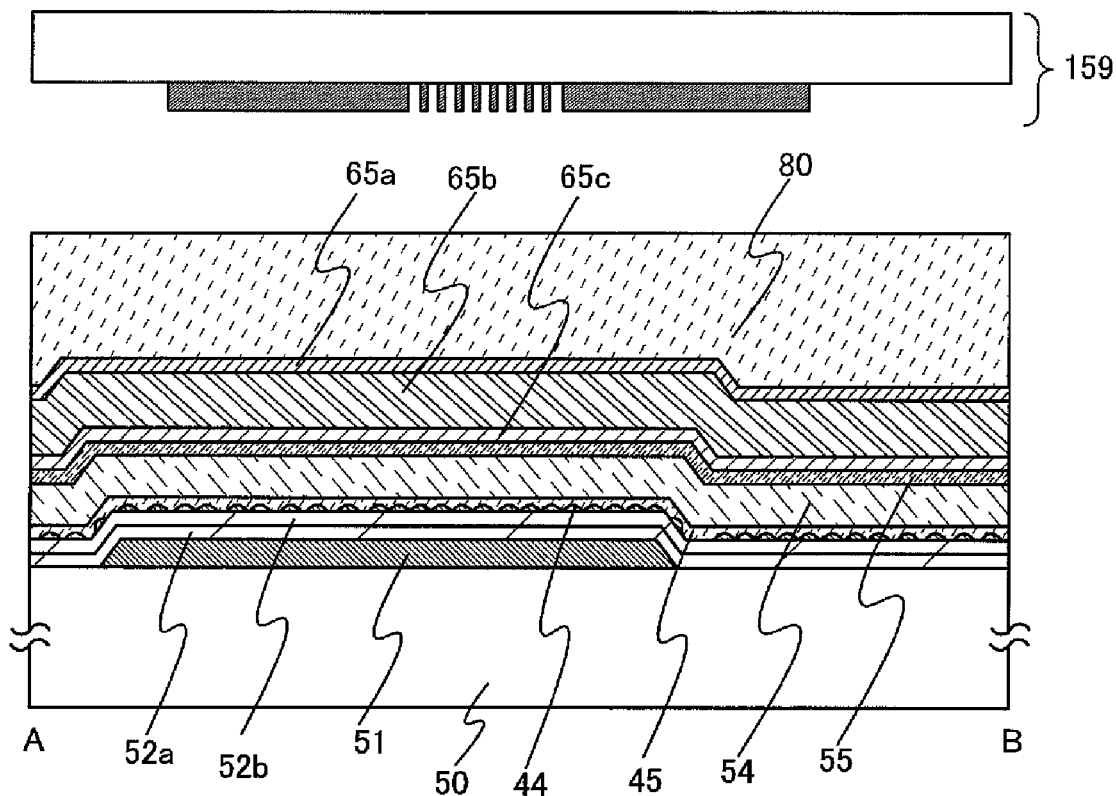
FIGS. 13A and 13B are cross-sectional views illustrating a method for manufacturing a thin film transistor of an embodiment mode of the present invention.

In a similar manner to Embodiment Mode 5, a conductive film is formed over a substrate 50; a resist is applied on the conductive film; and the conductive film is partly etched using a resist mask formed by a photolithography process using a first photomask, so that a gate electrode 51 is formed, as illustrated in FIG. 13A. Next, gate insulating films 52a and 52b are formed over the gate electrode 51. Then, crystal grains 44 that mainly contain silicon, a semiconductor film 45 that mainly contains germanium, a buffer layer 54, a semiconductor film 55 to which an impurity element imparting one conductivity type is added, and conductive films 65a to 65c are formed in order. Subsequently, a resist 80 is applied over the conductive film 65a. The semiconductor film 45 that mainly contains germanium can be formed by any of the methods presented in Embodiment Modes 5 to 8.

The resist 80 can be a positive type or a negative type. In this embodiment mode, a positive type resist is used as the resist 80.

Next, the resist 80 is irradiated with light using a multi-tone photomask 159 as a second photomask, to expose the resist 80 to light.

Here, light exposure using the multi-tone photomask 159 is described with reference to FIGS. 14A to 14D.

A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Thus, a multi-tone photomask can reduce the number of photomasks.

Figure 14A:
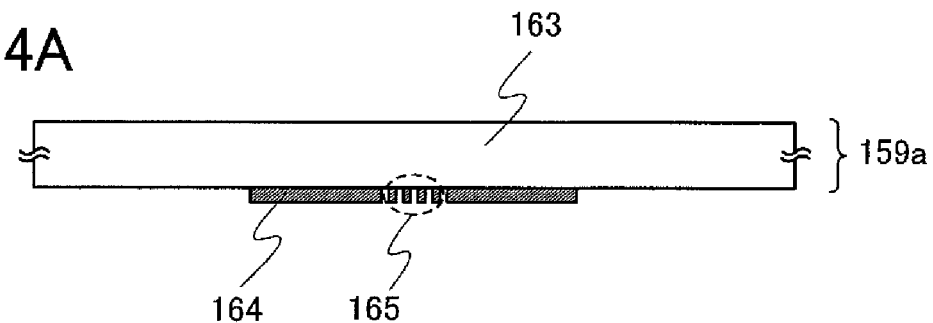
FIGS. 14A to 14D are drawings illustrating a multi-tone photomask applicable to the present invention.
Figure 14B:
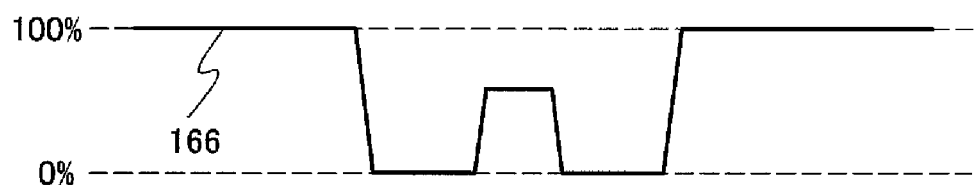
Figure 14C:
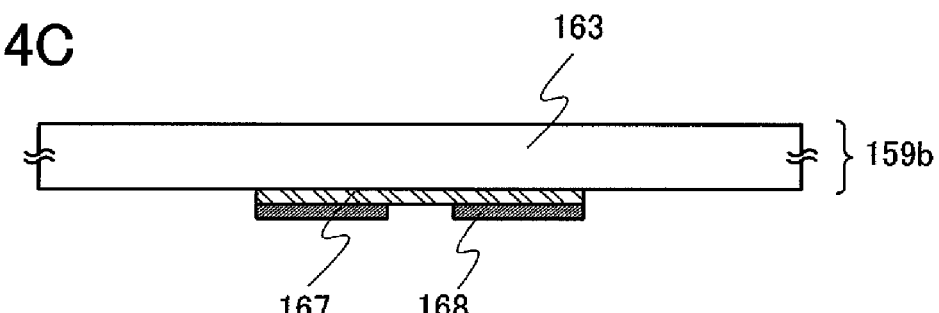

Typical examples of a multi-tone photomask include a gray-tone mask 159a as illustrated in FIG. 14A, and a half-tone mask 159b as illustrated in FIG. 14C.

As illustrated in FIG. 14A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are less than or equal to the resolution limit of light used for the exposure, whereby the light transmittance can be controlled. The diffraction grating 165 can be in a slit form, a dot form, or a mesh form with regular or irregular intervals.

For the light-transmitting substrate 163, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as illustrated in FIG. 14B. The light transmittance of the diffraction grating 165 can be controlled in a range of from 10% to 70%. The light transmittance of the diffraction grating 165 can be controlled with an interval or a pitch of slits, dots, or meshes of the diffraction grating.

As illustrated in FIG. 14C, the half-tone mask 159b includes a light-transmitting substrate 163 provided with a semi-light-transmitting portion 167 and a light-blocking portion 168. MoSiN, MoSi, MoSiO, MoSiON, CrSi, or the like can be used for the semi-light-transmitting portion 167. The light-blocking portion 168 can be formed using a light-blocking material such as chromium or chromium oxide, which absorbs light.

Figure 14D:
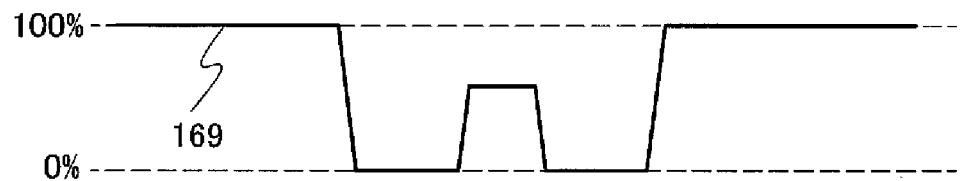

When the half-tone mask 159b is irradiated with light for exposure, a light transmittance 169 of the light-blocking portion 168 is 0% and that of a region where neither the light-blocking portion 168 nor the semi-light-transmitting portion 167 is provided is 100%, as illustrated in FIG. 14D. The light transmittance of the semi-light-transmitting portion 167 can be controlled in a range of from 10% to 70%. The light transmittance of the semi-light-transmitting portion 167 can be controlled with the material of the semi-light-transmitting portion 167.

Figure 13B:
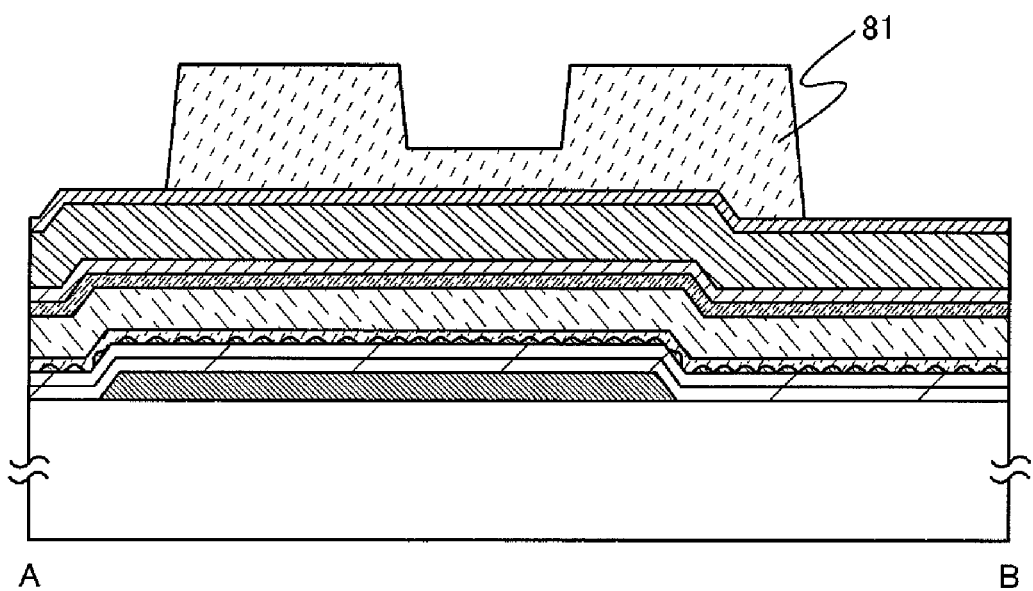

After the light exposure using the multi-tone photomask is performed, development is carried out, whereby a resist mask 81 having regions with different thicknesses can be formed, as illustrated in FIG. 13B.

Figure 15A:
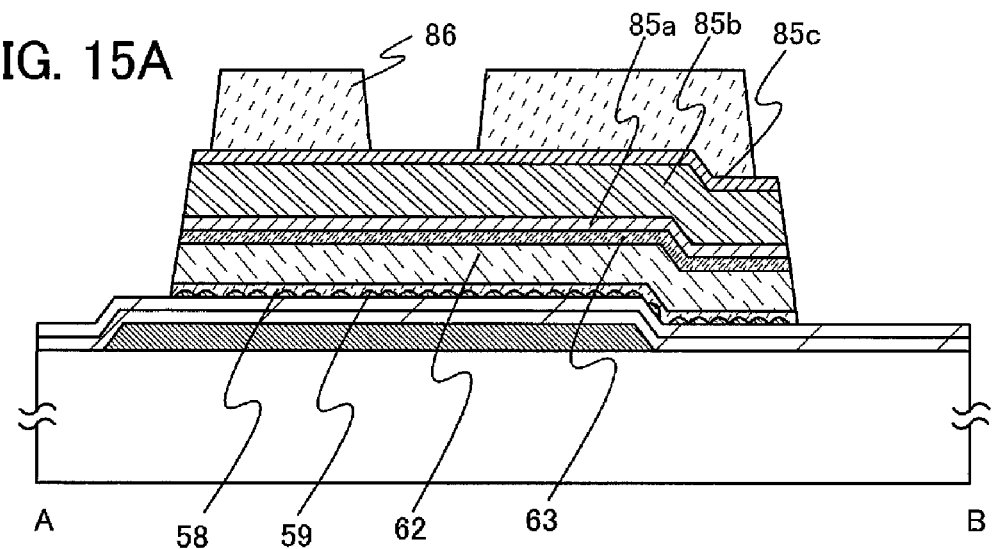
FIGS. 15A to 15C are cross-sectional views illustrating a method for manufacturing a display device of an embodiment mode of the present invention.

Next, with the resist mask 81, the crystal grains 44 that mainly contain silicon, the semiconductor film 45 that mainly contains germanium, the buffer layer 54, the semiconductor film 55 to which the impurity element imparting one conductivity type is added, and the conductive films 65a to 65c are etched to be separated. As a result, crystal grains 59 that mainly contain silicon, a semiconductor film 58 that mainly contains germanium, a buffer layer 62, a semiconductor film 63 to which the impurity element imparting one conductivity type is added, and conductive films 85a to 85c can be formed, as illustrated in FIG. 15A. FIG. 15A is a cross-sectional view taken along a line A-B in FIG. 19A (although the resist mask 81 is not illustrated in FIG. 19A).

Next, the resist mask 81 undergoes ashing. As a result, the area and the thickness of the resist mask are reduced. At this time, the resist mask in a region with a small thickness (a region overlapping with a part of the gate electrode 51) is removed to form a separated resist mask 86, as illustrated in FIG. 15A.

Figure 15B:
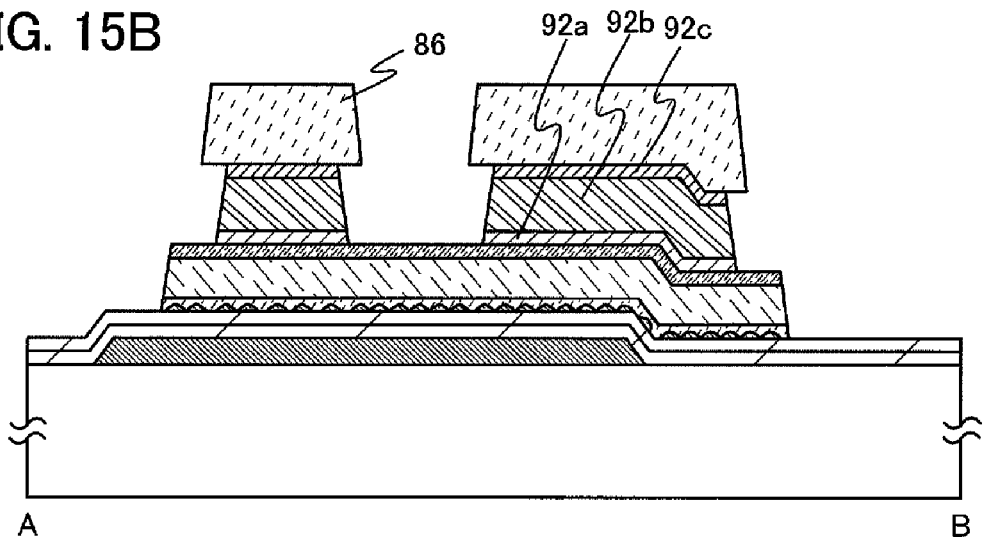

Next, the conductive films 85a to 85c are etched to be separated using the resist mask 86. As a result, pairs of wirings 92a to 92c can be formed, as illustrated in FIG. 15B. When the conductive films 85a to 85c are wet-etched using the resist mask 86, the conductive films 85a to 85c are etched isotropically. Thus, the wirings 92a to 92c with smaller areas than that of the resist mask 86 can be formed.

Next, the semiconductor film 63 to which the impurity element imparting one conductivity type is added is etched using the resist mask 86 to form a pair of source and drain regions 88. In the etching process, a part of the buffer layer 62 is also etched. The buffer layer which is etched partly is referred to as a buffer layer 87. The buffer layer 87 has a recessed portion. The source and drain regions and the recessed portion of the buffer layer can be formed in the same process. Here, the buffer layer 62 is partly etched with the use of the resist mask 86 having a smaller area than that of the resist mask 81, so that an end portion of the buffer layer 87 is located outside those of the source and drain regions 88. End portions of the wirings 92a to 92c are not aligned with those of the source and drain regions 88, and the end portions of the source and drain regions 88 are located outside those of the wirings 92a to 92c. After that, the resist mask 86 is removed.

Next, dry etching may be performed under such a condition that the exposed buffer layer is not damaged and an etching rate with respect to the buffer layer is low. Through this dry etching step, an etching residue on the buffer layer between the source region and the drain region, a residue of the resist mask, and a contamination source in an apparatus used for removal of the resist mask can be removed, whereby the source region and the drain region can be insulated surely. As a result, leakage current of the thin film transistor can be reduced, so that the thin film transistor with small off current and high withstand voltage can be manufactured. A gas including chlorine, a gas including fluorine, or the like may be used for an etching gas, for example.

Figure 15C:
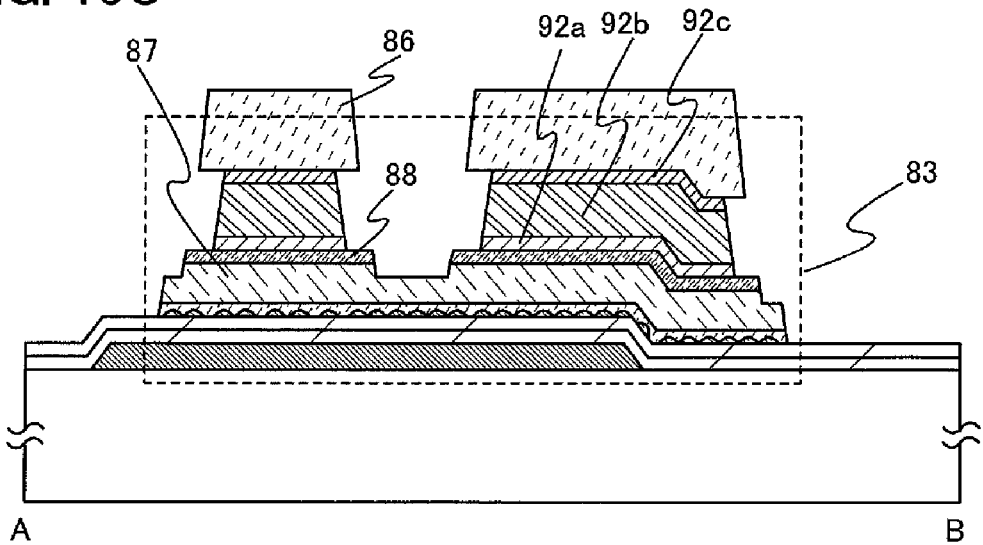

As illustrated in FIG. 15C, the end portions of the wirings 92a to 92c are not aligned with those of the source and drain regions 88, whereby the distance between the end portions of the wirings 92a to 92c can be long; thus, leakage current or short circuit between the wirings can be prevented. Accordingly, an inverted-staggered thin film transistor with high reliability can be manufactured.

Through the above process, a channel-etched thin film transistor 83 can be formed. The thin film transistor can be formed with the use of the two photomasks.

Figure 16A:
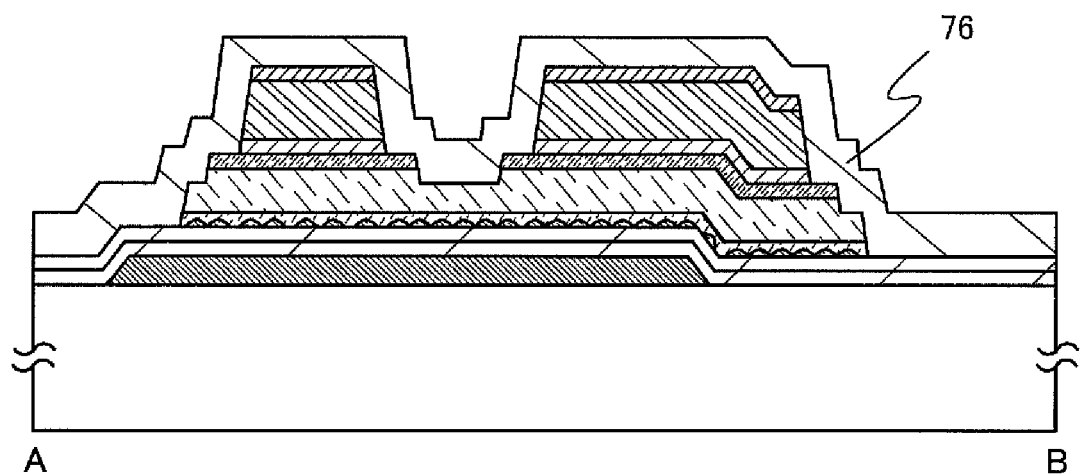
FIGS. 16A and 16B are cross-sectional views illustrating a method for manufacturing a display device of an embodiment mode of the present invention.

Next as illustrated in FIG. 16A, a protective insulating film 76 is formed over the wirings 92a to 92c, the source and drain regions 88, the buffer layer 87, the semiconductor film 58 that mainly contains germanium, and the gate insulating film 52b.

Figure 16B:
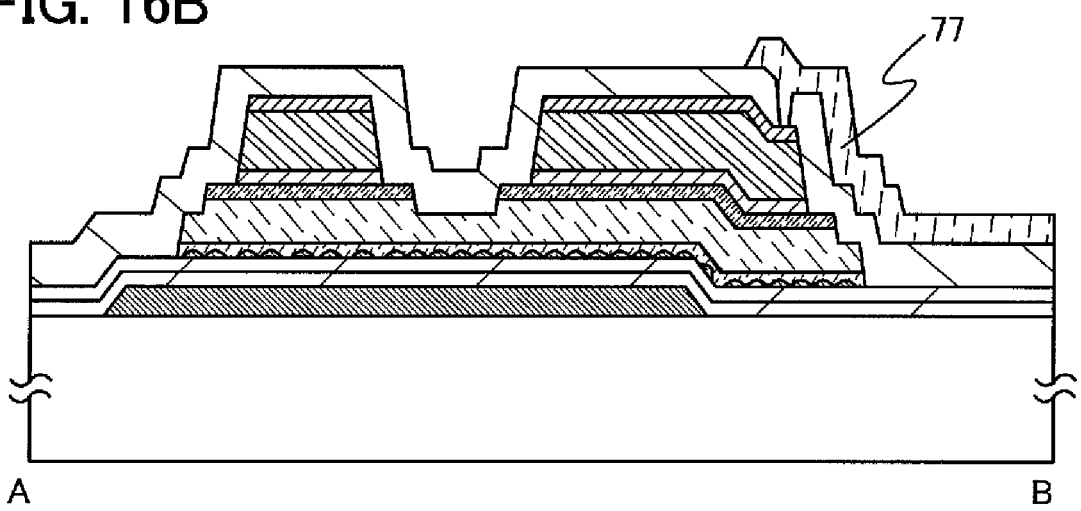

Next, a contact hole is formed in the protective insulating film 76 by partly etching the protective insulating film 76 using a resist mask formed using a third photomask. Then, a pixel electrode 77 that is in contact with the wiring 92c in the contact hole is formed. In this example, as the pixel electrode 77, an ITO film is formed by a sputtering method, and then a resist is applied over the ITO film. Subsequently, the resist is exposed to light and developed using a fourth photomask, thereby forming the resist mask. Then, the ITO film is etched using the resist mask to form the pixel electrode 77. FIG. 16B is a cross-sectional view taken along a line A-B in FIG. 19C.

In the above manner, a thin film transistor and an element substrate which has the thin film transistor and can be used for a display device can be formed.

Figure 19A:
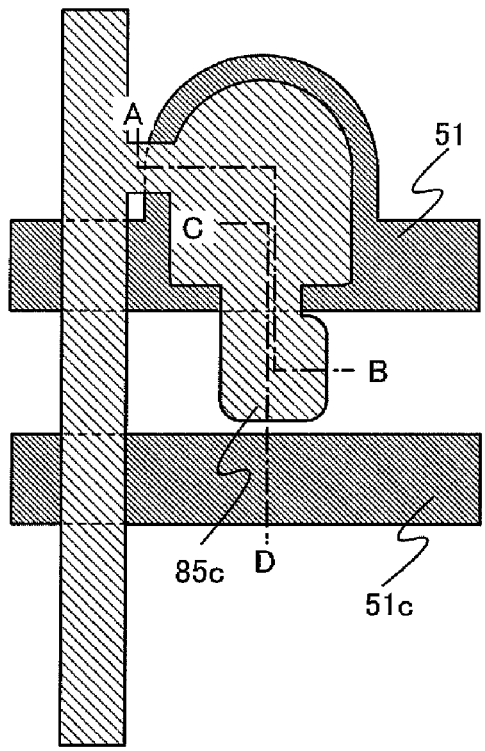
FIGS. 19A to 19C are top views illustrating a method for manufacturing a display device of an embodiment mode of the present invention.
Figure 19B:
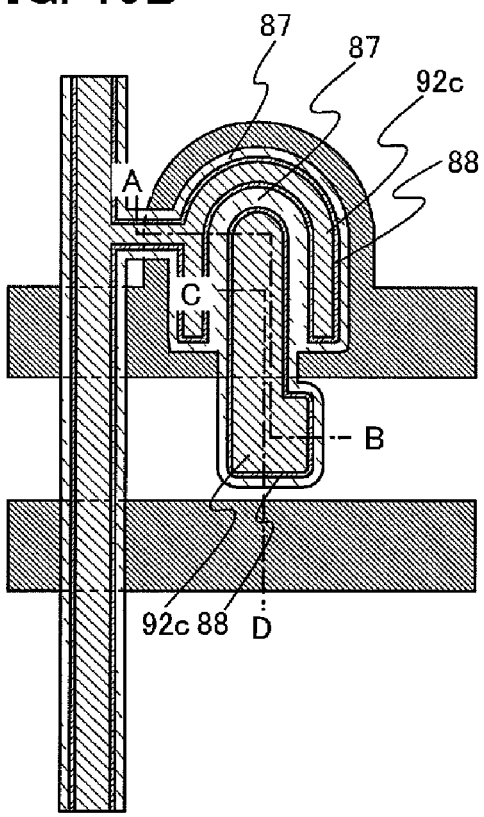
Figure 19C:
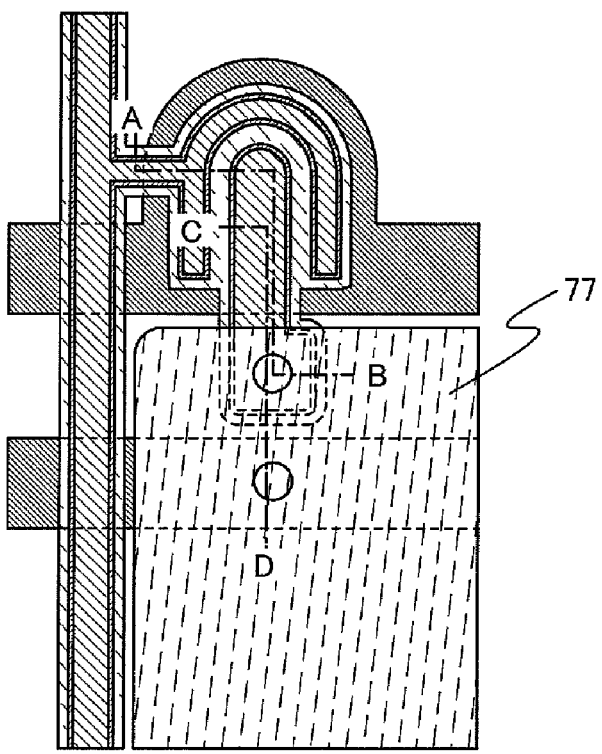

Next, a process in which a contact hole and a capacitor element can be formed with one photomask is described below. Cross-sectional views taken along lines C-D in FIGS. 19A to 19C are used here.

Figure 17A:
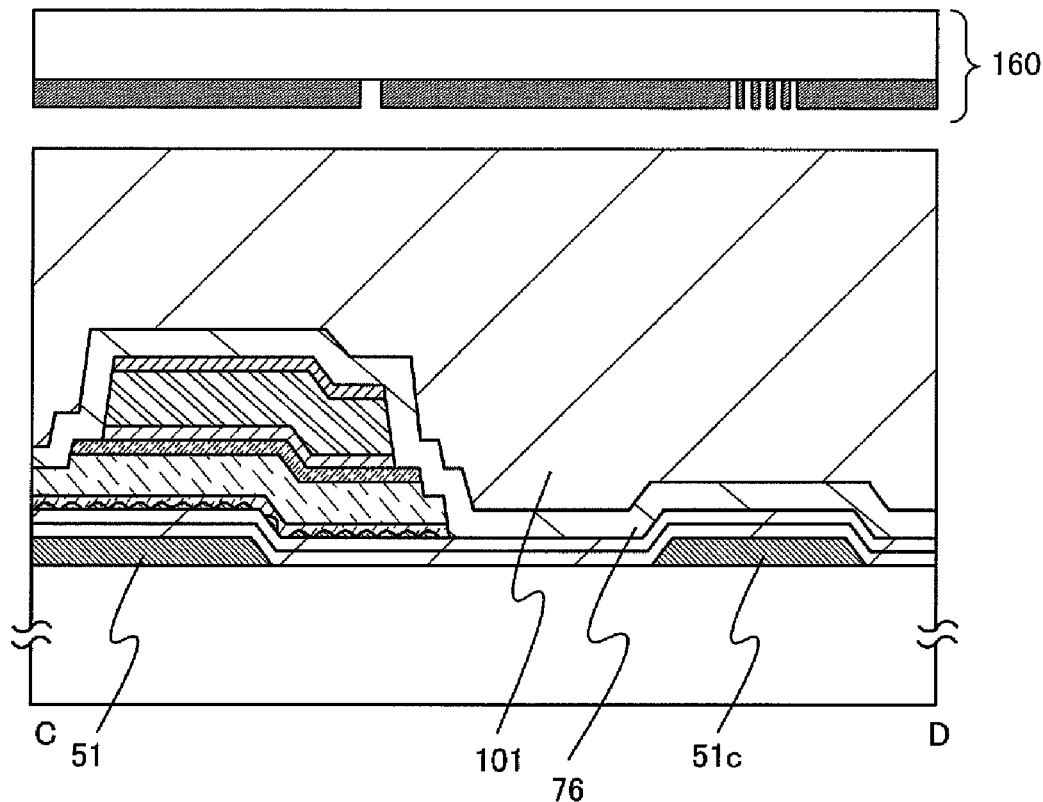
FIGS. 17A and 17B are cross-sectional views illustrating a method for manufacturing a display device of an embodiment mode of the present invention.
Figure 17B:
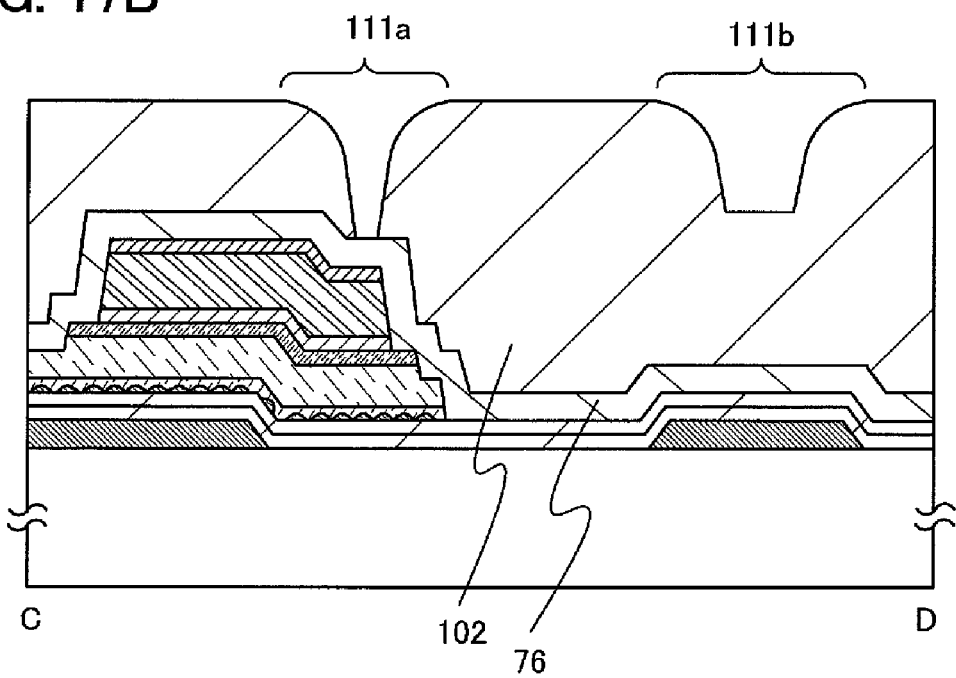

After the step illustrated in FIG. 16A, an insulating film 101 is formed over the protective insulating film 76, as illustrated in FIG. 17A. The insulating film 101 is formed using a photosensitive organic resin here. Then, the insulating film 101 is exposed to light using a multi-tone photomask 160 and developed, whereby an insulating film 102 having a recessed portion 111a that exposes the protective insulating film 76 covering the wirings of the thin film transistor and a recessed portion 111b over a capacitor wiring 51c is formed, as illustrated in FIG. 17B. Here, by use of the multi-tone photomask 160, the insulating film 101 can be exposed to light by 100% over the wirings of the thin film transistor, and the insulating film 101 can be exposed to light by from 10% to 70% over the capacitor wiring 51c.

Figure 18A:
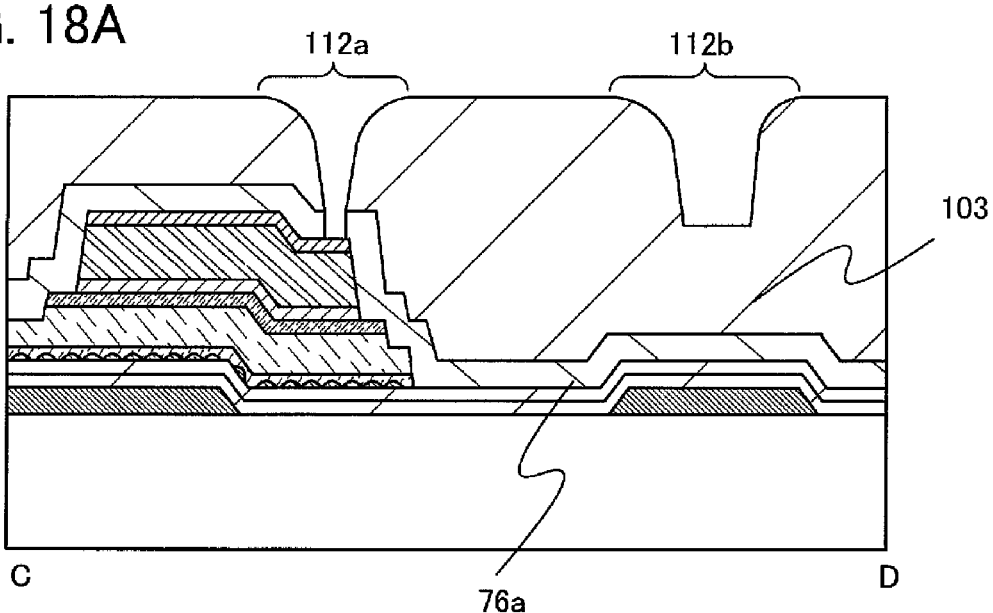
FIGS. 18A to 18C are cross-sectional views illustrating a method for manufacturing a display device of an embodiment mode of the present invention.
Figure 18B:
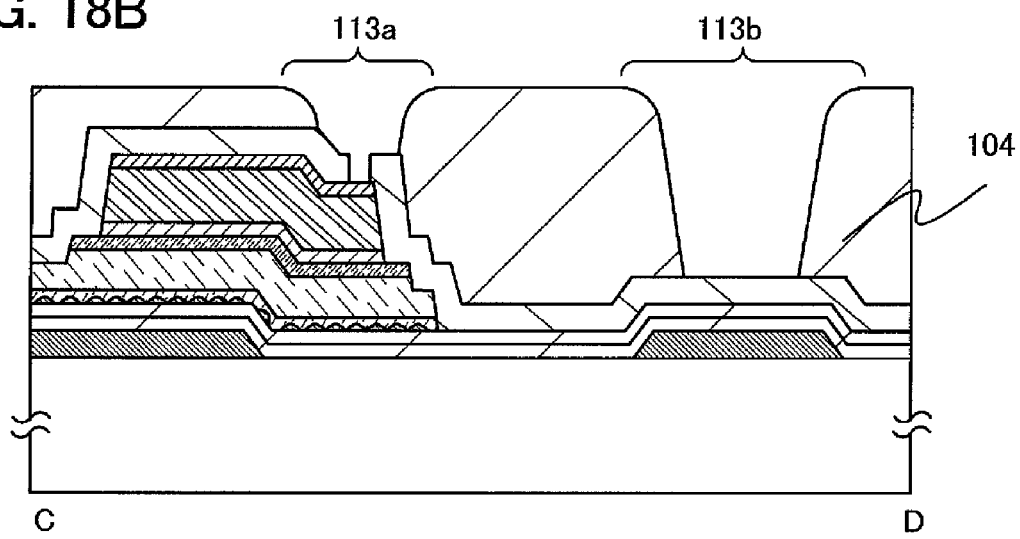
Figure 18C:
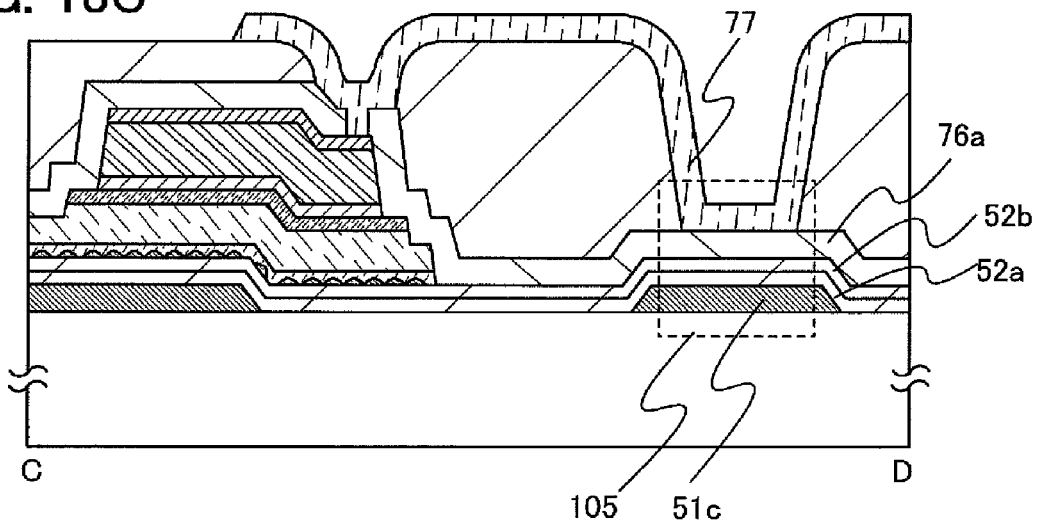

Next, the insulating film 102 having the recessed portions is etched (etch back), and then a part of the protective insulating film 76 is etched, whereby an insulating film 103 having a contact hole 112a that exposes the wiring and a recessed portion 112b over the capacitor wiring 51c, and an insulating film 76a are formed, as illustrated in FIG. 18A.

Next, ashing is performed on the insulating film 103 to widen the areas of the contact hole 112a and the recessed portion 112b, so that an insulating film 104 having a contact hole 113a and a recessed portion 113b is formed. Since the protective insulating film 76a is not formed of a photosensitive organic resin but formed of an inorganic insulating film, it is not processed by ashing. Therefore, the contact hole 113a, which has a top shape of double circles when seen from above, is formed over the wiring.

After that, a pixel electrode 77 is formed and a capacitor element 105 including the capacitor wiring 51c, the gate insulating films 52a and 52b, the protective insulating film 76a, and the pixel electrode 77 can be formed.

Through the above process, the contact hole connecting the pixel electrode and the wiring, and the capacitor element can be formed with the use of only one multi-tone photomask.

Embodiment Mode 10

This embodiment mode describes a structure of a thin film transistor applicable to Embodiment Modes 1 to 9.

Figure 20:
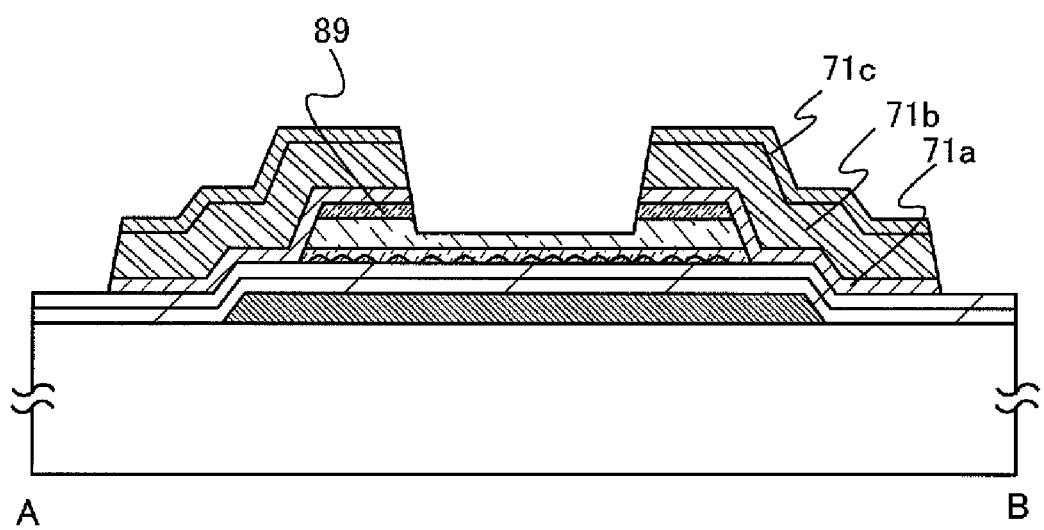
FIG. 20 is a cross-sectional view illustrating a method for manufacturing a display device of an embodiment mode of the present invention.

After forming the wirings 71a to 71c illustrated in FIG. 6C of Embodiment Mode 5 or the wirings 92a to 92c illustrated in FIG. 15B of Embodiment Mode 9, the resist mask 66 or 86 is removed, and the semiconductor film 63 to which the impurity element imparting one conductivity type is added may be etched using the wirings 71a to 71c or 92a to 92c as a mask. As a result, a thin film transistor can be formed in which end portions of the wirings 71a to 71c or the wirings 92a to 92c are aligned with those of the pair of semiconductor films 72 to which the impurity element imparting one conductivity type is added and which serves as source and drain regions, or of the source and drain regions 88. In this example, after removing the resist mask 66 illustrated in FIG. 6C, the semiconductor film 63 to which the impurity element imparting one conductivity type is added is etched using the wirings 71a to 71c as a mask, so that a thin film transistor in which end portions of source and drain regions 89 are aligned with those of the wirings 71a to 71c is formed, as illustrated in FIG. 20.

Although Embodiment Modes 1 to 9 describe channel-etched thin film transistors, a channel protective thin film transistor can also be formed as the thin film transistor presented in any of Embodiment Modes 1 to 9. In this example, description is made on Embodiment Mode 5.

Specifically, as illustrated in FIG. 5A, a gate electrode 51 is formed over a substrate 50, and gate insulating films 52a and 52b are formed over the gate electrode 51. Then, through the steps illustrated in FIGS. 5B to 5D, crystal grains 44 that mainly contain silicon and a semiconductor film 45 that mainly contains germanium are formed.

Figure 21:
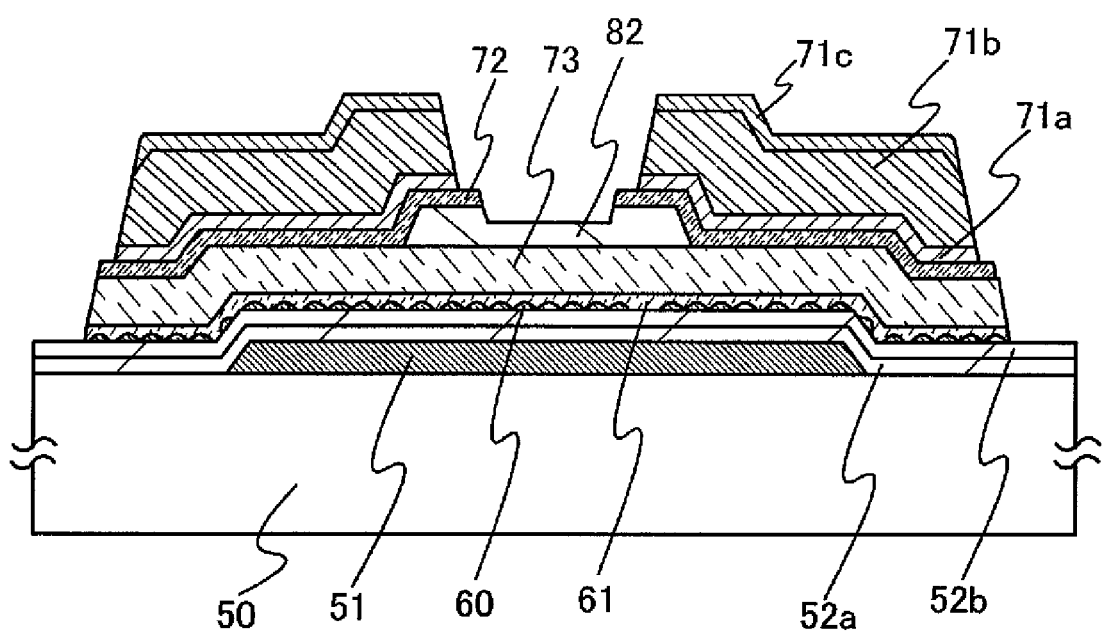
FIG. 21 is a cross-sectional view illustrating a method for manufacturing a display device of an embodiment mode of the present invention.

As illustrated in FIG. 5E, a buffer layer 54 is formed over the semiconductor film 45 that mainly contains germanium. Then, a channel protective film is formed in a region which is over the buffer layer 54 and overlaps with the gate electrode 51. The channel protective film can be formed by forming a silicon nitride film, a silicon oxide film, a silicon nitride oxide film, or a silicon oxynitride film and selectively etching the film through a photolithography process. Alternatively, the channel protective film can be formed by discharging a composition including polyimide, acrylic, or siloxane and baking it. Next, a semiconductor film to which an impurity element imparting one conductivity type is added and conductive films are formed in this order. Then, the conductive films, the semiconductor film to which the impurity element imparting one conductivity type is added, the buffer layer, and the semiconductor film that mainly contains germanium are etched to be separated using a resist mask formed through a photolithography process. Consequently, crystal grains 60 that mainly contain silicon, a semiconductor film 61 that mainly contains germanium, a buffer layer 73, a pair of semiconductor films 72 to which the impurity element imparting one conductivity type is added and which serve as source and drain regions, and wirings 71a to 71c that serve as source and drain electrodes are formed as illustrated in FIG. 21. Further, a channel protective film 82 having a recessed portion in a part thereof is formed.

Through the above process, a channel protective thin film transistor can be formed.

Figure 22:
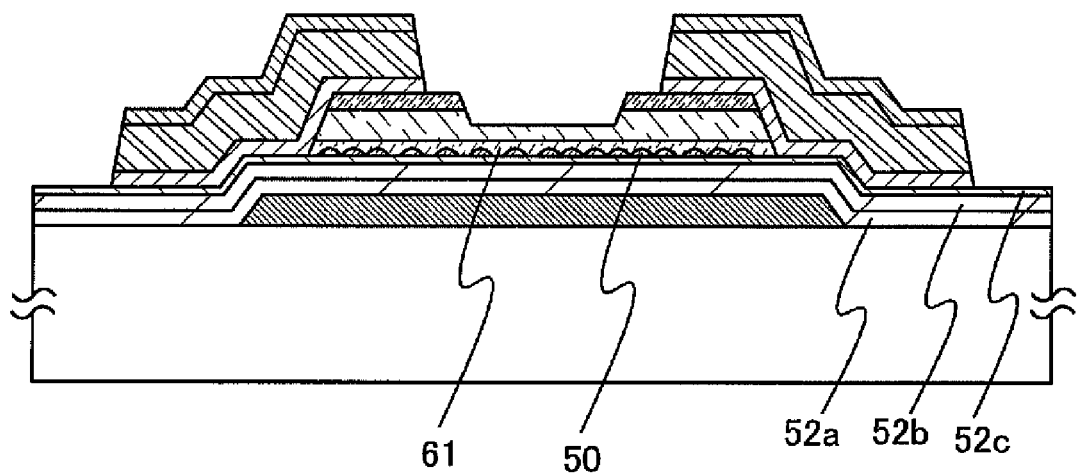
FIG. 22 is a cross-sectional view illustrating a method for manufacturing a display device of an embodiment mode of the present invention.

Instead of the gate insulating films 52a and 52b of the thin film transistors described in Embodiment Modes 1 to 9, three gate insulating films 52a, 52b, and 52c may be formed as illustrated in FIG. 22. As the gate insulating film 52c, which is a third layer, a silicon nitride film or a silicon nitride oxide film with a thickness of 1 nm to 5 nm approximately can be formed.

When a silicon nitride film or a silicon nitride oxide film with a thickness of from 1 nm to 5 nm approximately is formed as the gate insulating film 52c, which is the third layer, a plasma CVD method can be employed. Further, it is also possible to have the gate insulating film 52b undergo nitridation treatment with high-density plasma to form a silicon nitride layer on a surface of the gate insulating film 52b. By high-density plasma nitridation, a silicon nitride layer that includes nitrogen at a higher concentration can be obtained. The high-density plasma is produced by use of high-frequency microwaves, for example, microwaves with a frequency of 2.45 GHz. With high-density plasma, which has the characteristic of having a low electron temperature, a layer can be formed with less plasma damage and fewer defects compared to a layer formed by conventional plasma treatment because the kinetic energy of an active species is low. In addition, with the use of high-density plasma, carrier mobility can be increased because the level of roughness on the surface of the gate insulating film 52b can be reduced.

Embodiment Mode 11

In this embodiment mode, a liquid crystal display device including the thin film transistor described in any of Embodiment Modes 1 to 10 is described below as one mode of a display device. Here, a vertical alignment (VA) mode liquid crystal display device is described with reference to FIGS. 23 to 25. The VA mode liquid crystal display device employs a method of controlling alignment of liquid crystal molecules of a liquid crystal panel. In the VA mode liquid crystal display device, liquid crystal molecules are aligned in a vertical direction with respect to a panel surface when a voltage is not applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 23:
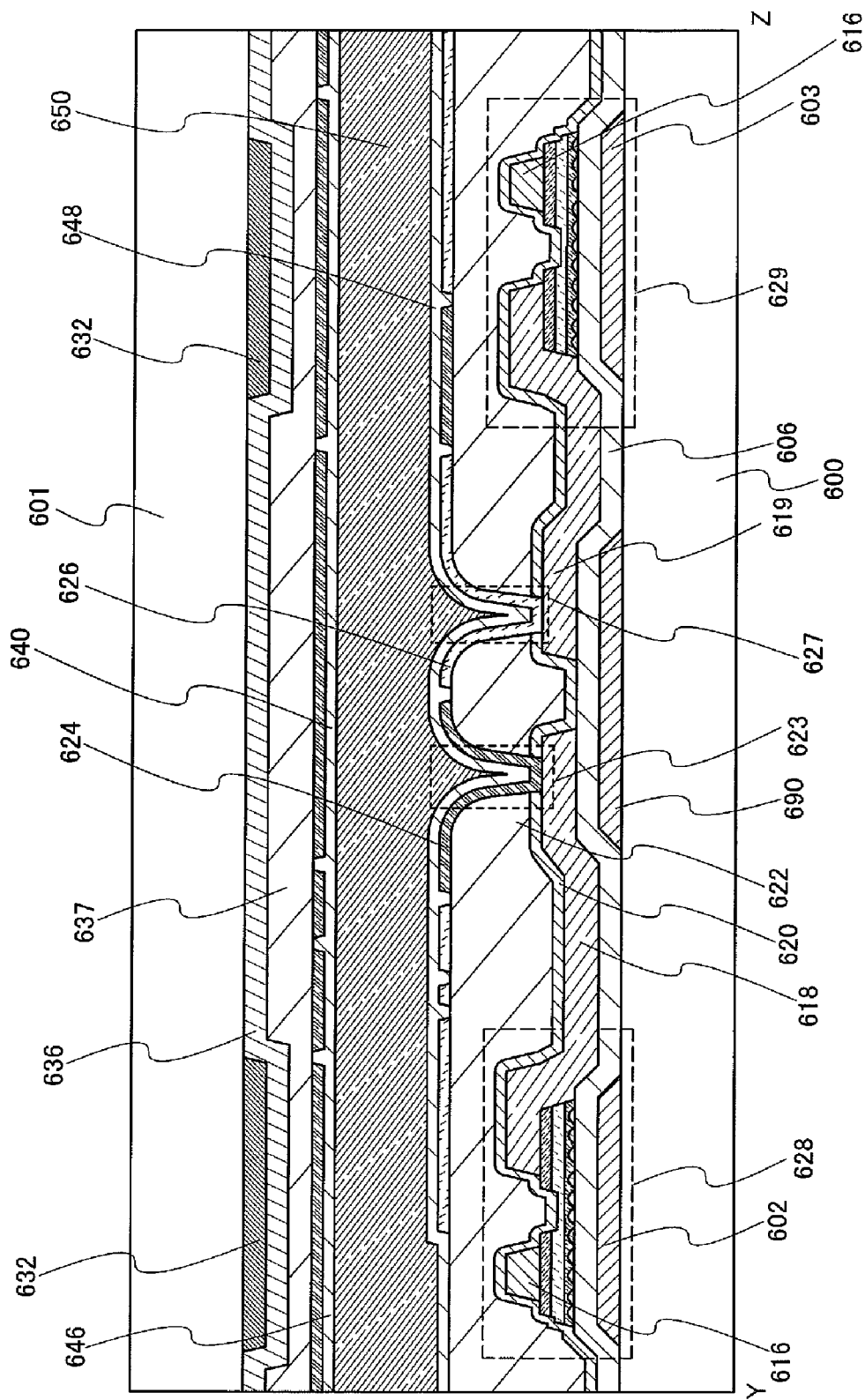
FIG. 23 is a cross-sectional view illustrating a display device of an embodiment mode of the present invention.
Figure 24:
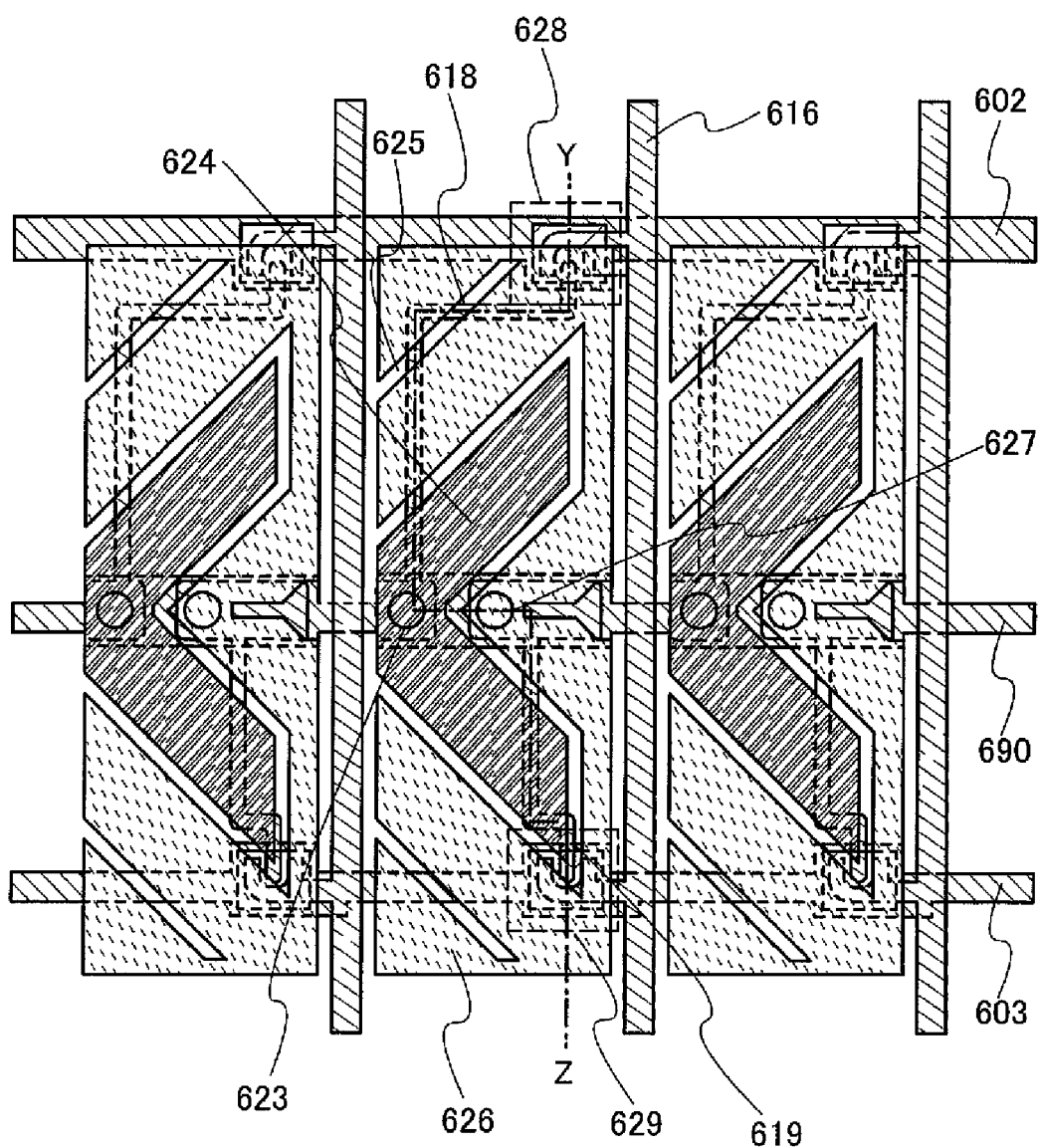
FIG. 24 is a top view illustrating a display device of an embodiment mode of the present invention.

FIGS. 23 and 24 illustrate a pixel structure of a VA mode liquid crystal panel. FIG. 24 is a plan view of a substrate 600. FIG. 23 illustrates a cross-sectional structure taken along a line Y-Z in FIG. 24. The following description is made with reference to both the drawings.

In this pixel structure, a plurality of pixel electrodes 624 and 626 are included in one pixel, and thin film transistors 628 and 629 are connected to the pixel electrodes 624 and 626, respectively, with a planarizing film 622 interposed therebetween. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 serving as a data line is used in common for the thin film transistors 628 and 629. The thin film transistors 628 and 629 can be manufactured using any of the thin film transistors described in the preceding embodiment modes.

The pixel electrodes 624 and 626 have different shapes and are separated by slits 625. The pixel electrode 626 surrounds the pixel electrode 624, which has a V-shape. The thin film transistors 628 and 629 make the timing of applying voltages to the pixel electrodes 624 and 626 different from each other, thereby controlling alignment of liquid crystals. By supplying different gate signals to the gate wirings 602 and 603, operation timing of the thin film transistors 628 and 629 can be different. Further, an alignment film 648 is formed over the pixel electrodes 624 and 626.

Figure 25:
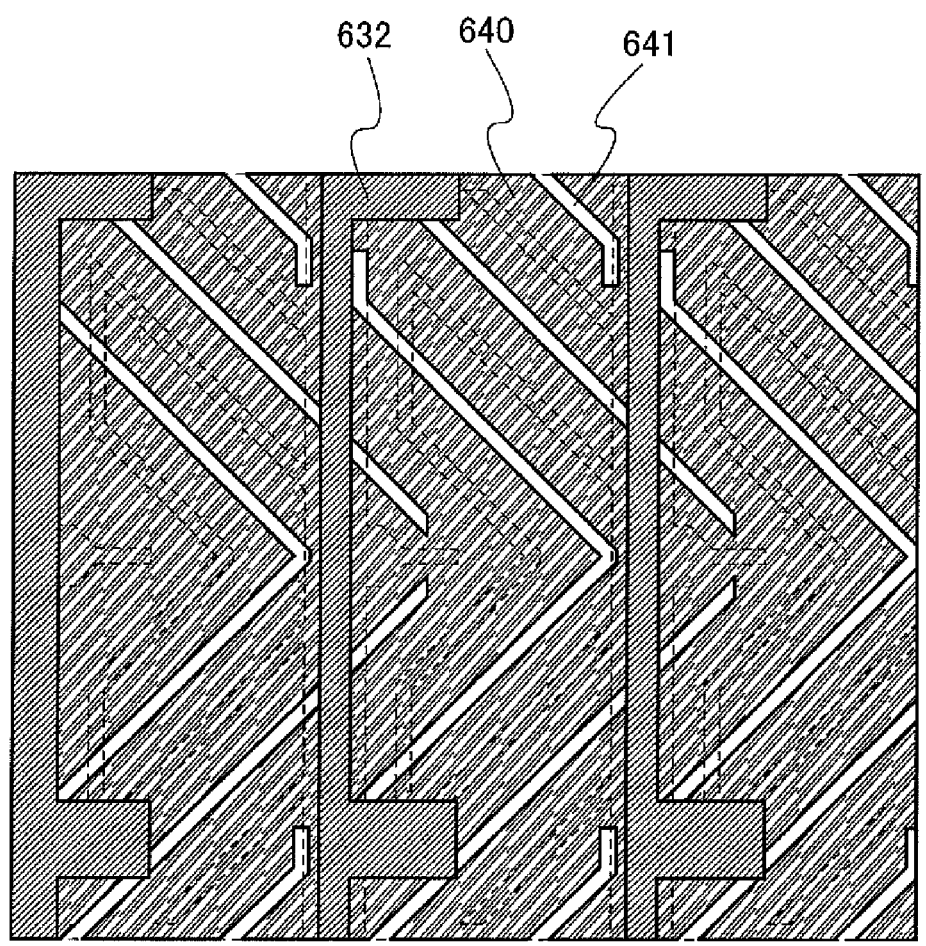
FIG. 25 is a top view illustrating a display device of an embodiment mode of the present invention.

A counter substrate 601 is provided with a light-blocking film 632, a coloring film 636, and a counter electrode 640. In addition, a planarizing film 637 is formed between the coloring film 636 and the counter electrode 640, thereby preventing alignment disorder of liquid crystals. Moreover, an alignment film 646 is formed on the counter electrode 640. FIG. 25 illustrates a structure of the counter substrate side. The counter electrode 640 is shared by plural pixels, and slits 641 are formed in the counter electrode 640. The slits 641 and the slits 625 on the pixel electrodes 624 and 626 side are disposed in an alternate form, thereby effectively generating an oblique electric field to control the alignment of the liquid crystals. Accordingly, the direction in which the liquid crystals are aligned can be different depending on the position, and thus a viewing angle is increased.

In this specification, a substrate, a coloring film, a light-blocking film, and a planarizing film form a color filter. Either the light-blocking film or the planarizing film, or both of them are not necessarily formed over the substrate.

The coloring film has a function of preferentially transmitting light of a predetermined wavelength range among wavelength ranges of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for a color filter. However, the combination of the coloring films is not limited to the above.

The pixel electrode 624, a liquid crystal layer 650, and the counter electrode 640 overlap with one another, so that a first liquid crystal element is formed. Further, the pixel electrode 626, the liquid crystal layer 650, and the counter electrode 640 overlap with each other, so that a second liquid crystal element is formed. Furthermore, a multi-domain structure is made in which the first liquid crystal element and the second liquid crystal element are provided for one pixel.

Although a vertical alignment (VA) mode liquid crystal display device is described here as a liquid crystal display device, the element substrate presented in any of the preceding embodiment modes can also be applied to an FFS mode liquid crystal display device, an IPS mode liquid crystal display device, a TN mode liquid crystal display device, and the like.

The liquid crystal display device can be manufactured through the above process. Since an inverted-staggered thin film transistor with small off current and excellent electric characteristics is used for the liquid crystal display device of this embodiment mode, the liquid crystal display device has a high contrast and high visibility.

Embodiment Mode 12

Figure 26A:
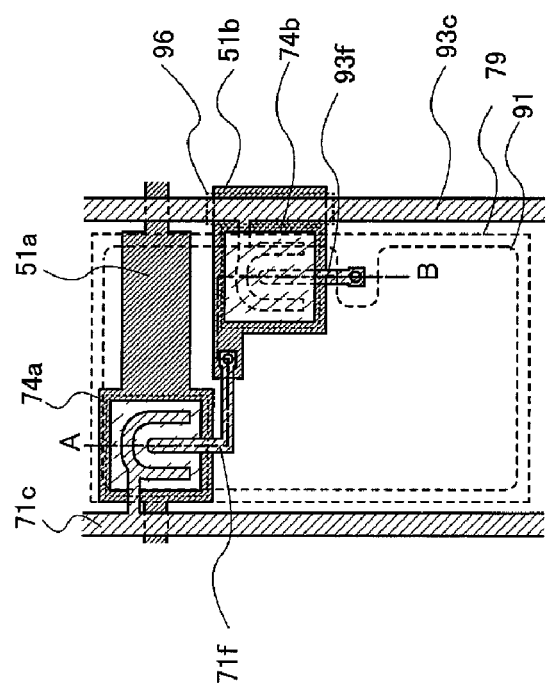
FIGS. 26A and 26B are a top view and a cross-sectional view, respectively, illustrating a display device of an embodiment mode of the present invention.
Figure 26B:
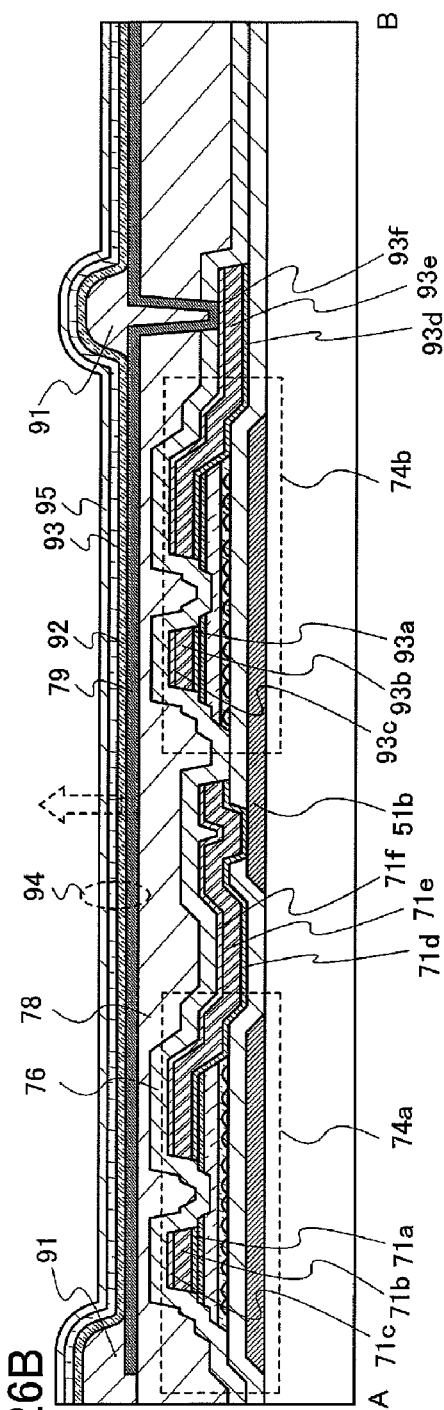

In this embodiment mode, a light-emitting display device including the thin film transistor described in any of Embodiment Modes 1 to 10 is described below as one mode of a display device; a structure of a pixel included in the light-emitting display device is described here. FIG. 26A illustrates one mode of a top view of the pixel. FIG. 26B illustrates one mode of a cross-sectional structure of the pixel taken along a line A-B in FIG. 26A.

A display device having a light-emitting element utilizing electroluminescence is presented as a light-emitting device. Light-emitting elements utilizing electroluminescence are classified into two types according to whether the light-emitting material is an organic compound or an inorganic compound. In general, the former is referred to as an organic EL element and the latter is referred to as an inorganic EL element. In this embodiment mode, the process for manufacturing the thin film transistor in accordance with any of the preceding embodiment modes can be used.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. These carriers (electrons and holes) are recombined, so that the light-emitting organic compound is placed in an excited state. The light-emitting organic compound emits light in returning to a ground state from the excited state. Because of such mechanism, such a light-emitting element is called a light-emitting element of a current excitation type.

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission, in which inner-shell electron transition of a metal ion is utilized. Here, an organic EL element is described as an example of a light-emitting element. Further, although channel-etched thin film transistors are presented as a switching thin film transistor for controlling input of a signal to a first electrode and as a driving thin film transistor for controlling driving of a light-emitting element, a channel protective thin film transistor can also be used as appropriate.

In FIGS. 26A and 26B, a first thin film transistor 74*a* is a switching thin film transistor for controlling input of a signal to the first electrode, and a second thin film transistor 74*b* is a driving thin film transistor for controlling current or voltage supply to a light-emitting element 94.

A gate electrode of the first thin film transistor 74a is connected to a wiring 51a serving as a scanning line. One of a source and a drain of the first thin film transistor 74a is connected to wirings 71a to 71c serving as a signal line. Wirings 71d to 71f connected to the other of the source and the drain of the first thin film transistor 74a is connected to a gate electrode 51b of the second thin film transistor 74b. One of a source and a drain of the second thin film transistor 74b is connected to power supply lines 93a to 93c, and the other of the source and the drain of the second thin film transistor 74b is electrically connected to a first electrode 79 of a display device. A gate electrode, a gate insulating film, and the power supply lines 93a to 93c of the second thin film transistor 74b constitute a capacitor element 96, and the other of the source and the drain of the first thin film transistor 74a is connected to the capacitor element 96.

The capacitor element 96 corresponds to a capacitor element for holding a gate-source voltage or a gate-drain voltage (hereinafter referred to as a gate voltage) of the second thin film transistor 74b when the first thin film transistor 74a is in an off state, and is not necessarily provided.

In this embodiment mode, the first thin film transistor 74a and the second thin film transistor 74b can each be formed using the thin film transistor described in any of Embodiment Modes 1 to 10. Although each of the first thin film transistor 74a and the second thin film transistor 74b is an n-channel thin film transistor in this example, the first thin film transistor 74a and the second thin film transistor 74b may also be formed using an n-channel thin film transistor and a p-channel thin film transistor, respectively. Furthermore, both the first thin film transistor 74a and the second thin film transistor 74b may be formed using p-channel thin film transistors.

A protective insulating film 76 is formed over the first thin film transistor 74a and the second thin film transistor 74b. A planarizing film 78 is formed over the protective insulating film 76. The first electrode 79 is formed to be connected to a wiring 93f in a contact hole formed in the planarizing film 78 and the protective insulating film 76. It is preferable to form the planarizing film 78 using an organic resin such as acrylic, polyimide, or polyamide, or a siloxane polymer. Since the first electrode 79 has a recessed portion in the contact hole, a partition wall 91 having an opening portion is provided to cover the recessed portion of the first electrode 79. In the opening portion of the partition wall 91, an EL layer 92 is formed so as to be in contact with the first electrode 79, and a second electrode 93 is formed so as to cover the EL layer 92. Further, a protective insulating film 95 is formed so as to cover the second electrode 93 and the partition wall 91.

In this example, a light-emitting element 94 having a top emission structure is presented as a light-emitting element. The light-emitting element 94 with a top emission structure can emit light even over the first thin film transistor 74a or the second thin film transistor 74b; thus, a light emission area can be increased. However, if a film under the EL layer 92 is uneven, the thickness is nonuniform due to unevenness, and the second electrode 93 and the first electrode 79 are short-circuited, so that a display defect is caused. Therefore, it is preferable to provide the planarizing film 78.

The light-emitting element 94 corresponds to a region where the first electrode 79 and the second electrode 93 sandwich the EL layer 92. In the case of the pixel illustrated in FIG. 26B, light from the light-emitting element 94 is emitted to the second electrode 93 side, as designated with an outline arrow.

As the first electrode 79 serving as a cathode, a known conductive film can be used as long as it has a low work function and reflects light. For example, Ca, Al, MgAg, AlLi, or the like is preferable. The EL layer 92 may be formed using a single layer or by stacking a plurality of layers. When the EL layer 92 is formed using a plurality of layers, an electron-injection layer, an electron-transporting layer, a light-emitting layer, a hole-transporting layer, and a hole-injecting layer are stacked in this order over the first electrode 79. It is not necessary to form all of these layers. The second electrode 93 is formed using a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

A light-emitting element having a top emission structure, in which light is emitted from a side opposite to a substrate, is described here; however, a light-emitting element having a bottom emission structure, in which light is emitted from the substrate side, or a light-emitting element having a dual emission structure, in which light is emitted from both the substrate side and the side opposite to the substrate, can also be employed as appropriate.

Although an organic EL element is described here as a light-emitting element, an inorganic EL element can also be provided as a light-emitting element.

This embodiment mode describes an example in which a thin film transistor for controlling driving of a light-emitting element (the driving thin film transistor) is electrically connected to the light-emitting element; however, a thin film transistor for controlling current may be connected between the driving thin film transistor and the light-emitting element.

Through the above process, a light-emitting display device can be manufactured. The light-emitting display device of this embodiment mode can have a high contrast and high visibility because an inverted-staggered thin film transistor with small off current and excellent electric characteristics is used.

Embodiment Mode 13

Hereinafter, this embodiment mode describes a structure of a display panel which is one mode of a display device of the present invention.

Figure 27A:
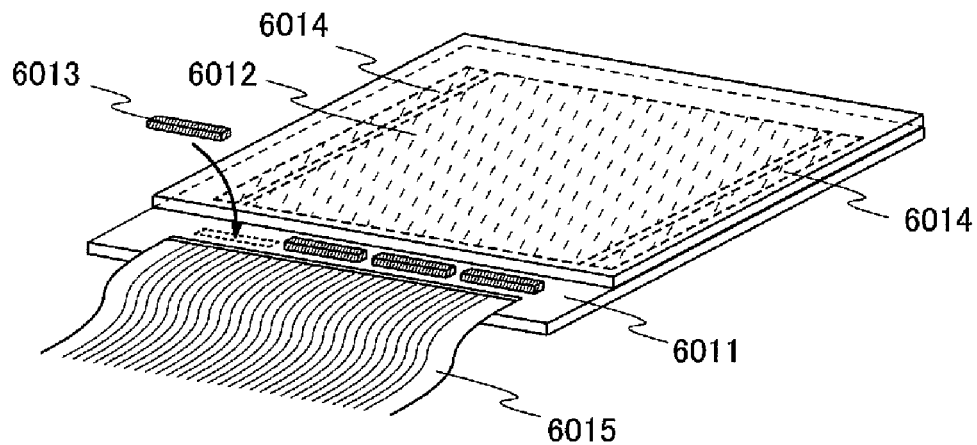
FIGS. 27A to 27C are perspective views illustrating display panels of some embodiments of the present invention.

FIG. 27A illustrates a mode of a display panel in which a pixel portion 6012 formed over a substrate 6011 is connected to a signal line driver circuit 6013 that is formed separately. The pixel portion 6012 and a scanning line driver circuit 6014 are formed using any of the thin film transistors described in Embodiment Modes 1 to 4. By forming the signal line driver circuit with a thin film transistor having high mobility, operation of the signal line driver circuit, which demands a higher driving frequency than the scanning line driver circuit, can be stabilized. The signal line driver circuit 6013 may be formed using a thin film transistor in which a single crystal semiconductor is used for a channel formation region, a thin film transistor in which a polycrystalline semiconductor is used for a channel formation region, or a thin film transistor in which an SOI is used for a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from the thin film transistor presented in any of Embodiment Modes 1 to 4, a diode, a resistor element, a capacitor element, and the like. For example, a diode obtained by connecting any of the thin film transistors described in Embodiment Modes 1 to 4 can also be used as a diode.

Both the signal driver circuit and the scanning line driver circuit may be formed over the same substrate as that of the pixel portion.

Figure 27B:
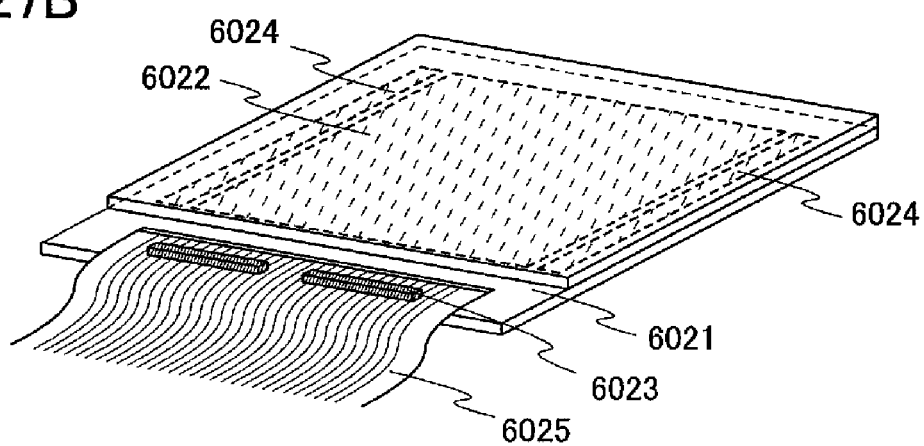

Further, if the driver circuit is formed separately, a substrate provided with the driver circuit is not always required to be attached to a substrate provided with the pixel portion, and may be attached to, for example, the FPC. FIG. 27B illustrates a mode of a display device panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are formed using any of the thin film transistors presented in the preceding embodiment modes. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Figure 27C:
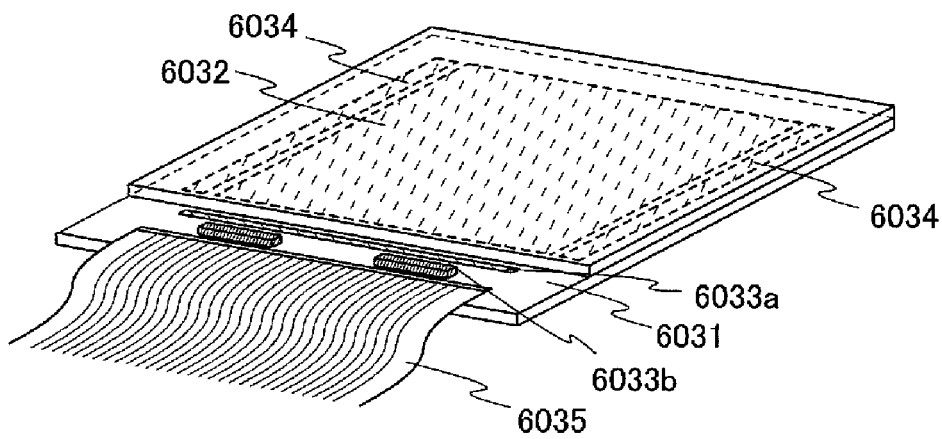

Furthermore, only a part of the signal line driver circuit or only a part of the scanning line driver circuit may be formed over the same substrate as that of the pixel portion, using any of the thin film transistors presented in the preceding embodiment modes, and the rest may be formed separately and electrically connected to the pixel portion. FIG. 27C illustrates a mode of a display device panel in which an analog switch 6033a included in a signal line driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are formed using any of the thin film transistors presented in the preceding embodiment modes. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035. Further, a protection circuit may be provided between the signal line driver circuit and the FPC 6035 or between the signal line driver circuit and the pixel portion 6032.

As illustrated in FIGS. 27A to 27C, in the display device of the present invention, an entire driver circuit or a part thereof can be formed over the same substrate as that of a pixel portion, using any of the thin film transistors presented in the preceding embodiment modes.

Note that there are no particular limitations on a connection method of a substrate formed separately, and a known method such as a COG method, a wire bonding method, or a TAB method can be used. Further, a connection position is not limited to the position illustrated in FIGS. 27A to 27C as long as electrical connection is possible. Further, a controller, a CPU, a memory, or the like may be formed separately and connected.

The signal line driver circuit used in this embodiment mode has the shift register and the analog switch. Further, the signal line driver circuit may have another circuit such as a buffer, a level shifter, or a source follower in addition to the shift register and the analog switch. Furthermore, the shift register and the analog switch are not always required to be provided, and for example, a different circuit such as a decoder circuit by which selection of signal lines is possible may be used instead of the shift register, or a latch or the like may be used instead of the analog switch.

Embodiment Mode 14

Display devices or the like that are obtained according to the present invention can be used for active matrix display device panels. That is to say, the present invention can be carried out in all electronic appliances in which these modules are incorporated in display portions.

As such electronic appliances, cameras such as video cameras and digital cameras, displays that can be mounted on a person's head (goggle-type displays), car navigation systems, projectors, car stereos, personal computers, portable information terminals (e.g., mobile computers, mobile phones, and electronic books), and the like can be given. Examples of these appliances are illustrated in FIGS. 28A to 28C.

Figure 28A:
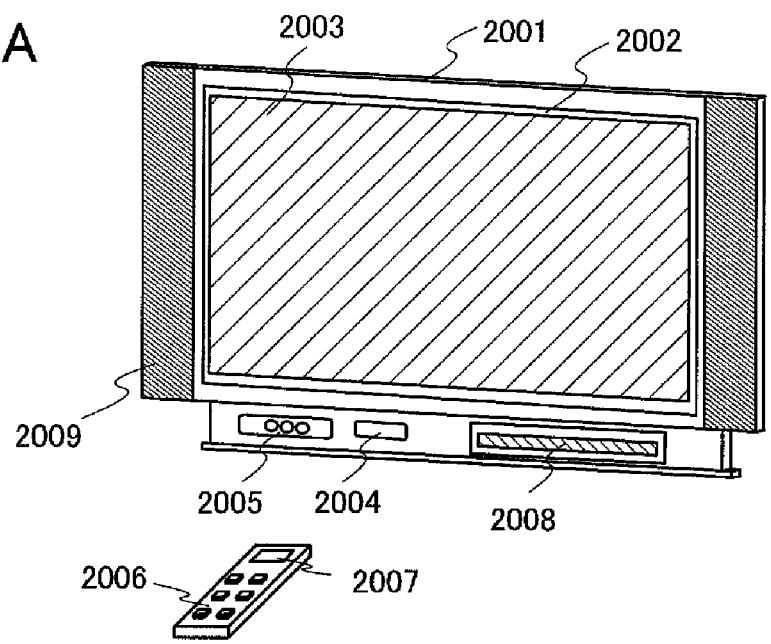
FIGS. 28A to 28C are perspective views illustrating electronic appliances having display devices of some embodiment modes of the present invention.
Figure 28B:
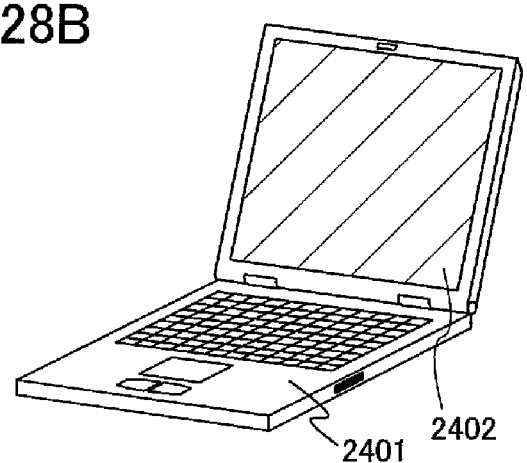
Figure 28C:
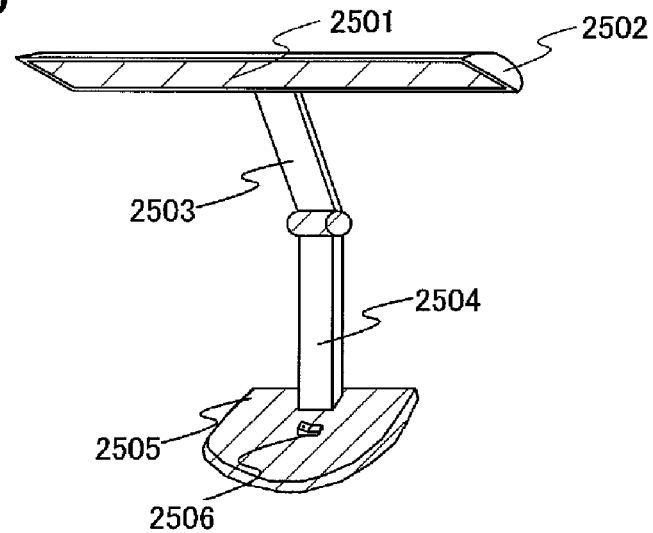

FIG. 28A illustrates a television device. The television device can be completed by incorporating a display panel in a chassis, as illustrated in FIG. 28A. A main screen 2003 is formed with a display panel. In addition, a speaker unit 2009, operation switches, and the like are provided as accessory equipment. In this manner, the television device can be completed.

As illustrated in FIG. 28A, a display panel 2002 including display elements is incorporated in a chassis 2001. In addition to reception of general television broadcast by a receiver 2005, simplex (from a transmitter to a receiver) or duplex (between a transmitter and a receiver or between receivers) communication of information can be performed by connection to a wired or wireless communication network through a modem 2004. The television device can be operated using switches that are incorporated in the chassis or with a remote control device 2006 that is provided separately, and a display portion 2007 that displays output information may be provided for the remote control device 2006.

Further, in the television device, in addition to the main screen 2003, a subscreen 2008 may be formed using a second display panel and may be used to display channel number, volume, and the like. In this structure, the main screen 2003 may be formed with a liquid crystal display panel, and the subscreen 2008 may be formed with a light-emitting display panel. Furthermore, the main screen 2003 may be formed with a light-emitting display panel, and the subscreen 2008 may be formed with a light-emitting display panel, and the subscreen 2008 may be configured to be capable of flashing on and off.

Figure 29:
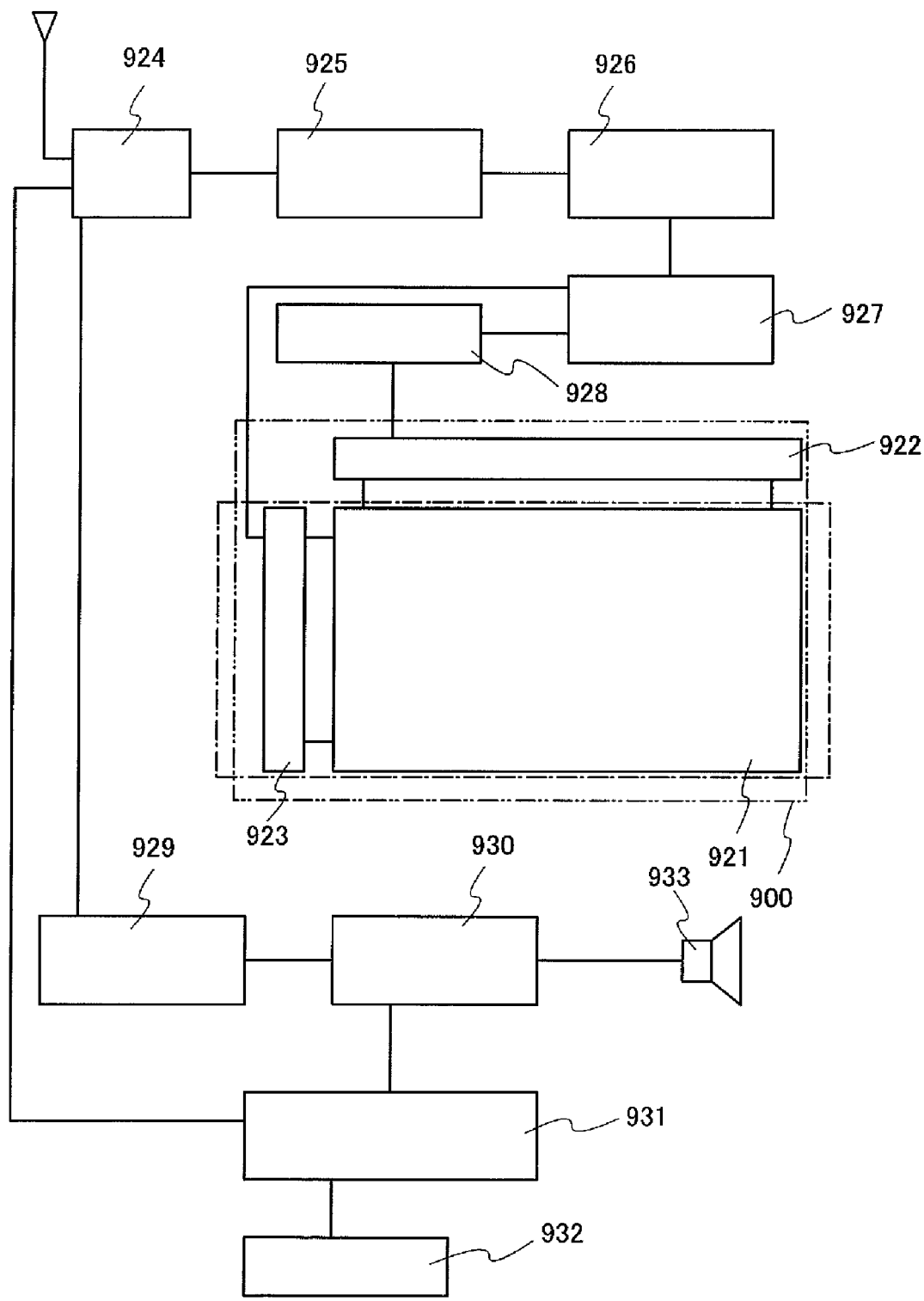
FIG. 29 is a drawing illustrating an electronic appliance having a display device of an embodiment mode of the present invention.

FIG. 29 is a block diagram illustrating a main structure of the television device. A pixel portion 921 is formed in a display panel 900. A signal line driver circuit 922 and a scanning line driver circuit 923 may be mounted on the display panel 900 by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can match input specification of the driver IC, and the like are provided on an input side of the video signal. The control circuit 927 outputs signals to both a scanning line side and a signal line side. In a case of digital driving, a signal divide circuit 928 may be provided on the signal line side and an input digital signal may be divided into m pieces and supplied.

An audio signal among signals received by the tuner 924 is sent to an audio signal amplifier circuit 929 and is supplied to a speaker 933 through an audio signal process circuit 930. A controlling circuit 931 receives control information of a receiving station (reception frequency) or sound volume from an input portion 932, and transmits signals to the tuner 924 and the audio signal process circuit 930.

Needless to say, the present invention is not limited to a use for television devices, and can be applied to a variety of applications such as monitors of personal computers, or display media having a large area, such as information display boards in railway stations, airports, and the like, and streetside advertisement display boards.

The display device described in any of the preceding embodiment modes is applied to the main screen 2003 or the subscreen 2008, so that mass productivity of the television device can be enhanced.

A portable computer illustrated in FIG. 28B includes a main body 2401, a display portion 2402, and the like. The display device presented in any of the preceding embodiment modes is applied to the display portion 2402, so that mass productivity of the computer can be enhanced.

FIG. 28C illustrates a desk lamp including a lighting portion 2501, a lampshade 2502, an adjustable arm 2503, a support 2504, a base 2505, and a power supply 2506. The desk lamp is manufactured using the light-emitting device described in any of the preceding embodiment modes for the lighting portion 2501. The lighting equipment includes a ceiling light, a wall light, and the like in its category. The display device presented in any of the preceding embodiment modes can increase mass productivity and provide inexpensive desk lamps.

Figure 30A:
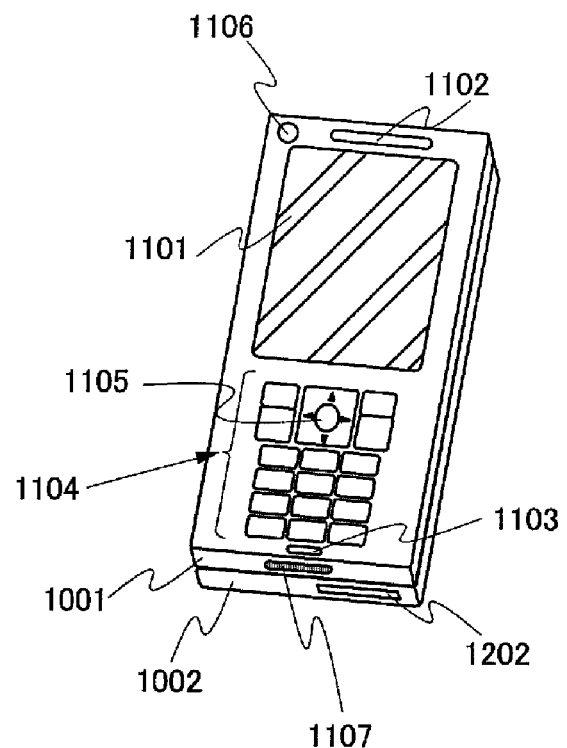
FIGS. 30A to 30C are drawings illustrating an electronic appliance having a display device of an embodiment mode of the present invention.
Figure 30B:
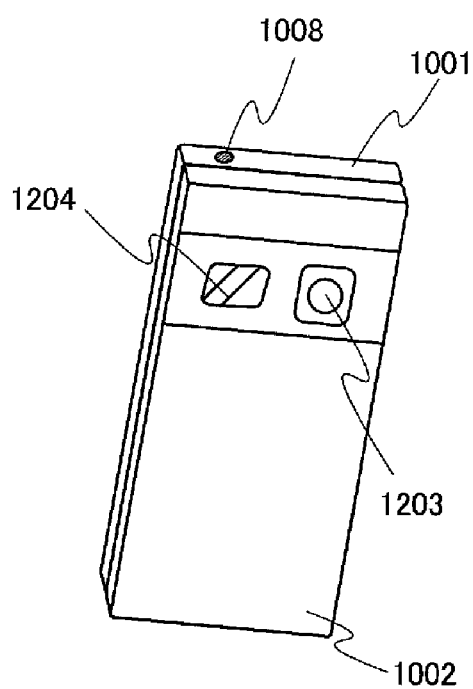
Figure 30C:
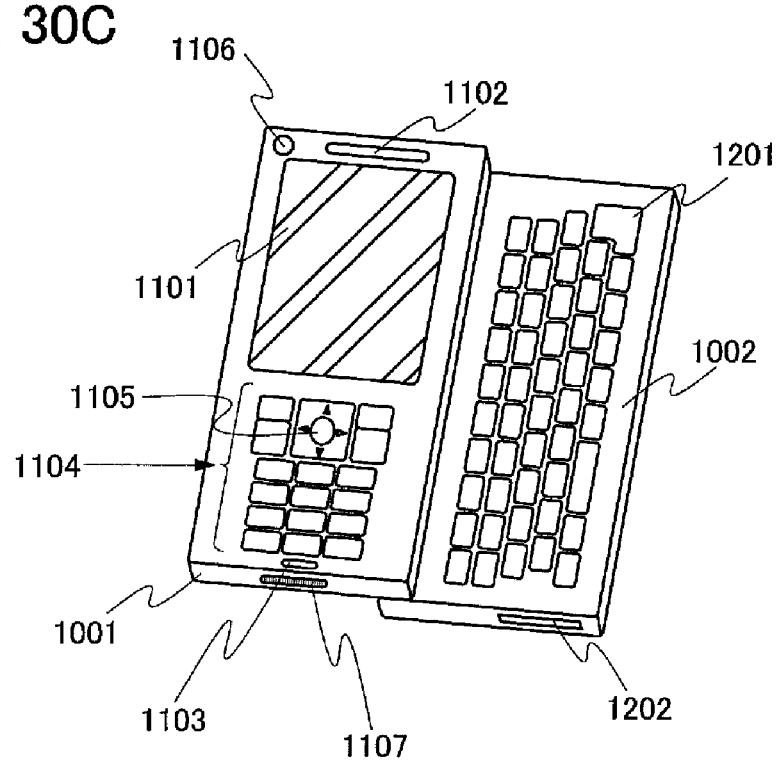

FIGS. 30A to 30C illustrate an example of a smartphone to which the present invention is applied. FIG. 30A is a front view, and FIG. 30B is a rear view, and FIG. 30C is a front view in which two chassis are slid out. The smartphone has two chassis 1001 and 1002. The smartphone has both functions of a mobile phone and of a portable information terminal, incorporates a computer, and enables various kinds of data processing in addition to telephone conversation.

The chassis 1001 includes a display portion 1101, a speaker 1102, a microphone 1103, operation keys 1104, a pointing device 1105, a front camera lens 1106, a jack 1107 for an external connection terminal, an earphone terminal 1108, and the like. The chassis 1002 includes a keyboard 1201, an external memory slot 1202, a rear camera 1203, a light 1204, and the like. In addition, an antenna is incorporated in the chassis 1001.

In addition to the above structure, the smartphone may incorporate a non-contact IC chip, a small memory device, and the like.

The chassis 1001 and 1002 which overlap with each other (see FIG. 30A) are slid out as illustrated in FIG. 30C. The display device described in any of the preceding embodiment modes can be incorporated in the display portion 1101, and a display direction changes depending on a use mode. Since the display portion 1101 and the front camera lens 1106 are provided on the same face, the smartphone can be used as a videophone. Further, a still image and a moving image can be taken with the rear camera 1203 and the light 1204, with the display portion 1101 used as a viewfinder.

The speaker 1102 and the microphone 1103 can be used not only for telephone conversation, but also for videophone, recording, playback, and the like. With the use of the operation keys 1104, operation of incoming and outgoing of calls, simple information input such as electronic mail, scrolling of a screen, cursor movement, and the like are possible.

If much information needs to be treated in documentation, a use as a portable information terminal, and the like, it is convenient to use the keyboard 1201. When the chassis 1001 and 1002 which overlap with each other (see FIG. 30A) are slid out as illustrated in FIG. 30C and the smartphone is used as a portable information terminal, smooth operation is possible with the use of the keyboard 1201 and the pointing device 1105. The jack 1107 for an external connection terminal can be connected to an AC adapter or a variety of cables such as a USB cable, and charging and data communication with a personal computer or the like are possible. Further, by inserting a recording medium in the external memory slot 1202, a larger amount of data can be stored and moved.

The rear face of the chassis 1002 (see FIG. 30B) is provided with the rear camera 1203 and the light 1204, and a still image and a moving image can be taken with the display portion 1101 used as a viewfinder.

Further, the smartphone may have an infrared communication function, a USB port, a function of receiving one segment television broadcast, a non-contact IC chip, an earphone jack, or the like, in addition to the above functions and structures.

By employing the display device described in any of the preceding embodiment modes, mass productivity of the smartphone can be enhanced.

This application is based on Japanese Patent Application serial No. 2007-312879 filed with Japan Patent Office on Dec. 3, 2007, the entire contents of which are hereby incorporated by reference.

What is claimed is:

1. A thin film transistor comprising:
   a microcrystalline germanium film provided over a substrate;
   a gate electrode adjacent to the microcrystalline germanium film with a gate insulating film therebetween;
   grains that mainly contain silicon and are formed on a surface of the gate insulating film; and
   a buffer layer in contact with the microcrystalline germanium film,
   wherein the microcrystalline germanium film covers the grains and the gate insulating film.

2. The thin film transistor according to claim 1, wherein the buffer layer is formed using an amorphous silicon film.

3. A thin film transistor comprising:
   a gate electrode;
   a gate insulating film formed over the gate electrode;
   crystal grains that mainly contain silicon and are formed on a surface of the gate insulating film;
   a semiconductor film that mainly contains germanium and covers the crystal grains and the gate insulating film; and
   a buffer layer in contact with the semiconductor film that mainly contains germanium.

4. The thin film transistor according to claim 3, wherein the buffer layer is formed using an amorphous silicon film.

5. A thin film transistor comprising:
   a gate electrode;
   a gate insulating film formed over the gate electrode;
   crystal grains that mainly contain silicon and are formed on a surface of the gate insulating film;
   a semiconductor film that mainly contains germanium and covers the crystal grains and the gate insulating film;
   a buffer layer formed over the semiconductor film that mainly contains germanium; and a pair of semiconductor films to which an impurity element imparting one conductivity type is added and which are formed over the buffer layer.

6. The thin film transistor according to claim 5, wherein the buffer layer is formed using an amorphous silicon film.

7. The thin film transistor according to claim 5, further comprising:
a pair of wirings in contact with the pair of semiconductor films to which the impurity element imparting one conductivity type is added; and
a pixel electrode in contact with one of the pair of wirings.

8. A thin film transistor comprising:
a gate electrode;
a gate insulating film formed over the gate electrode;
crystal grains that mainly contain silicon, include a donor impurity element, and are formed on a surface of the gate insulating film;
a semiconductor film that mainly contains germanium and covers the gate insulating film and the crystal grains that mainly contain silicon and include the donor impurity element;
a buffer layer formed over the semiconductor film that mainly contains germanium; and
a pair of semiconductor films to which an impurity element imparting one conductivity type is added and which are formed over the buffer layer.

9. The thin film transistor according to claim 8, wherein the buffer layer is formed using an amorphous silicon film.

10. The thin film transistor according to claim 8, further comprising:
a pair of wirings in contact with the pair of semiconductor films to which the impurity element imparting one conductivity type is added; and
a pixel electrode in contact with one of the pair of wirings.

11. The thin film transistor according to claim 8, wherein the donor impurity element is phosphorus, arsenic, or antimony.

12. A thin film transistor comprising:
a gate electrode;
a gate insulating film that has an uneven surface and is formed over the gate electrode;
crystal grains that mainly contain silicon and are formed on a surface of the gate insulating film;
a semiconductor film that mainly contains germanium and covers the gate insulating film and the crystal grains;
a buffer layer formed over the semiconductor film that mainly contains germanium; and
a pair of semiconductor films to which an impurity element imparting one conductivity type is added and which are formed over the buffer layer.

13. The thin film transistor according to claim 12, wherein the buffer layer is formed using an amorphous silicon film.

14. The thin film transistor according to claim 12, further comprising:
a pair of wirings in contact with the pair of semiconductor films to which the impurity element imparting one conductivity type is added; and
a pixel electrode in contact with one of the pair of wirings.

* * * * *